(12) United States Patent
Goto et al.

(10) Patent No.: US 9,791,777 B2
(45) Date of Patent: Oct. 17, 2017

(54) ACTIVE LIGHT SENSITIVE OR RADIATION SENSITIVE RESIN COMPOSITION, PATTERN FORMING METHOD, METHOD FOR MANUFACTURING ELECTRONIC DEVICE, AND ELECTRONIC DEVICE

(71) Applicant: FUJIFILM Corporation, Tokyo (JP)

(72) Inventors: Akiyoshi Goto, Haibara-gun (JP); Masafumi Kojima, Haibara-gun (JP); Michihiro Shirakawa, Haibara-gun (JP); Keita Kato, Haibara-gun (JP); Keiyu Ou, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/234,489

(22) Filed: Aug. 11, 2016

(65) Prior Publication Data

US 2016/0347897 A1 Dec. 1, 2016

Related U.S. Application Data

(63) Continuation of application No. PCT/JP2015/053320, filed on Feb. 6, 2015.

(30) Foreign Application Priority Data

Mar. 7, 2014 (JP) .................................. 2014-045583

(51) Int. Cl.
G03F 7/004 (2006.01)
C08F 220/28 (2006.01)
G03F 7/039 (2006.01)
G03F 7/30 (2006.01)
G03F 7/26 (2006.01)
C08F 22/10 (2006.01)
G03F 7/11 (2006.01)
G03F 7/20 (2006.01)
G03F 7/32 (2006.01)
C08F 220/68 (2006.01)
C08F 224/00 (2006.01)
G03F 7/038 (2006.01)

(52) U.S. Cl.
CPC ............ *G03F 7/0397* (2013.01); *C08F 22/10* (2013.01); *C08F 220/68* (2013.01); *C08F 224/00* (2013.01); *G03F 7/038* (2013.01); *G03F 7/0392* (2013.01); *G03F 7/0395* (2013.01); *G03F 7/11* (2013.01); *G03F 7/2041* (2013.01); *G03F 7/2053* (2013.01); *G03F 7/26* (2013.01); *G03F 7/30* (2013.01); *G03F 7/325* (2013.01)

(58) Field of Classification Search
CPC .......... G03F 7/004; G03F 7/26; G03F 7/0392; G03F 7/0395; G03F 7/0397; G03F 7/30; G03F 7/32; G03F 7/325; H01L 21/0274; C08F 220/28; C08F 220/281

USPC ..... 526/280, 281; 430/270.1, 322, 325, 329, 430/330, 331, 434, 435
See application file for complete search history.

(56) References Cited

U.S. PATENT DOCUMENTS

| | | | |
|---|---|---|---|
| 2011/0311914 A1 | 12/2011 | Kamimura et al. | |
| 2012/0214101 A1* | 8/2012 | Shimizu | G03F 7/0045 430/285.1 |
| 2012/0219913 A1* | 8/2012 | Kataoka | G03F 7/0397 430/285.1 |
| 2012/0264054 A1* | 10/2012 | Yamaguchi | G03F 7/038 430/280.1 |
| 2012/0264058 A1* | 10/2012 | Utsumi | G03F 7/0045 430/285.1 |
| 2013/0344442 A1 | 12/2013 | Sagehashi et al. | |
| 2014/0234785 A1* | 8/2014 | Hatakeyama | G03F 7/40 430/326 |
| 2014/0242519 A1* | 8/2014 | Sagehashi | G03F 7/038 430/285.1 |
| 2014/0255843 A1 | 9/2014 | Kobayashi et al. | |
| 2014/0363770 A1* | 12/2014 | Oikawa | G03F 7/038 430/285.1 |

FOREIGN PATENT DOCUMENTS

| | | |
|---|---|---|
| JP | 2010-197619 A | 9/2010 |
| JP | 2013-068779 A | 4/2013 |
| JP | 2014-28926 A | 2/2014 |
| JP | 2014-170167 A | 9/2014 |
| JP | 2014-198698 A | 10/2014 |
| KR | 10-2014-0001127 A | 1/2014 |

OTHER PUBLICATIONS

International Search Report of PCT/JP2015/053320, dated Mar. 3, 2015. [PCT/ISA/210].

(Continued)

*Primary Examiner* — Amanda C Walke
(74) *Attorney, Agent, or Firm* — Sughrue Mion, PLLC

(57) ABSTRACT

The actinic ray-sensitive or radiation-sensitive resin composition of the present invention contains a resin (P) including a repeating unit (i) having a group which decomposes by the action of an acid represented by the following General Formula (1), a pattern forming method using the composition, a method for manufacturing an electronic device, and an electronic device.

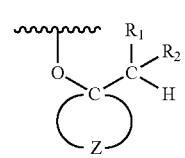

(1)

12 Claims, No Drawings

(56) References Cited

OTHER PUBLICATIONS

Written Opinion of PCT/JP2015/053320, dated Mar. 3, 2015. [PCT/ISA/237].
International Preliminary Report on Patentability dated Sep. 13, 2016, in International Application No. PCT/JP2015/053320 with English translation of Written Opinion, 10 pages in English and Japanese.
Communication dated Feb. 21, 2017 from the Japanese Patent Office in counterpart Application No. 2014-045583.
Office Action dated Jun. 15, 2017 issued by the Korean Intellectual Property Office in counterpart Korean Application No. 10-2016-7021501.

* cited by examiner

ACTIVE LIGHT SENSITIVE OR RADIATION SENSITIVE RESIN COMPOSITION, PATTERN FORMING METHOD, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2015/53320, filed on Feb. 6, 2015, which claims priority under 35 U.S.C. §119(a) to Japanese Patent Application No. 2014-45583, filed on Mar. 7, 2014. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, a pattern forming method, a method for manufacturing an electronic device, and an electronic device. More specifically, the present invention relates to a pattern forming method which is suitable for a process for manufacturing a semiconductor such as an IC, for the manufacture of a circuit board for a liquid crystal, a thermal head, or the like, and for other lithographic processes of photofabrication; and an actinic ray-sensitive or radiation-sensitive resin composition (resist composition) used in the pattern forming method. The present invention further relates to a method for manufacturing an electronic device, including the pattern forming method, and an electronic device manufactured by the method.

2. Description of the Related Art

Microfabrication by lithography using a resist composition has been hitherto carried out in a process for manufacturing semiconductor devices such as an IC and an LSI.

As such a resist composition, for example, "a negative type developing resist composition which has an acid-decomposable repeating unit represented by a specific formula and contains a resin whose solubility in a negative developer decreases by the action of an acid" is disclosed in JP2010-197619A (claim 1).

SUMMARY OF THE INVENTION

On the other hand, there has recently been a demand for high functionality in various electronic devices, and thus, further improvement in characteristics of a resist composition used for microfabrication has correspondingly been required. In particular, there has been a demand for further improvement in a depth of focus (DOF). In addition, there is a demand for pattern collapse resistance in the case where fine patterns are formed.

Under these circumstances, the present inventors have investigated the resist composition described in JP2010-197619A, and as a result, it became apparent that the resist composition does not necessarily satisfy the levels that have recently been demanded in terms of DOF or pattern collapse resistance.

Therefore, the present invention has been made in consideration of the above problems, and has an object to provide an actinic ray-sensitive or radiation-sensitive resin composition which has a high depth of focus and with which the collapse of the pattern is suppressed in the case where a fine pattern is formed; and a pattern forming method using the composition, a method for manufacturing an electronic device, and an electronic device.

The present inventors have conducted extensive studies on the problems, and as a result, they have found that the problems can be solved by using a resin including a repeating unit having a specific group.

That is, the present inventors have found that the problems can be solved by the following configurations.

(1) An actinic ray-sensitive or radiation-sensitive resin composition comprising a resin (P) including a repeating unit (i) having a group which decomposes by the action of an acid, represented by General Formula (1), which will be described later.

(2) The actinic ray-sensitive or radiation-sensitive resin composition as described in (1), in which the repeating unit (i) is a repeating unit represented by General Formula (2) which will be described later.

(3) The actinic ray-sensitive or radiation-sensitive resin composition as described in (1) or (2), in which the cyclic structure is a monocyclic alicyclic structure having 5 or 6 carbon atoms in General Formulae (1) and (2).

(4) The actinic ray-sensitive or radiation-sensitive resin composition as described in any one of (1) to (3), in which $R_2$ is an alkyl group having 2 to 5 carbon atoms in General Formulae (1) and (2).

(5) The actinic ray-sensitive or radiation-sensitive resin composition as described in (4), in which $R_2$ is an alkyl group having 2 or 3 carbon atoms in General Formulae (1) and (2).

(6) The actinic ray-sensitive or radiation-sensitive resin composition as described in any one of (1) to (5), in which $R_1$ is an alkyl group having 2 to 5 carbon atoms in General Formulae (1) and (2).

(7) A pattern forming method comprising at least:
(a) forming an actinic ray-sensitive or radiation-sensitive resin composition film on a substrate, using the actinic ray-sensitive or radiation-sensitive resin composition as described in any one of (1) to (6);
(b) irradiating the film with actinic ray or radiation; and
(c) developing the film irradiated with actinic ray or radiation using a developer.

(8) The pattern forming method as described in (7), in which the developer is a developer including an organic solvent.

(9) A method for manufacturing an electronic device, comprising the pattern forming method as described in (7) or (8).

(10) An electronic device manufactured by the method for manufacturing an electronic device as described in (9).

As shown below, according to the present invention, it is possible to provide an actinic ray-sensitive or radiation-sensitive resin composition which has a high depth of focus and with which the collapse of the pattern is suppressed in the case where a fine pattern is formed; and a pattern forming method using the composition, a method for manufacturing an electronic device, and an electronic device.

DESCRIPTION OF THE PREFERRED EMBODIMENTS

Hereinafter, suitable aspects of the present invention will be described in detail.

In citations for a group and an atomic group in the present specification, in the case where the group is denoted without specifying whether it is substituted or unsubstituted, the group includes both a group and an atomic group, each not having a substituent, and a group and an atomic group, each having a substituent. For example, an "alkyl group" which is not denoted about whether it is substituted or unsubstituted includes not only an alkyl group not having a substituent (unsubstituted alkyl group), but also an alkyl group having a substituent (substituted alkyl group).

In the present invention, "actinic ray" or "radiation" means, for example, a bright line spectrum of a mercury lamp, far ultraviolet rays represented by an excimer laser, extreme ultraviolet rays (EUV light), X-rays, particle rays such as electron beams and ion beams, or the like. In addition, in the present invention, "light" means actinic ray or radiation.

Furthermore, "exposure" in the present specification includes, unless otherwise specified, not only exposure by a mercury lamp, far ultraviolet rays represented by an excimer laser, X-rays, extreme ultraviolet rays (EUV light), or the like, but also writing by particle rays such as electron beams and ion beams.

In the present specification, "(meth)acrylate" means "at least one of acrylate or methacrylate".

In the present specification, "(a value) to (a value)" means a range including the numeral values represented before and after "to" as the lower limit value and the upper limit value, respectively.

The actinic ray-sensitive or radiation-sensitive resin composition of the present invention (hereinafter also referred to as "the composition of the present invention" or "the resist composition of the present invention") contains a resin (P) including a repeating unit (i) having a group which decomposes by the action of an acid, represented by General Formula (1), which will be described later.

Hereinafter, the composition of the present invention will be described.

The composition of the present invention may be used in negative type development (development in which an exposed area remains as a pattern and an unexposed area is removed), or in positive type development (an exposed area is removed and an unexposed area remains as a pattern). That is, any one of a developer including an organic solvent and an alkali developer may be used to carry out the development.

Moreover, the composition of the present invention is typically a chemical amplification type resist composition. First, the respective components contained in the composition of the present invention will be described, and then a pattern forming method using the composition of the present invention will be described.

[1] Resin (P)

The resin (P) includes a repeating unit (i) having a group (specific group) which decomposes by the action of an acid represented by the following General Formula (1). Further, typically, the resin (P) is preferably a resin whose polarity varies by the action of an acid and thus, the solubility in a developer varies.

The specific group is a group represented by General Formula (1), and usually decomposes by the action of an acid, thereby cleaving a covalent bond between an oxygen atom and a quaternary carbon to generate, for example, an alkali-soluble group.

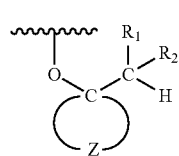

(1)

In General Formula (1), $R_1$ represents an alkyl group. $R_2$ represents an alkyl group having 2 or more carbon atoms. Z represents a group that forms a monocyclic or polycyclic structure together with a carbon atom. Further, the wavy line represents the bonding position.

The alkyl group represented by $R_1$ is not particularly limited, and may be either linear or branched. The number of carbon atoms of the alkyl group is not particularly limited, and is preferably 1 to 10, and more preferably 2 to 5.

Specific examples of the alkyl group include a methyl group, an ethyl group, a n-propyl group, an isopropyl group, a n-butyl group, an isobutyl group, a s-butyl group, and a t-butyl group.

The alkyl group having 2 or more carbon atoms, represented by $R_2$, is not particularly limited, and may be linear or branched. Among these, an alkyl group having 2 to 10 carbon atoms is preferable, an alkyl group having 2 to 5 carbon atoms is more preferable, and an alkyl group having 2 or 3 carbon atoms is still more preferable.

Specific examples of the alkyl group having 2 or more carbon atoms include an ethyl group, a n-propyl group, an isopropyl group, a n-butyl group, an isobutyl group, a s-butyl group, a t-butyl group, and a 1-ethylpropyl group.

As described above, Z represents a group that forms a monocyclic or polycyclic structure together with a carbon atom.

The number of carbon atoms of the monocyclic or polycyclic structure is not particularly limited, and is preferably 3 to 20, and more preferably 5 or 6.

Specific examples of the monocyclic or polycyclic structure are shown below.

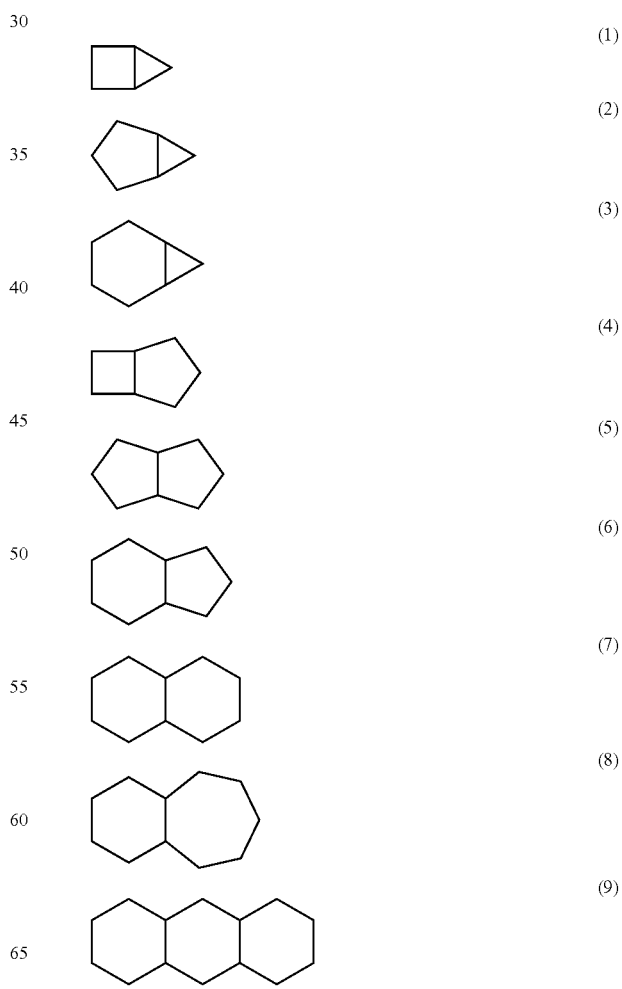

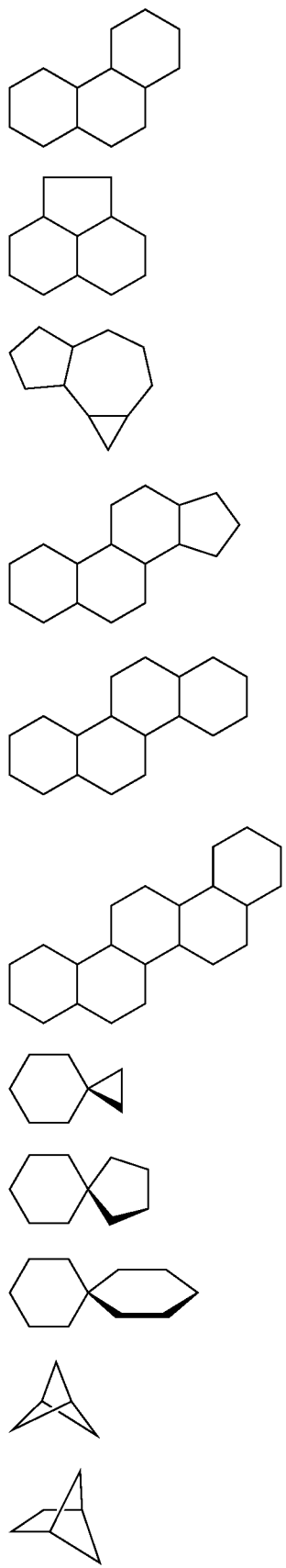
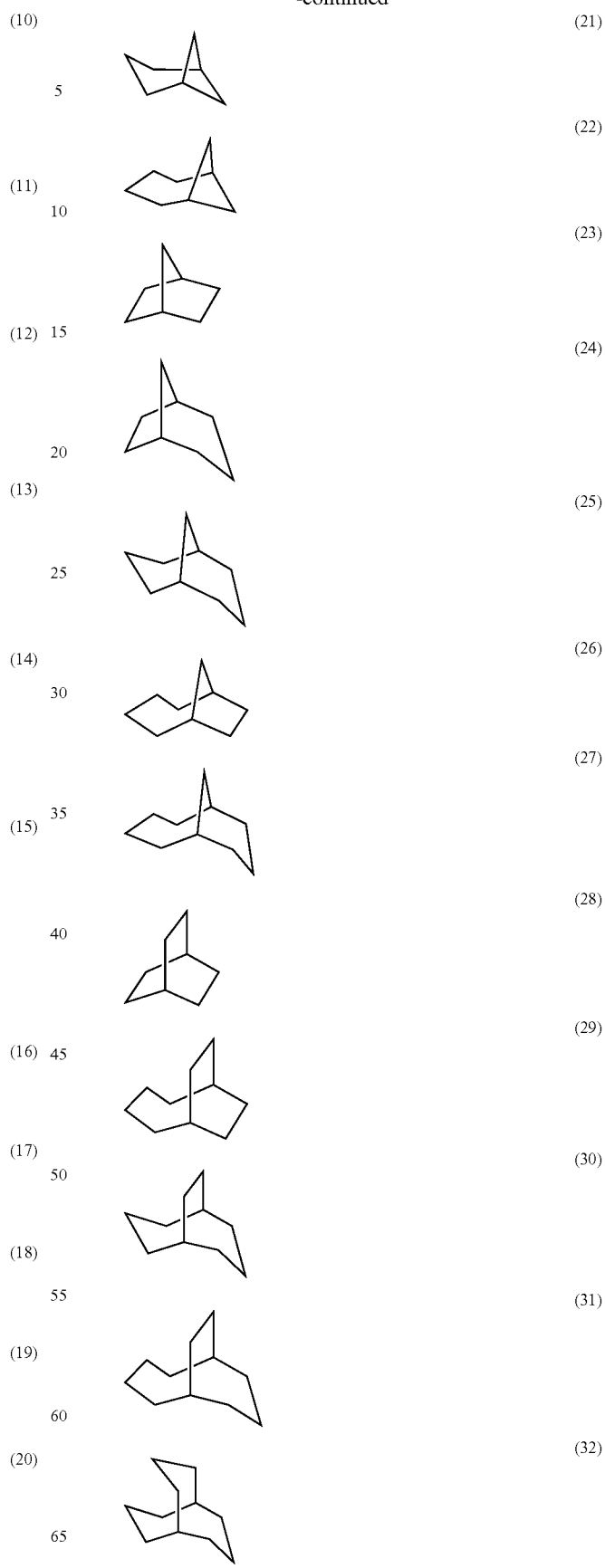

-continued

(33) 

(34) 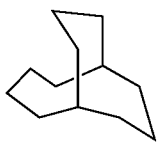

(35) 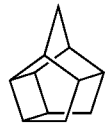

(36) 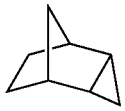

(37) 

(38) 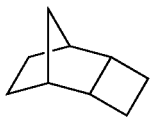

(39) 

(40) 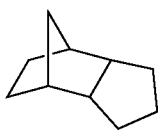

(41) 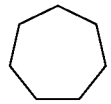

(42) 

(43) 

(44) 

-continued

(45) 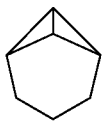

(46) 

(47) 

(48) 

(49) 

(50) 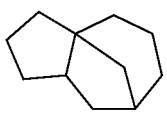

Specific examples of the monocyclic structure include a cyclopentyl group, a cyclohexyl group, and a cyclooctyl group.

Specific examples of the polycyclic structure include a norbornyl group, a tricyclodecanyl group, a tetracyclodecanyl group, a tetracyclododecanyl group, and an adamantyl group.

The monocyclic or polycyclic structure may have a substituent. Examples of the substituent include an alkyl group (having 1 to 4 carbon atoms), a halogen atom, a hydroxyl group, an alkoxy group (having 1 to 4 carbon atoms), a carboxy group, and an alkoxycarbonyl group (having 2 to 6 carbon atoms).

In the monocyclic or polycyclic structure, a part of the carbon atoms constituting the cyclic structures may be substituted with a hetero atom, or a group having a hetero atom. The monocyclic or polycyclic structure is preferably monocyclic alicyclic structure (particularly one having 5 or 6 carbon atoms).

Z is not particularly limited as long as it forms a monocyclic or polycyclic structure together with a carbon atom, and it is preferably an alkylene group, more preferably an alkylene group having 2 or more carbon atoms, and still more preferably an alkylene group having 4 or 5 carbon atoms. Z may have a substituent. Specific examples of the substituent are the same as described above.

The repeating unit (i) included in the resin (P) is not particularly limited as long as it has the specific group, and suitable aspects thereof include, for example, repeating units represented by the following General Formula (2).

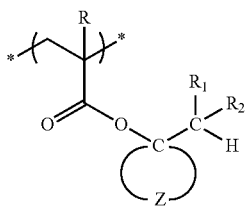

(2)

In General Formula (2), R represents a hydrogen atom, a halogen atom, or an organic group.

Here, the "organic group" means a functional group (for example, an alkyl group, a cycloalkyl group, an aryl group, and a group formed by a combination of these) including at least one carbon atom, and may contain a hetero atom (for example, an oxygen atom).

Furthermore, a suitable aspect of the organic group is preferably an aliphatic hydrocarbon group, and more preferably an alkyl group (preferably an alkyl group having 1 to 3 carbon atoms).

In General Formula (2), $R_1$ represents an alkyl group. Specific examples and suitable aspects of $R_1$ are the same as those of $R_1$ in General Formula (1).

In General Formula (2), $R_2$ represents an alkyl group having 2 or more carbon atoms. Specific examples and suitable aspects of $R_2$ are the same as those of $R_2$ in General Formula (1).

In General Formula (2), Z represents a group that forms a monocyclic or polycyclic structure together with a carbon atom. Specific examples and suitable aspects of Z are the same as those of Z in General Formula (1). Further, specific examples and suitable aspects of the monocyclic or polycyclic structure are the same as those of the monocyclic or polycyclic structures formed by Z in General Formula (1).

In General Formula (2), * represents the bonding position.

Specific examples of the repeating unit represented by General Formula (2) are shown below. However, the present invention is not limited thereto. In the specific examples, the definitions, specific examples, and suitable aspects of R are the same as those of R in General Formula (2).

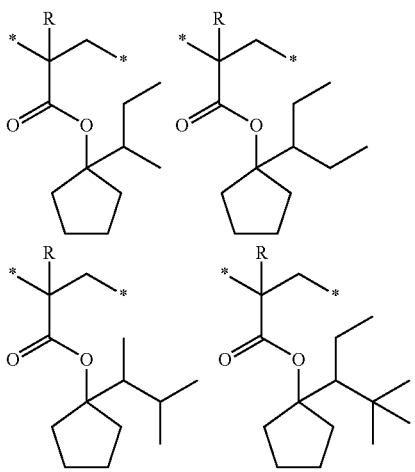

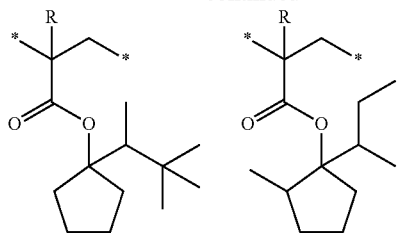

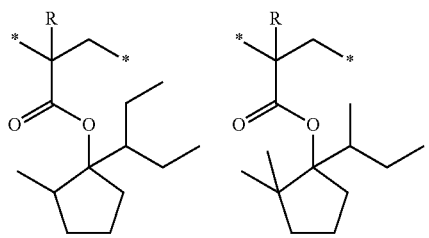

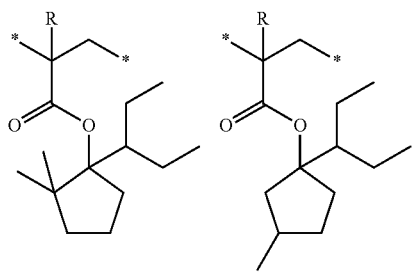

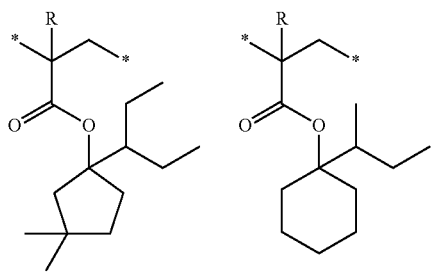

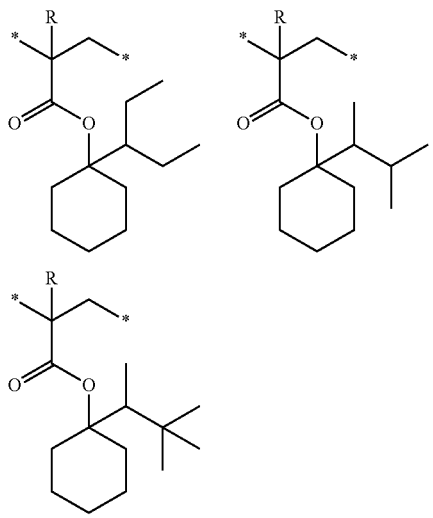

-continued

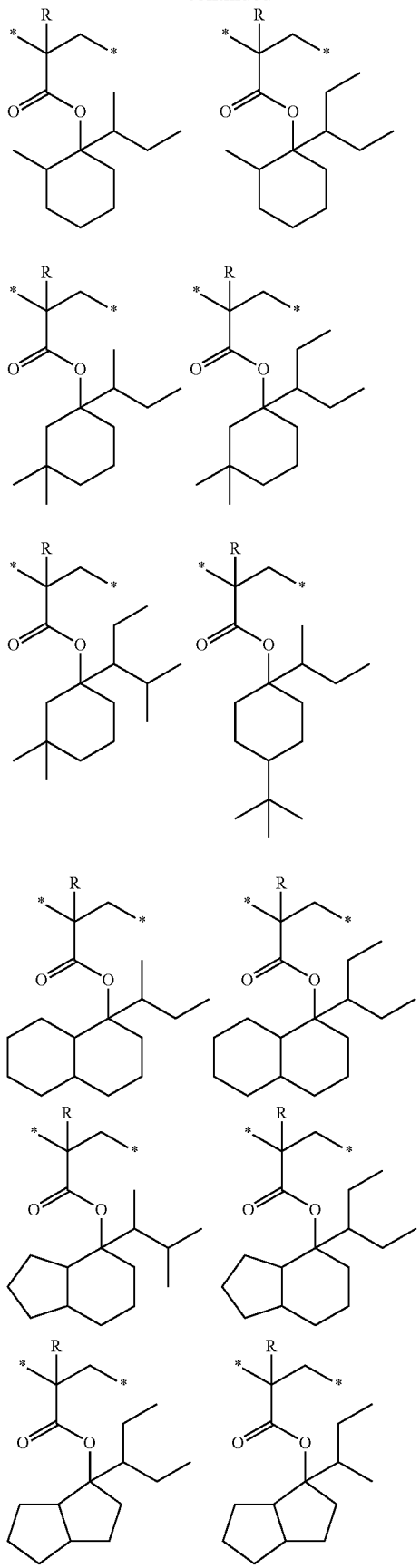

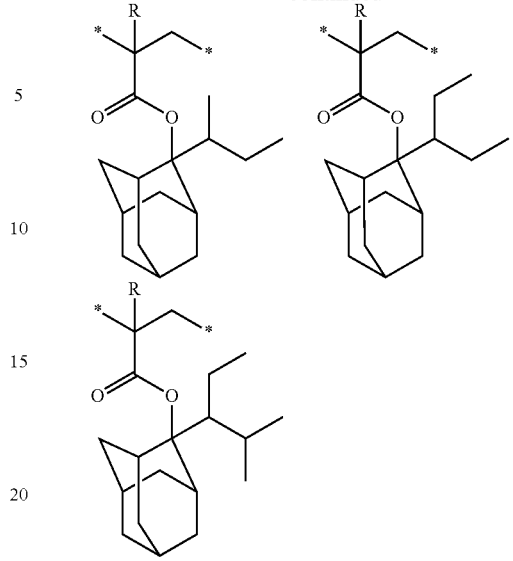

The proportion of the repeating units (i) with respect to all the repeating units of the resin (P) is not particularly limited, and is preferably 5% by mole to 70% by mole, and more preferably 10% by mole to 60% by mole.

The resin (P) may have a repeating unit having an acid-decomposable group different from the repeating unit (i), in addition to the repeating unit (i) as described above.

The acid-decomposable group preferably has a structure in which an alkali-soluble group is protected with a group capable of leaving by the decomposition by the action of an acid.

Examples of the alkali-soluble group include a phenolic hydroxyl group, a carboxyl group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the alkali-soluble group include a carboxyl group, a fluorinated alcohol group (preferably a hexafluoroisopropanol group), and a sulfonic acid group.

The groups which are preferable as the acid-decomposable group are groups in which hydrogen atoms of these alkali-soluble groups are substituted with a group capable of leaving by an acid.

Examples of the group capable of leaving by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

The acid-decomposable group is preferably a cumyl ester group, an enol ester group, an acetal ester group, a tertiary alkyl ester group, or the like, and more preferably a tertiary alkyl ester group.

As the repeating unit having an acid-decomposable group which can be contained in the resin (P), a repeating unit represented by the following General Formula (AI) is preferable. Further, a repeating unit represented by the following General Formula (AI) is preferably different from the repeating unit (i) as described above.

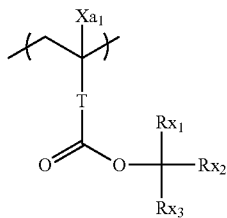

(AI)

In General Formula (AI), $Xa_1$ represents a hydrogen atom, or an alkyl group which may have a substituent, T represents a single bond or a divalent linking group, $Rx_1$ to $Rx_3$ each independently represent an (linear or branched) alkyl group or a (monocyclic or polycyclic) cycloalkyl group, and two of $Rx_1$ to $Rx_3$ may be bonded to each other to form a (monocyclic or polycyclic) cycloalkyl group.

Examples of the alkyl group which may have a substituent, represented by $Xa_1$, include a methyl group or a group represented by —$CH_2$—$R_{11}$. $R_{11}$ represents a halogen atom (a fluorine atom or the like), a hydroxyl group, or a monovalent organic group, and examples thereof include an alkyl group having 5 or less carbon atoms, and an acyl group having 5 or less carbon atoms, preferably an alkyl group having 3 or less carbon atoms, and more preferably a methyl group. In one aspect, $Xa_1$ is preferably a hydrogen atom, a methyl group, a trifluoromethyl group, a hydroxymethyl group, or the like.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group.

As the alkyl group of $Rx_1$ to $Rx_3$, an alkyl group having 1 to 4 carbon atoms, such as a methyl group, an ethyl group, a n-propyl group, an isopropyl group, a n-butyl group, an isobutyl group, and a t-butyl group, is preferable.

As the cycloalkyl group of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the cycloalkyl group formed by the mutual bonding of two members of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable, and a monocyclic cycloalkyl group having 5 or 6 carbon atoms is particularly preferable.

In the cycloalkyl group formed by the mutual bonding of two members of $Rx_1$ to $Rx_3$, for example, one of the methylene groups constituting the ring may be substituted with a hetero atom such as an oxygen atom, or with a group having a hetero atom, such as a carbonyl group.

An aspect of the repeating unit represented by General Formula (AI), in which $Rx_1$ is a methyl group or an ethyl group, and $Rx_2$ and $Rx_3$ are bonded to each other to form the aforementioned cycloalkyl group, for example, is preferable.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with those having 8 or less carbon atoms being preferable.

The total content of the repeating unit having an acid-decomposable group is preferably 20% by mole to 90% by mole, more preferably 25% by mole to 85% by mole, and still more preferably 30% by mole to 80% by mole, with respect to all the repeating units in the resin (P).

Specific examples of the preferred repeating unit having an acid-decomposable group are shown below, but the present invention is not limited thereto.

In the specific examples, Rx and $Xa_1$ each represent a hydrogen atom, $CH_3$, $CF_3$, or $CH_2OH$. Rxa and Rxb each represent an alkyl group having 1 to 4 carbon atoms. Z represents a substituent containing a polar group, and in the case where Z's are present in plural numbers, they are each independent. p represents 0 or a positive integer. Examples of the substituent containing a polar group, represented by Z, include a linear or branched alkyl group, and a cycloalkyl group, each having a hydroxyl group, a cyano group, an amino group, an alkylamide group, or a sulfonamide group, and preferably an alkyl group having a hydroxyl group. As the branched alkyl group, an isopropyl group is particularly preferable.

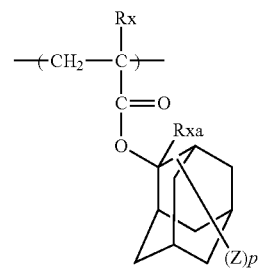

1

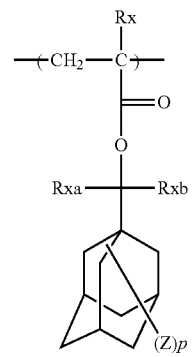

2

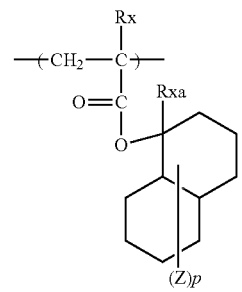

3

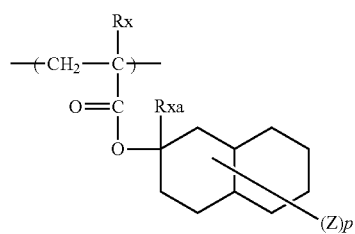
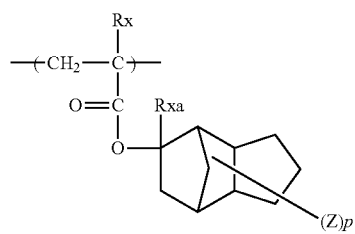
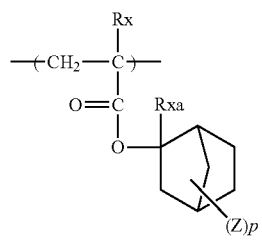
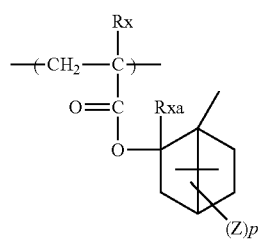
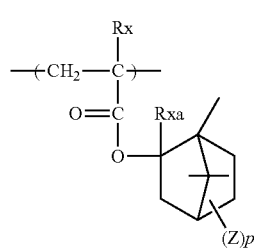
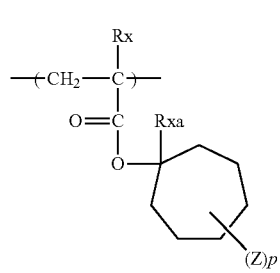
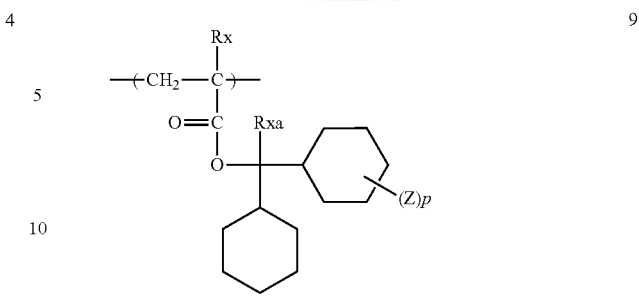
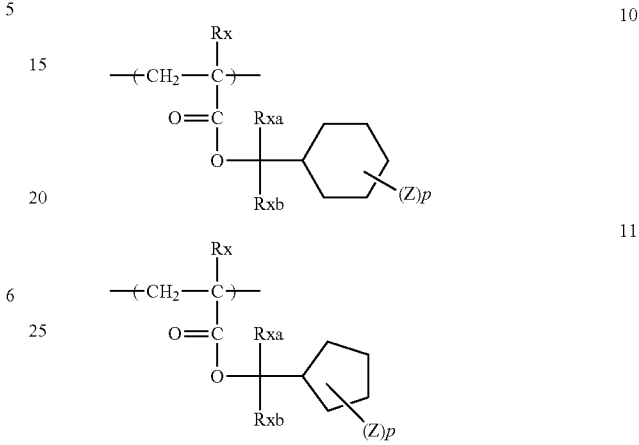
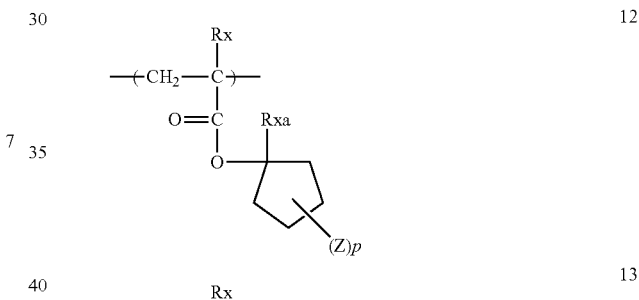
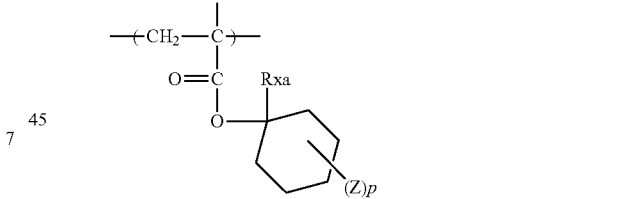
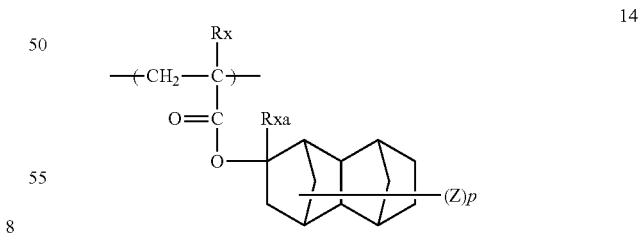
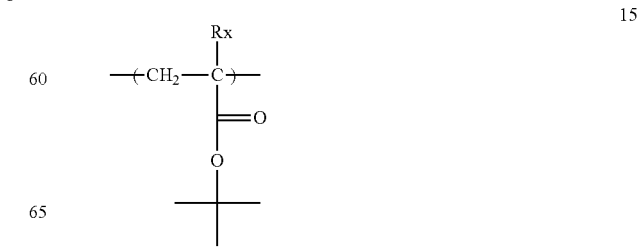

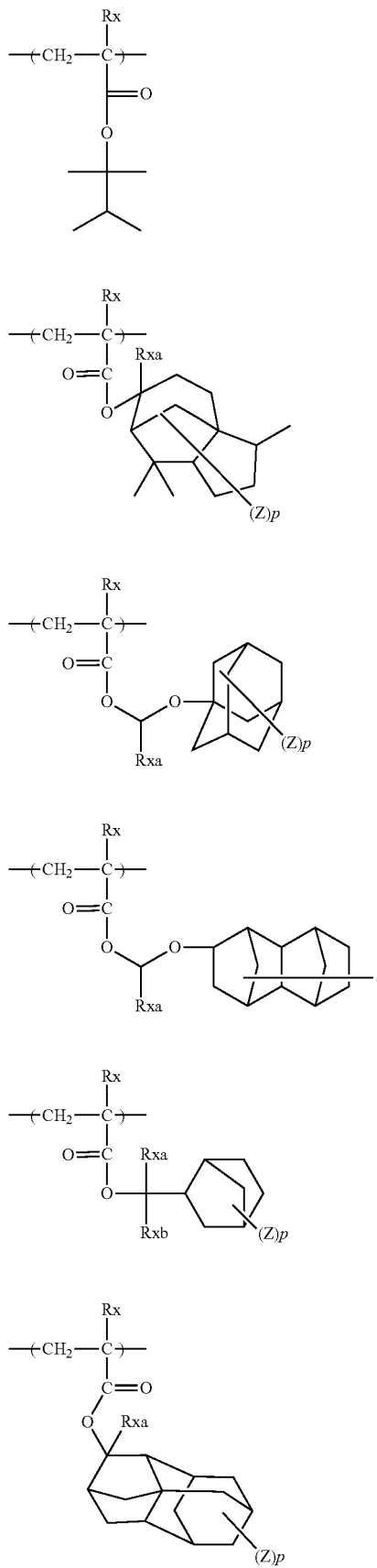
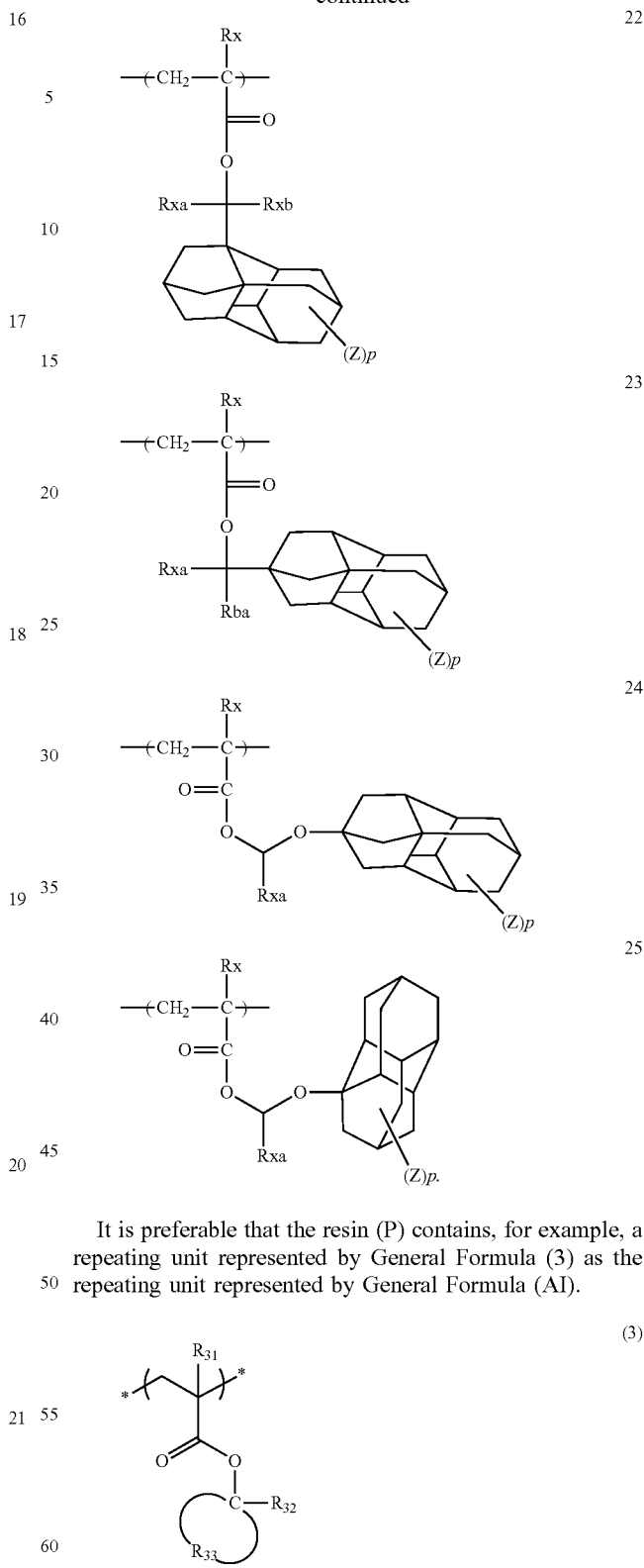
It is preferable that the resin (P) contains, for example, a repeating unit represented by General Formula (3) as the repeating unit represented by General Formula (AI).
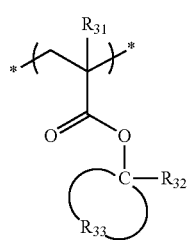
(3)
In General Formula (3),
$R_{31}$ represents a hydrogen atom or an alkyl group.
$R_{32}$ represents a methyl group, an ethyl group, a n-propyl group, an isopropyl group, a n-butyl group, or an isobutyl group, and $R_{33}$ represents an atomic group required for forming a monocyclic alicyclic hydrocarbon structure together with carbon atoms to which $R_{32}$ is bonded. In the alicyclic hydrocarbon structure, a part of the carbon atoms constituting the ring may be substituted with a hetero atom or a group having a hetero atom.

The alkyl group of $R_{31}$ may have a substituent, and examples of the substituent include a fluorine atom and a hydroxyl group. $R_{31}$ preferably represents a hydrogen atom, a methyl group, a trifluoromethyl group, or a hydroxymethyl group.

$R_{32}$ is preferably a methyl group, an ethyl group, a n-propyl group, or an isopropyl group, and more preferably a methyl group or an ethyl group.

The monocyclic alicyclic hydrocarbon structure formed of $R_{33}$ together with carbon atoms is preferably a 3-to 8-membered ring, and more preferably a 5-or 6-membered ring.

In the monocyclic alicyclic hydrocarbon structure formed of $R_{33}$ together with carbon atoms, examples of the hetero atom which can constitute a ring include an oxygen atom and a sulfur atom, and examples of the group having a hetero atom include a carbonyl group. However, it is preferable that the group having a hetero atom is not an ester group (ester bond).

It is preferable that the monocyclic alicyclic hydrocarbon structure formed by $R_{33}$ together with carbon atoms is formed of only carbon atoms and hydrogen atoms.

The repeating unit represented by General Formula (3) is preferably a repeating unit represented by the following General Formula (3').

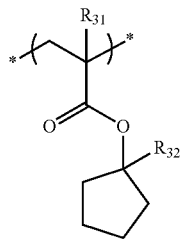
(3')

In General Formula (3'), $R_{31}$ and $R_{32}$ each have the same definitions as those in General Formula (3).

Specific examples of the repeating unit having the structure represented by General Formula (3) are shown below, but are not limited thereto.

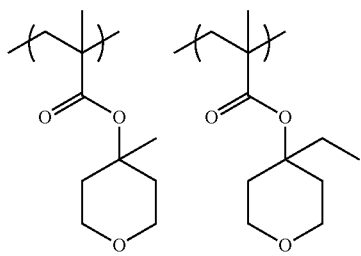

-continued

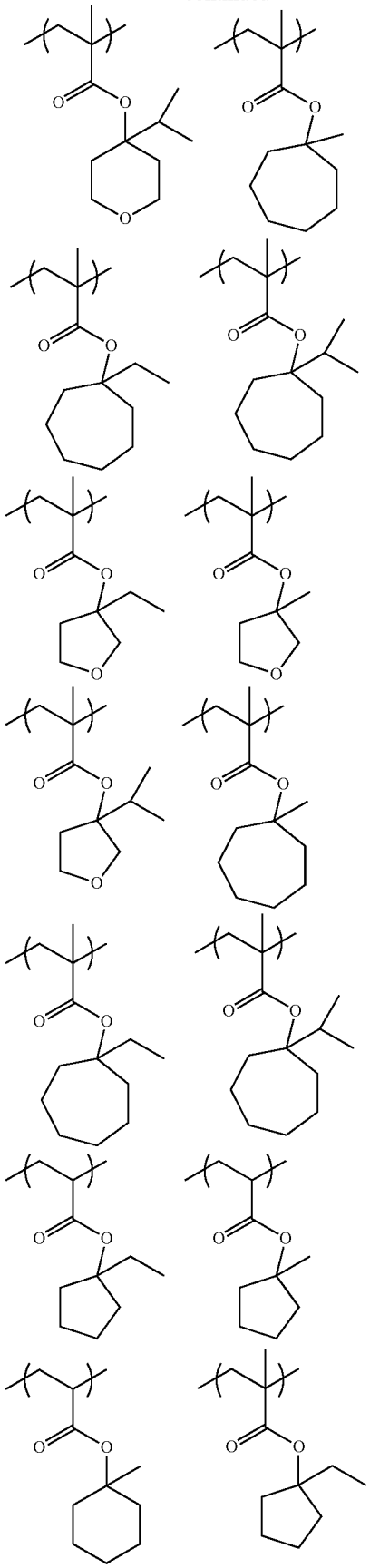

-continued

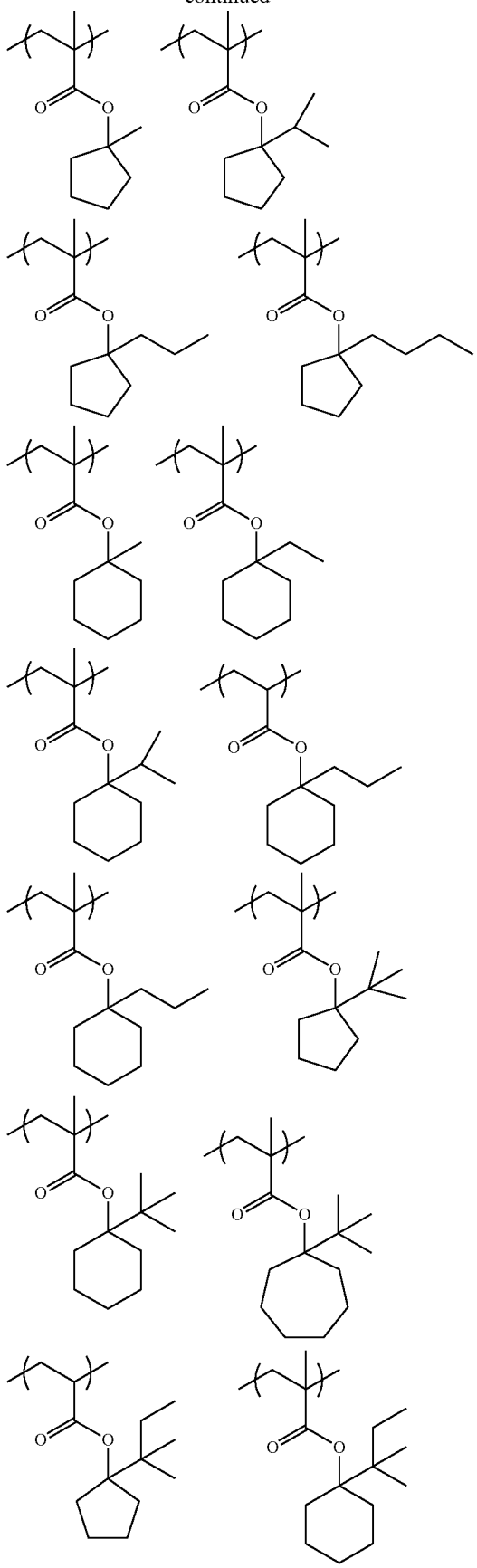

The content of the repeating units having the structure represented by General Formula (3) is preferably 20% by mole to 80% by mole, more preferably 25% by mole to 75% by mole, and still more preferably 30% by mole to 70% by mole, with respect to all the repeating units in the resin (P).

The resin (P) is more preferably a resin having at least one of the repeating unit represented by General Formula (I) or the repeating unit represented by General Formula (II), for example, as the repeating unit represented by General Formula (AI).

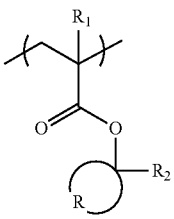

(I)

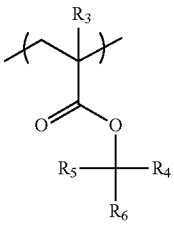

(II)

In Formulae (I) and (II), $R_1$ and $R_3$ each independently represent a hydrogen atom, a methyl group which may have a substituent, or a group represented by —$CH_2$—$R_{11}$. $R_{11}$ represents a monovalent organic group.

$R_2$, $R_4$, $R_5$, and $R_6$ each independently represent an alkyl group or a cycloalkyl group, and R represents an atomic group required for forming an alicyclic structure together with carbon atoms to which $R_2$ is bonded.

$R_1$ and $R_3$ each preferably represent a hydrogen atom, a methyl group, a trifluoromethyl group, or a hydroxymethyl group. Specific examples of the monovalent organic group in $R_{11}$ and preferred examples thereof are the same groups as those described as $R_{11}$ in General Formula (AI).

The alkyl group in $R_2$ may be linear or branched, and may have a substituent.

The cycloalkyl group in $R_2$ may be monocyclic or polycyclic, and may have a substituent.

$R_2$ is preferably an alkyl group, more preferably an alkyl group having 1 to 10 carbon atoms, and still more preferably an alkyl group having 1 to 5 carbon atoms, and examples thereof include a methyl group, an ethyl group, an isopropyl group, and a t-butyl group.

R represents an atomic group required for forming an alicyclic structure together with carbon atoms. As the alicyclic structure formed of R together with the carbon atom, a monocyclic alicyclic structure is preferable, and the number of carbon atoms is preferably 3 to 7, and more preferably 5 or 6.

$R_3$ is preferably a hydrogen atom or a methyl group, and more preferably a methyl group.

The alkyl group in $R_4$, $R_5$, or $R_6$ may be linear or branched, and may have a substituent. As the alkyl group, an alkyl group having 1 to 4 carbon atoms, such as a methyl group, an ethyl group, a n-propyl group, an isopropyl group, a n-butyl group, an isobutyl group, and a t-butyl group, is preferable.

The cycloalkyl group in $R_4$, $R_5$, or $R_6$ may be monocyclic or polycyclic, and may have a substituent. As the cycloalkyl group, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

Examples of the substituent which each of the groups may have include those described above as the substituent which each of the groups in General Formula (AI) may have.

The resin (P) is more preferably a resin including the repeating unit represented by General Formula (I) and the repeating unit represented by General Formula (II) as the repeating unit represented by General Formula (AI).

Furthermore, in another embodiment, the resin (P) is more preferably a resin containing at least two repeating units represented by General Formula (I) as repeating unit represented by General Formula (AI). In the case where the resin (P) contains two or more repeating units of General Formula (I), it is preferable that acid-decomposable resin contains both of a repeating unit in which the alicyclic structure formed of R together with carbon atoms is a monocyclic alicyclic structure and a repeating unit in which the alicyclic structure formed of R together with carbon atoms is a polycyclic alicyclic structure. As the monocyclic alicyclic structure, the structure having 5 to 8 carbon atoms is preferable, the structure having 5 or 6 carbon atoms is more preferable, and the structure having 5 carbon atoms is particularly preferable. As the polycyclic alicyclic structure, a norbornyl group, a tetracyclodecanyl group, a tetracyclododecanyl group, and an adamantyl group are preferable.

The repeating units having an acid-decomposable group, which is contained in the resin (P), may be used alone or in combination of two or more kinds thereof. In the case of using the repeating units in combination, the combinations as mentioned below are preferable. In the following formulae, R's each independently represent a hydrogen atom or a methyl group.

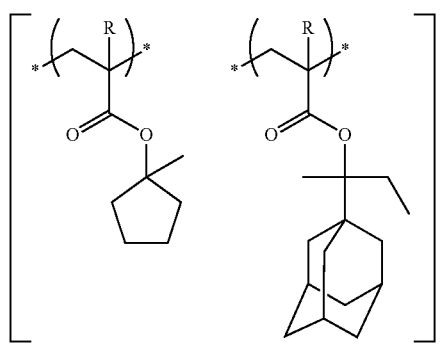

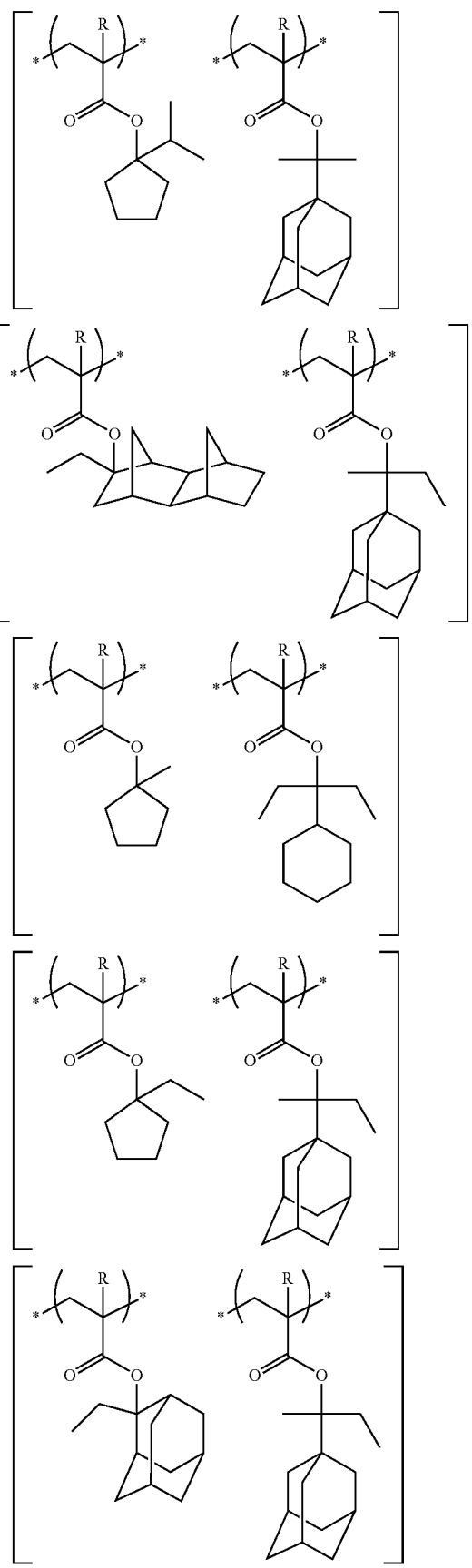

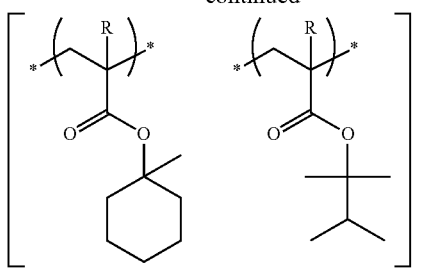
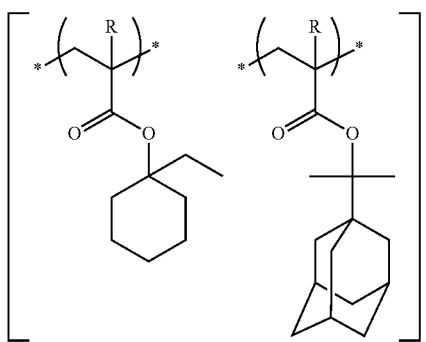
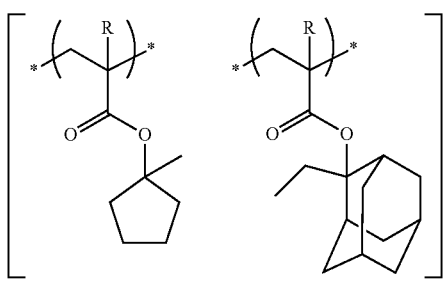
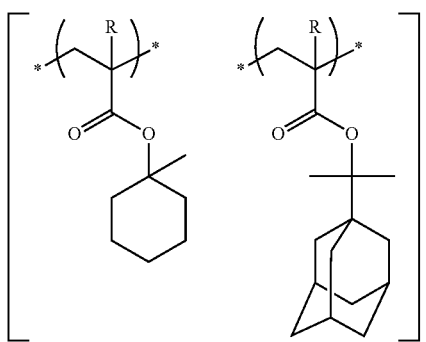
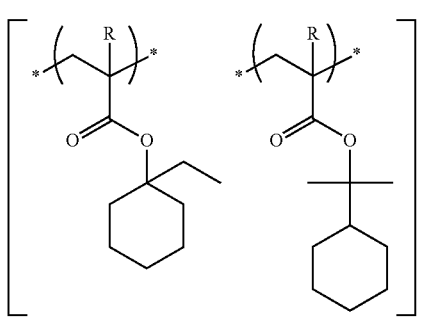
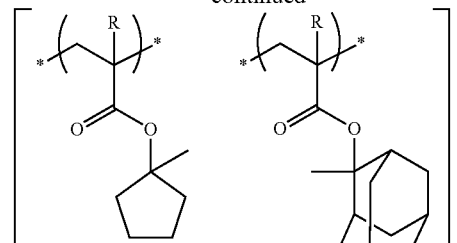
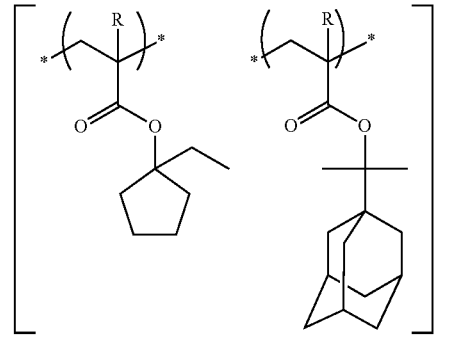
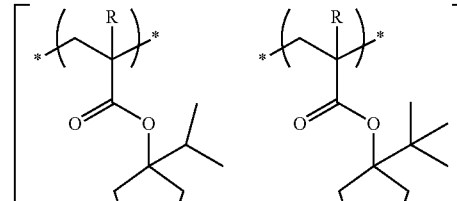
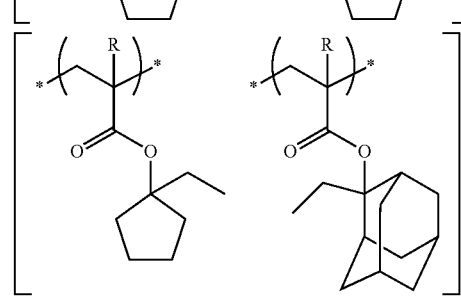
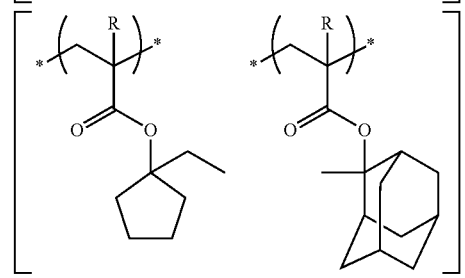
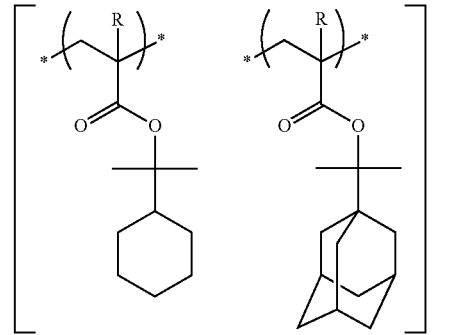

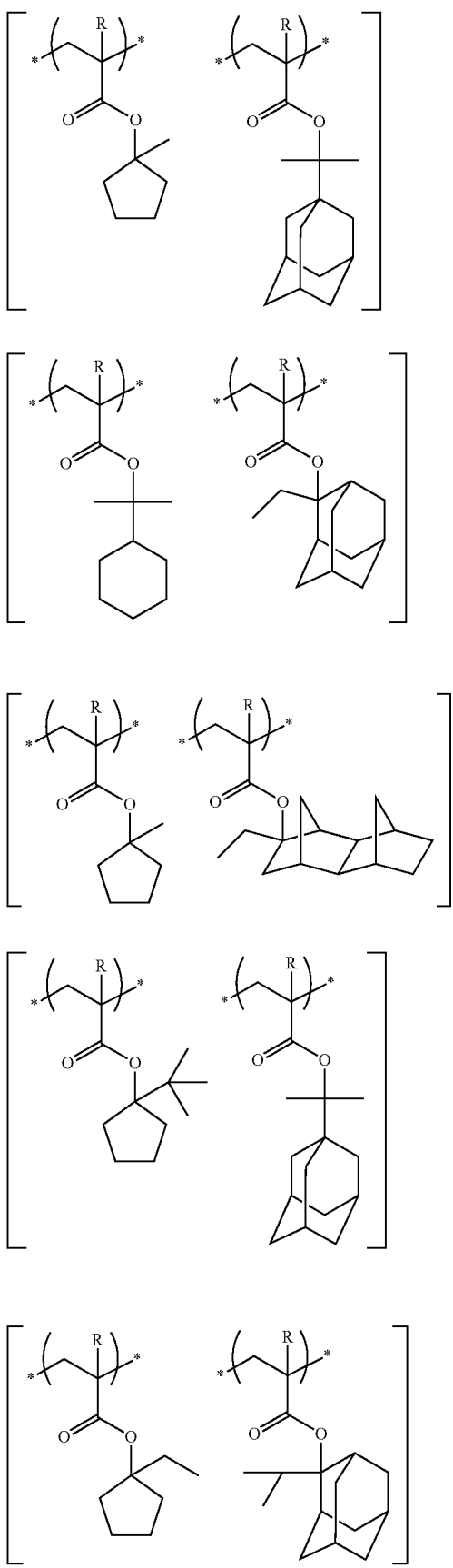

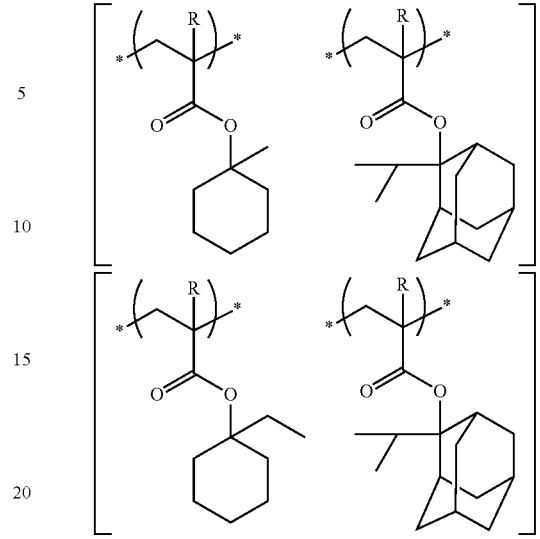

The content of the repeating units containing an acid-decomposable group, which is included in the resin (P), which may be the total content of the repeating units in the case where two or more kinds of repeating units are contained, is preferably 30% by mole to 80% by mole, more preferably 40% by mole to 75% by mole, still more preferably 50% by mole to 70% by mole, and particularly preferably 55% by mole to 65% by mole, with respect to all the repeating units in the resin (P).

In one aspect, it is preferable that the resin (P) contains a repeating unit having a cyclic carbonic acid ester structure. This cyclic carbonic acid ester structure is a structure having a ring including a bond represented by —O—C(═O)—O— as an atomic group constituting the ring. The ring including a bond represented by —O—C(═O)—O— as an atomic group constituting the ring is preferably a 5-to 7-membered ring, and most preferably a 5-membered ring. Such a ring may be fused with another ring to form a fused ring.

It is preferable that the resin (P) contains a repeating unit having a lactone structure or a sultone (cyclic sulfonic acid ester) structure.

As the lactone group or the sultone group, any group may be used as long as it has a lactone structure or a sultone structure, and the structure is preferably a 5-to 7-membered ring lactone structure or sultone structure, and preferably a 5-to 7-membered ring lactone structure or sultone structure to which another ring structure is fused in the form of forming a bicyclo structure or a spiro structure. The resin more preferably has a repeating unit having a lactone structure or a sultone structure represented by any one of the following General Formulae (LC1-1) to (LC1-17), (SL1-1), and (SL1-2). Further, the lactone structure or sultone structure may be bonded directly to the main chain. The lactone structure or sultone structure is preferably (LC1-1), (LC1-4), (LC1-5), or (LC1-8), and more preferably (LC1-4). By using such a specific lactone structure or sultone structure, LWR and development defects are relieved.

LC1-1

-continued
LC1-2 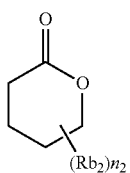
LC1-3 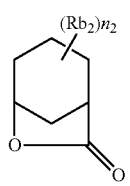
LC1-4 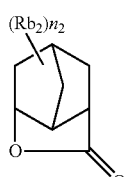
LC1-5 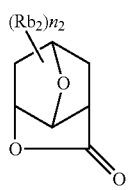
LC1-6 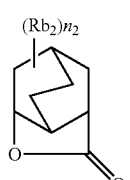
LC1-7 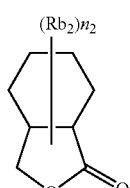
LC1-8 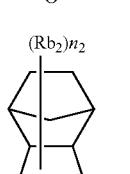
LC1-9 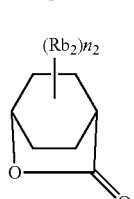
LC1-10 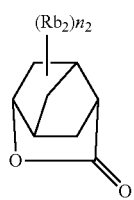
LC1-11 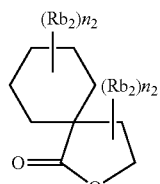
LC1-12 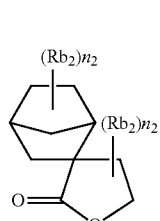
LC1-13 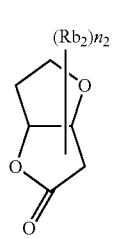
LC1-14 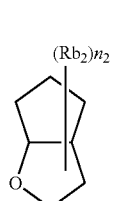
LC1-15 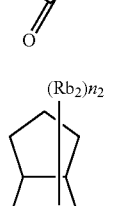
LC1-16 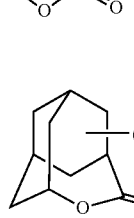
LC1-17 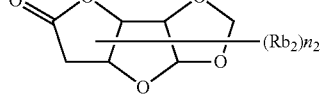

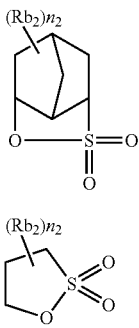

SL1-1

SL1-2

The lactone structure moiety or the sultone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. $n_2$ represents an integer of 0 to 4. When $n_2$ is 2 or more, the substituents ($Rb_2$) which are present in plural numbers may be the same as or different from each other, and further, the substituents ($Rb_2$) which are present in plural numbers may be bonded to each other to form a ring.

It is preferable that the resin (P) contains a repeating unit having a lactone structure or a sultone structure, represented by the following General Formula (III).

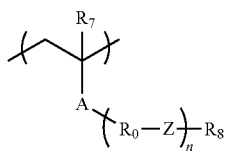

(III)

In Formula (III),

A represents an ester bond (a group represented by —COO—) or an amide bond (a group represented by —CONH—), in the case where $R_0$'s are present in plural numbers, they each independently represent an alkylene group, a cycloalkylene group, or a combination thereof, and in the case where Z's are present in plural numbers, they each independently represent a single bond, an ether bond, an ester bond, an amide bond, an urethane bond (a group represented by

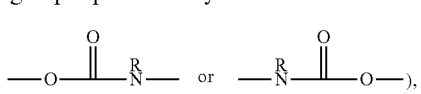

or an urea bond (a group represented by

Here, R's each independently represent a hydrogen atom, an alkyl group, a cycloalkyl group, or an aryl group.

$R_8$ represents a monovalent organic group having a lactone structure or a sultone structure.

n is the repetition number of the structure represented by —$R_0$—Z—, and represents an integer of 0 to 2.

$R_7$ represents a hydrogen atom, a halogen atom, or an alkyl group.

The alkylene group and the cycloalkylene group of $R_0$ may have a substituent.

Z is preferably an ether bond or an ester bond, and particularly preferably an ester bond.

The alkyl group of $R_7$ is preferably an alkyl group having 1 to 4 carbon atoms, more preferably a methyl group or an ethyl group, and particularly preferably a methyl group. The alkylene group and the cycloalkylene group of $R_0$, and the alkyl group in $R_7$ may be each substituted, and examples of the substituent include a halogen atom such as a fluorine atom, a chlorine atom, and a bromine atom, a mercapto group, a hydroxy group, an alkoxy group such as a methoxy group, an ethoxy group, an isopropoxy group, a t-butoxy group, and a benzyloxy group, and an acetoxy group such as an acetyloxy group and a propionyloxy group. $R_7$ is preferably a hydrogen atom, a methyl group, a trifluoromethyl group, or a hydroxymethyl group.

The preferred chained alkylene group in $R_0$ is chained alkylene group, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In order to express the effects of the present invention, a chained alkylene group is more preferable, and a methylene group is particularly preferable.

The monovalent organic group having a lactone structure or a sultone structure represented by $R_8$ is not limited as long as it has a lactone structure or a sultone structure. Specific examples thereof include ones having lactone structures or sultone structures represented by General Formulae (LC1-1) to (LC1-17), (SL1-1), and (SL1-2), and the structure represented by (LC1-4) is particularly preferable. Further, $n_2$ in (LC1-1) to (LC1-17), (SL1-1), and (SL1-2) is more preferably 2 or less.

Furthermore, $R_8$ is preferably a monovalent organic group having an unsubstituted lactone structure or sultone structure, or a monovalent organic group having a lactone structure or a sultone structure having a methyl group, a cyano group, or an alkoxycarbonyl group as a substituent, and more preferably a monovalent organic group having a lactone structure having a cyano group as a substituent (cyanolactone) or a sultone structure having a cyano group as a substituent (cyanosultone).

In General Formula (III), n is preferably 1 or 2.

Specific examples of the repeating unit having a group having the lactone structure or sultone structure represented by General Formula (III) are shown below, but the present invention is not limited thereto.

In the following specific examples, R represents a hydrogen atom, an alkyl group which may have a substituent, or a halogen atom, and preferably represents a hydrogen atom, a methyl group, a hydroxymethyl group, or an acetoxymethyl group.

In the following formulae, Me represents a methyl group.

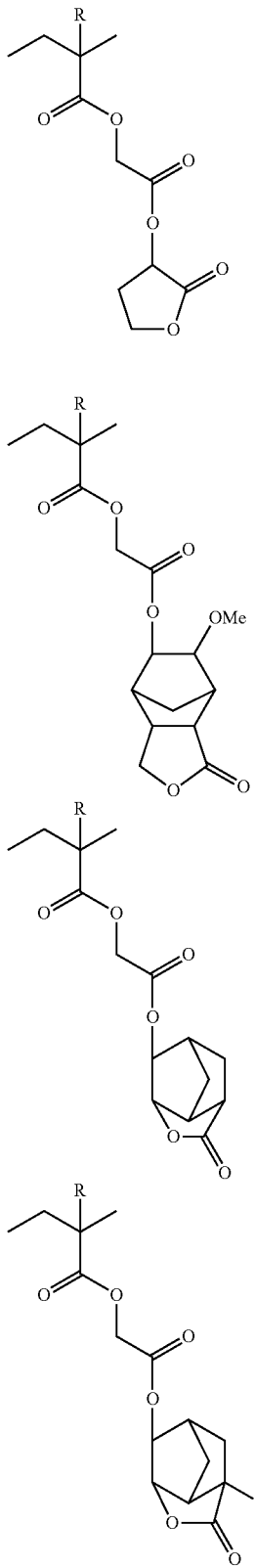

As the repeating unit having a lactone structure or a sultone structure, a repeating unit represented by the following General Formula (III-1) or (III-1') is more preferable.

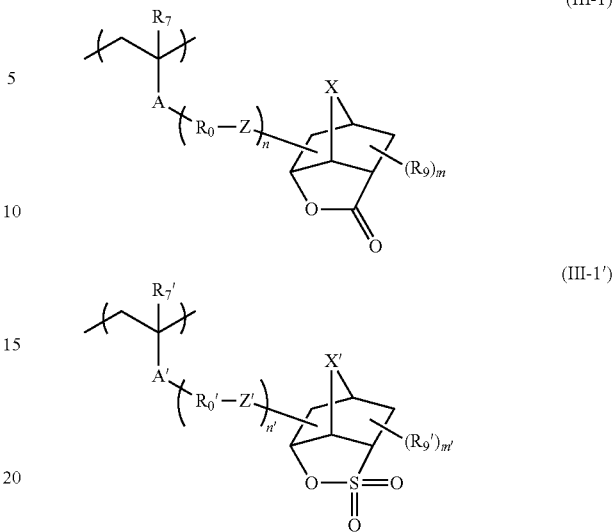

In General Formulae (III-1) and (III-1'), $R_7$, A, $R_0$, Z, and n have the same definitions as those in General Formula (III).

$R_7'$, A', $R_0'$, Z', and n' each have the same definitions $R_7$, A, $R_0$, Z, and n in General Formula (III).

In the case where $R_9$'s are present in plural numbers, they each independently represent an alkyl group, a cycloalkyl group, an alkoxycarbonyl group, a cyano group, a hydroxyl group, or an alkoxy group, and in the case where they are present in plural numbers, two $R_9$'s may be bonded to each other to form a ring.

In the case where $R_9$'s are present in plural numbers, they each independently represent an alkyl group, a cycloalkyl group, an alkoxycarbonyl group, a cyano group, a hydroxyl group, or an alkoxy group, and in the case where they are present in plural numbers, two $R_9$'s may be bonded to each other to form a ring.

X and X' each independently represent an alkylene group, an oxygen atom, or a sulfur atom.

m and m' are each the number of substituents, and each independently represent an integer of 0 to 5. m and m' are each independently preferably 0 or 1.

As the alkyl group of $R_9$ and $R_9'$, an alkyl group having 1 to 4 carbon atoms is preferable, a methyl group and an ethyl group are more preferable, and a methyl group is most preferable. Examples of the cycloalkyl group include a cyclopropyl group, a cyclobutyl group, a cyclopentyl group, and a cyclohexyl group. Examples of the alkoxycarbonyl group include a methoxycarbonyl group, an ethoxycarbonyl group, a n-butoxycarbonyl group, and a t-butoxycarbonyl group. Examples of the alkoxy group include a methoxy group, an ethoxy group, a propoxy group, an isopropoxy group, and a butoxy group. These groups may have a substituent, and examples of the substituent include an alkoxy group such as a hydroxy group, a methoxy group, and an ethoxy group, a cyano group, and a halogen atom such as a fluorine atom. $R_9$ and $R_9'$ are each more preferably a methyl group, a cyano group, or an alkoxycarbonyl group, and still more preferably a cyano group.

Examples of the alkylene group of X and X' include a methylene group and an ethylene group. X and X' are preferably an oxygen atom or a methylene group, and more preferably a methylene group.

In the case where m and m' are 1 or more, at least one of $R_9$ or $R_9'$ is preferably substituted at the α- or β-position of the carbonyl group of the lactone, and particularly preferably at the α-position.

Specific examples of the repeating unit having a lactone structure or a sultone structure, represented by General Formula (III-1) or (III-1'), are shown, but the present invention is not limited thereto. In the following specific examples, R represents a hydrogen atom, an alkyl group which may have a substituent, or a halogen atom, and preferably represents a hydrogen atom, a methyl group, a hydroxymethyl group, or an acetoxymethyl group.

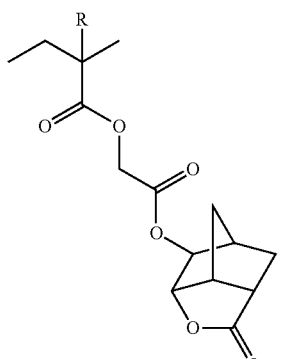

37
-continued
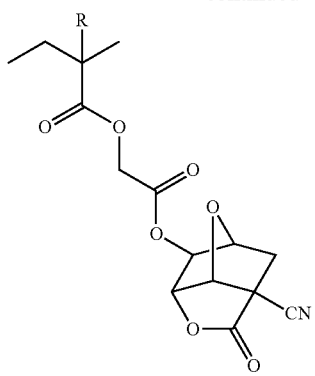
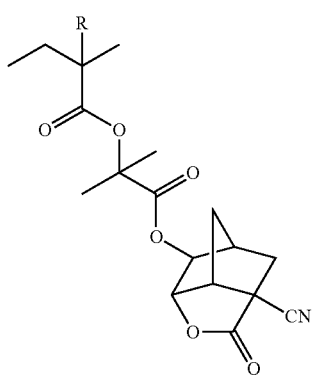
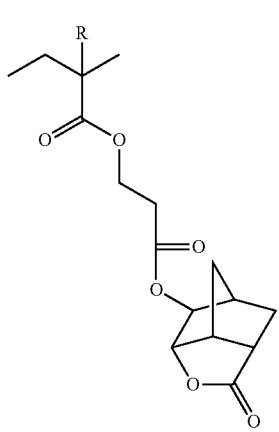
38
-continued
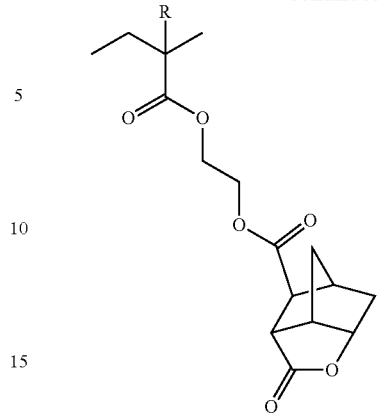
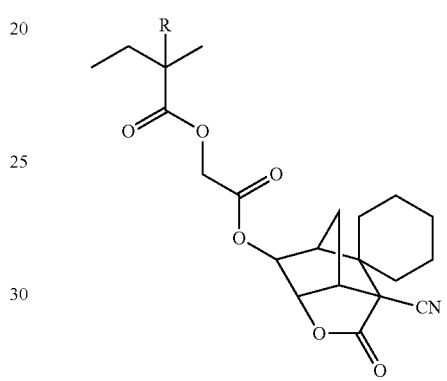
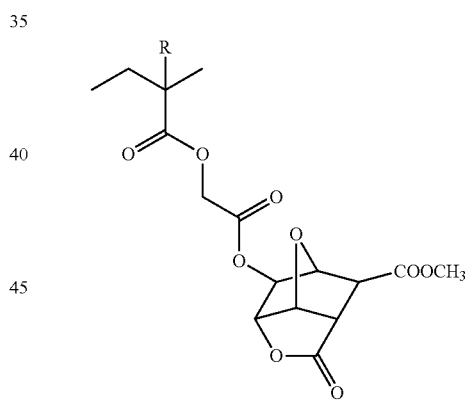
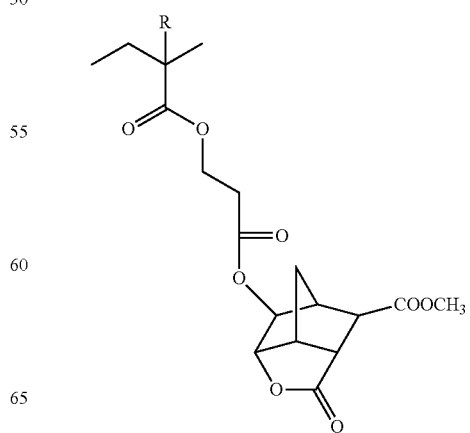

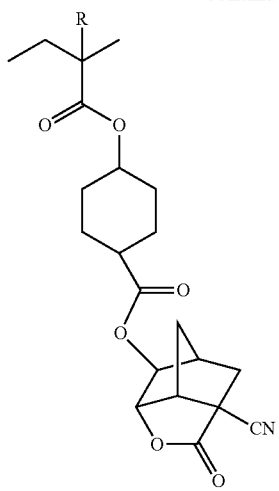
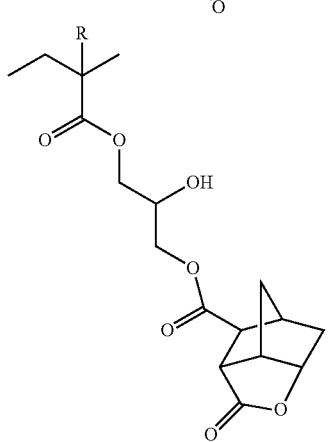
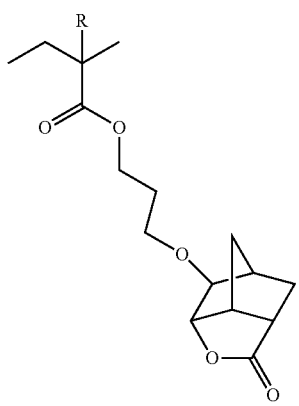
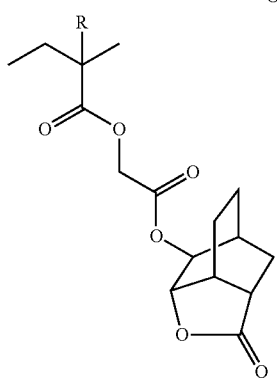
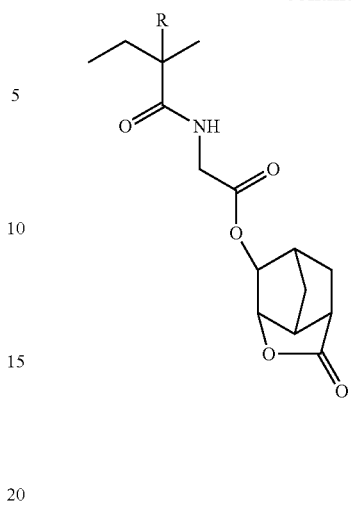
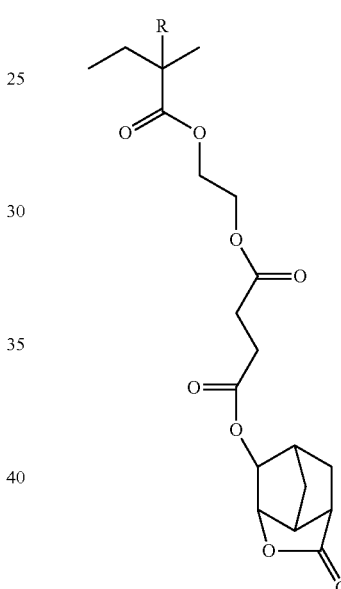
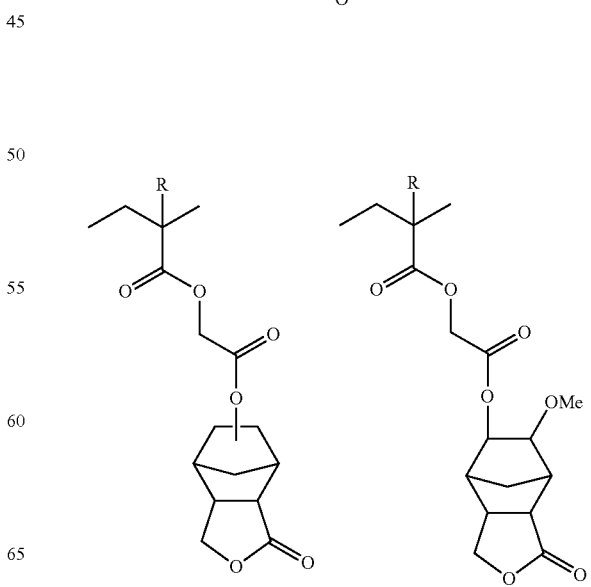

-continued

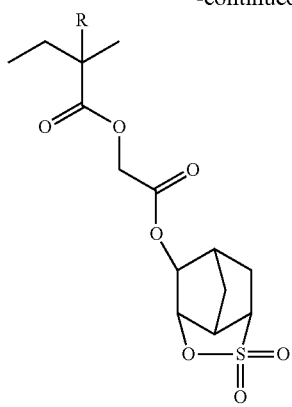
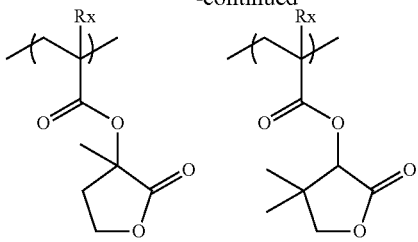

The content of the repeating unit represented by General Formula (III), which may be the total content of the repeating units in the case where two or more kinds of repeating units, are contained is preferably 15% by mole to 60% by mole, more preferably 20% by mole to 60% by mole, and still more preferably 30% by mole to 50% by mole, with respect to all the repeating units in the resin (P).

The resin (P) may contain the repeating unit having a lactone structure or a sultone structure as described above, in addition to the unit represented by General Formula (III).

Specific examples of the repeating unit having a lactone group or sultone group are shown below in addition to the aforementioned specific examples, but the present invention is not limited thereto.

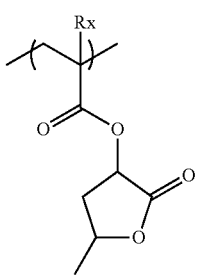
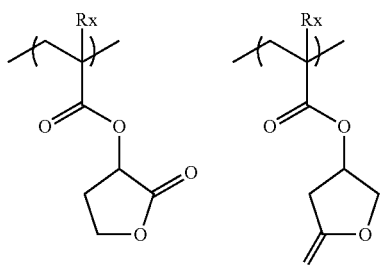
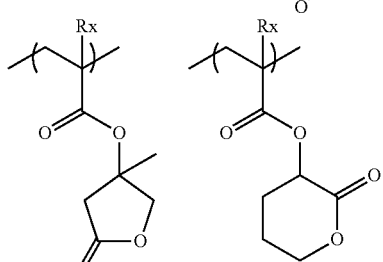
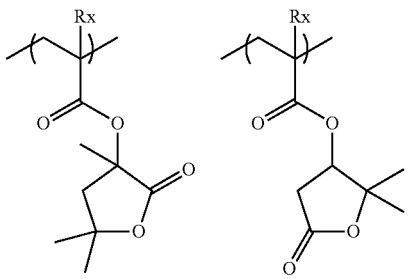
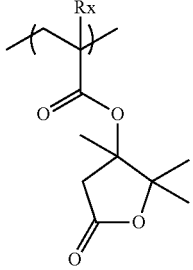
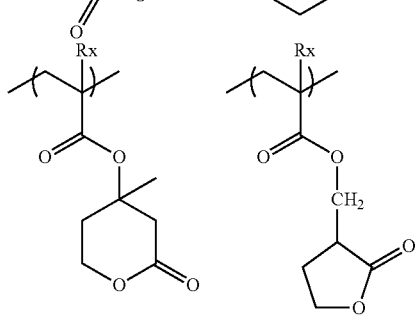
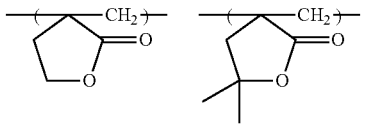
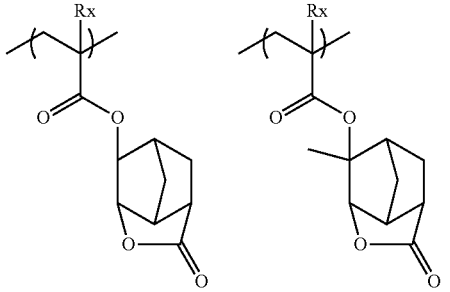

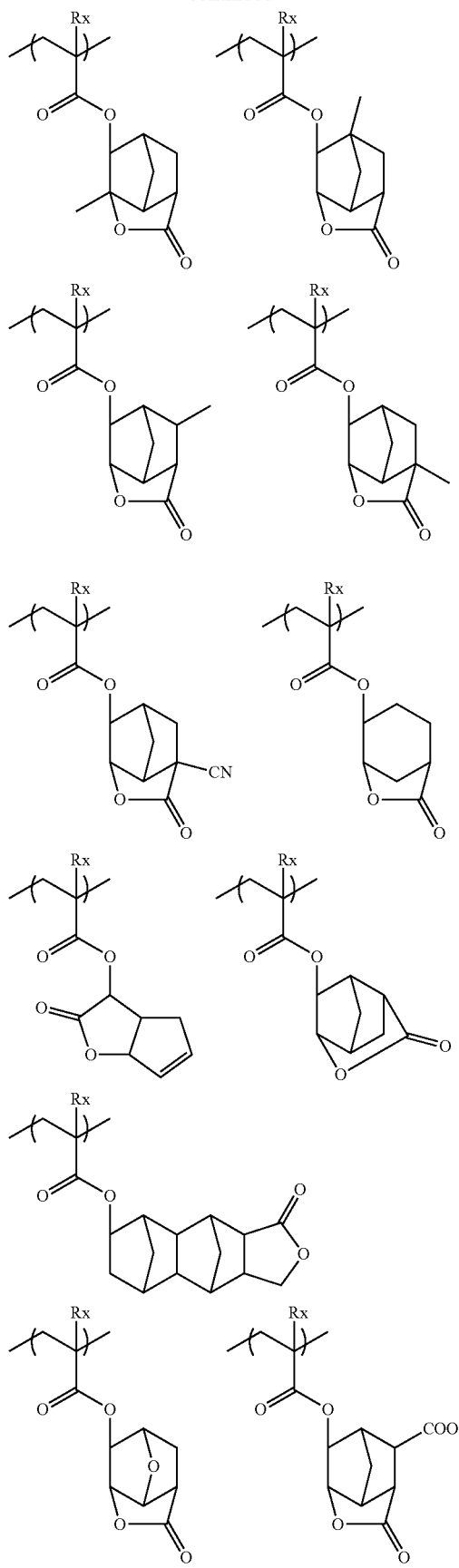
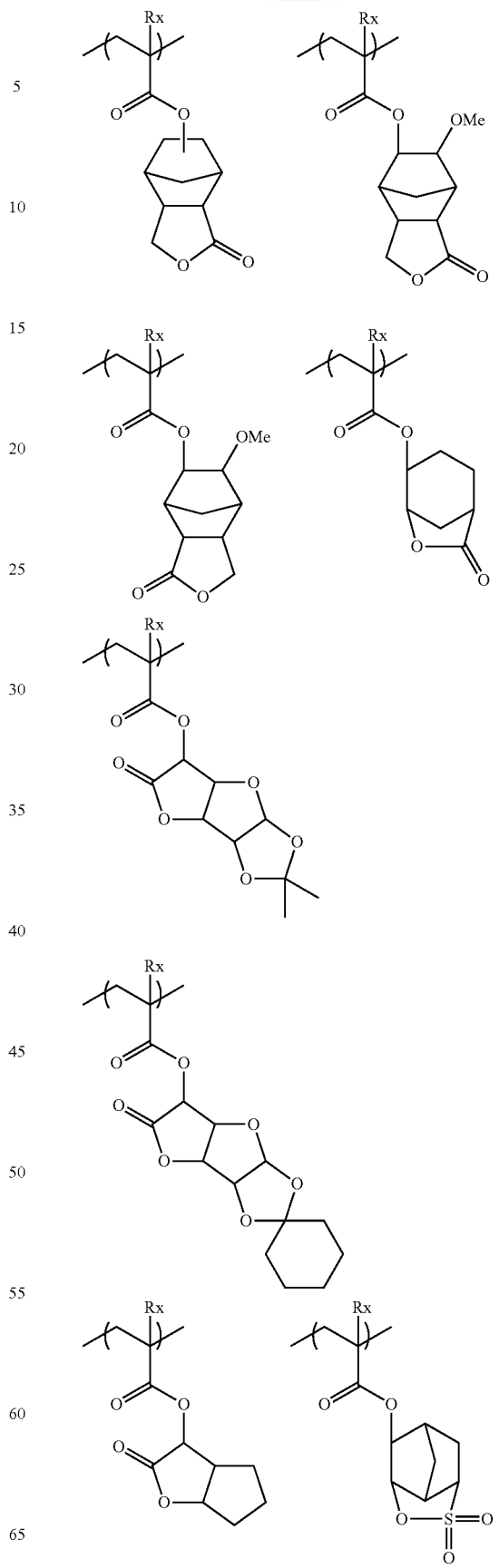

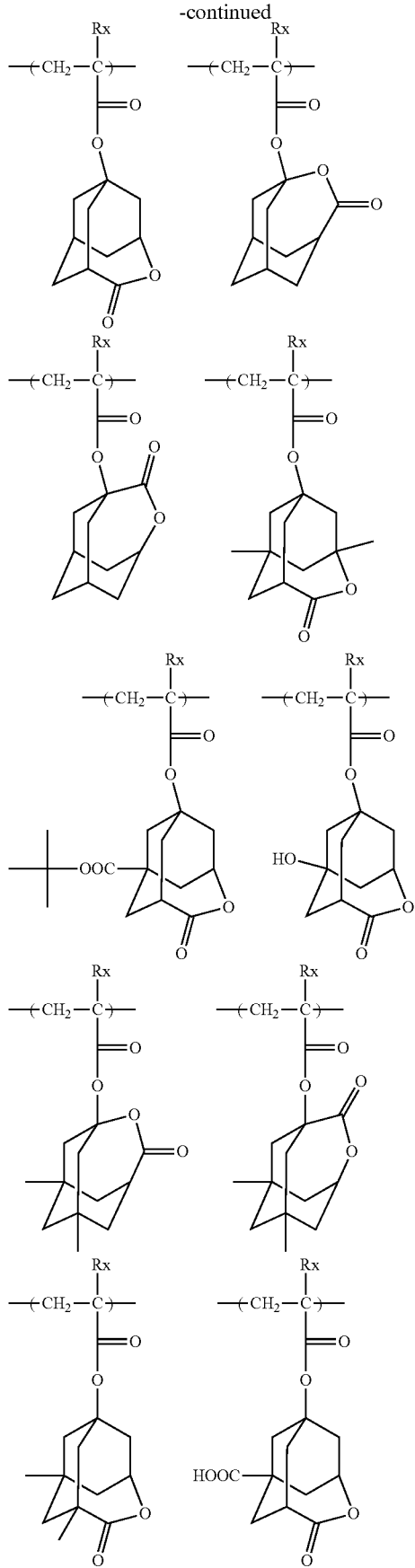
-continued
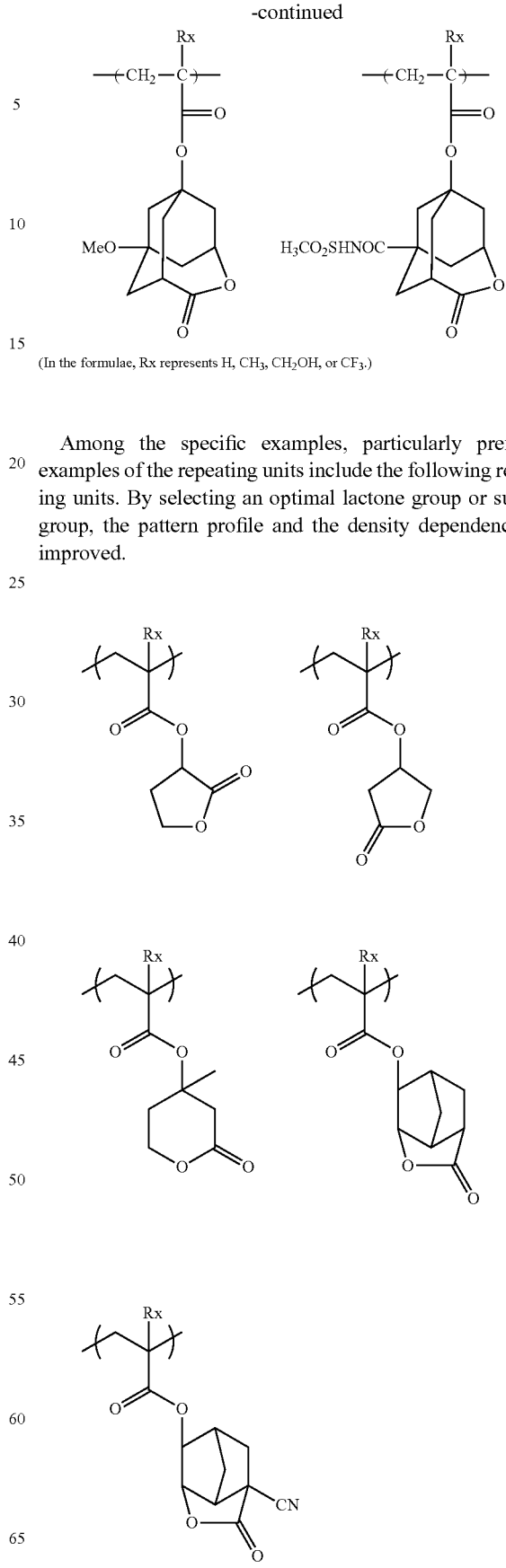
(In the formulae, Rx represents H, CH₃, CH₂OH, or CF₃.)
Among the specific examples, particularly preferred examples of the repeating units include the following repeating units. By selecting an optimal lactone group or sultone group, the pattern profile and the density dependence are improved.

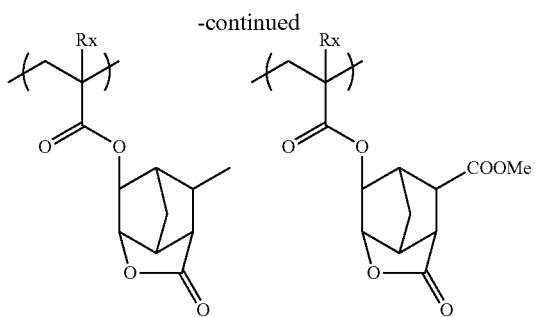

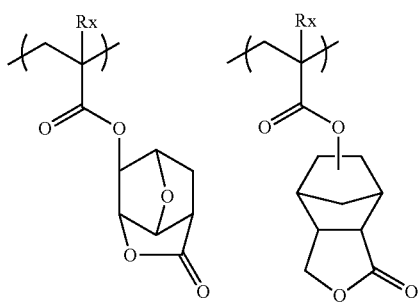

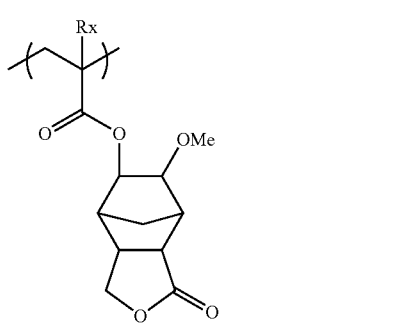

(In the formulae, Rx represents H, CH₂OH, or CF₃.)

The repeating unit having a lactone group or sultone group usually has an optical isomer, and any optical isomer may be used. Further, one kind of optical isomer may be used alone or a plurality of optical isomers may be mixed and used. In the case of mainly using one kind of optical isomer, the optical purity (ee) thereof is preferably 90% or more, and more preferably 95% or more.

The content of the repeating unit having a lactone structure or a sultone structure, other than the repeating unit represented by General Formula (III), which may be the total content of the repeating units in the case where two or more kinds of repeating units are contained, is preferably 15% by mole to 60% by mole, more preferably 20% by mole to 50% by mole, and still more preferably 30% by mole to 50% by mole, with respect to all the repeating units in the resin.

In order to enhance the effect of the present invention, it is also possible to use two or more kinds of lactone or sultone repeating units selected from General Formula (III) in combination. In the case of using the repeating units in combination, it is preferable to use two or more kinds selected from the lactone or sultone repeating units, in which in n is 1 in General Formula (III), in combination.

It is preferable that the resin (P) has a repeating unit having a hydroxyl group or a cyano group, other than General Formulae (AI) and (III). With the repeating unit, the adhesion to a substrate and the developer affinity are enhanced. The repeating unit having a hydroxyl group or a cyano group is preferably a repeating unit having an alicyclic hydrocarbon structure substituted with a hydroxyl group or a cyano group, and preferably has no acid-decomposable group. The alicyclic hydrocarbon structure in the alicyclic hydrocarbon structure substituted with a hydroxyl group or a cyano group is preferably an adamantyl group, a diadamantyl group, or a norbornane group. As the alicyclic hydrocarbon structures substituted with a hydroxyl group or a cyano group, partial structures represented by the following General Formulae (VIIa) to (VIId) are preferable.

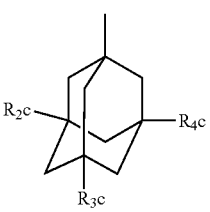
(VIIa)

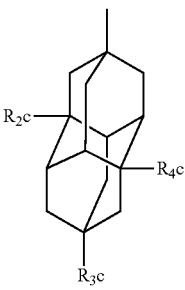
(VIIb)

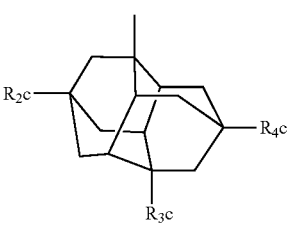
(VIIc)

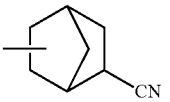
(VIId)

In General Formulae (VIIa) to (VIIc), $R_2c$ to $R_4c$ each independently represent a hydrogen atom, a hydroxyl group, or a cyano group, provided that at least one of $R_2c$, . . . , or $R_4c$ represents a hydroxyl group or a cyano group. It is preferable that one or two of $R_2c$, . . . , or $R_4c$ are a hydroxyl group and the remainders are a hydrogen atom. In General Formula (VIIa), it is more preferable that two of $R_2c$, . . . , or $R_4c$ are a hydroxyl group and the remainder is a hydrogen atom.

Examples of the repeating unit having a partial structure represented by General Formulae (VIIa) to (VIId) include repeating units represented by the following General Formulae (AIIa) to (AIId).

(AIIa)
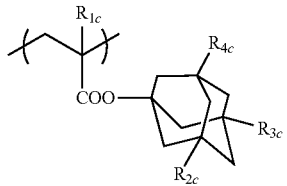

(AIIb)
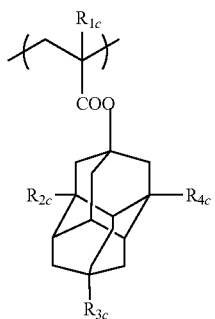

(AIIc)
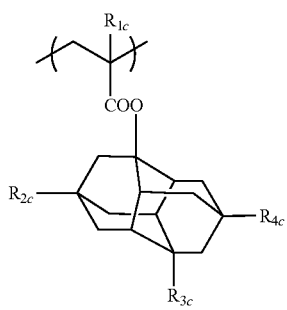

(AIId)
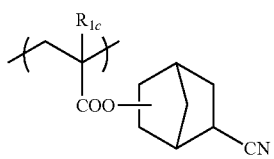

In General Formulae (AIIa) to (AIId), $R_1c$ represents a hydrogen atom, a methyl group, a trifluoromethyl group, or a hydroxymethyl group, and $R_2c$ to $R_4c$ have the same meanings as $R_2c$ to $R_4c$ in VIIa) to (VIIc).

The content of the repeating units having a hydroxyl group or a cyano group is preferably 5% by mole to 40% by mole, more preferably 5% by mole to 30% by mole, and still more preferably 10% by mole to 25% by mole, with respect to all the repeating units in the resin (P).

Specific examples of the repeating unit having a hydroxyl group or a cyano group are shown below, but the present invention is not limited thereto.

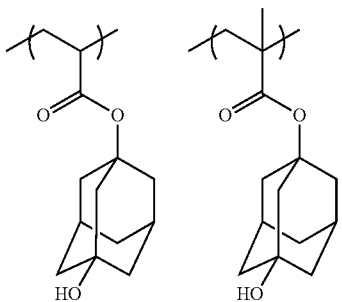

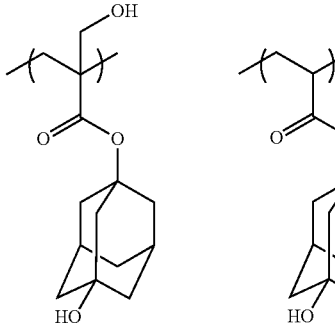

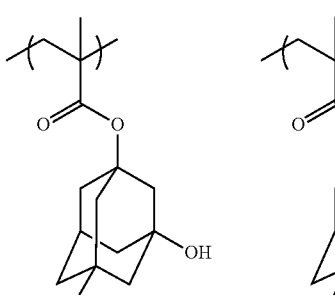

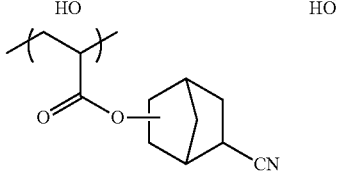

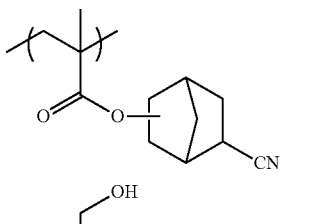

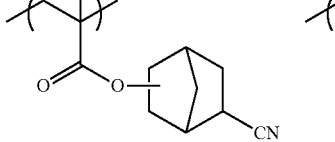

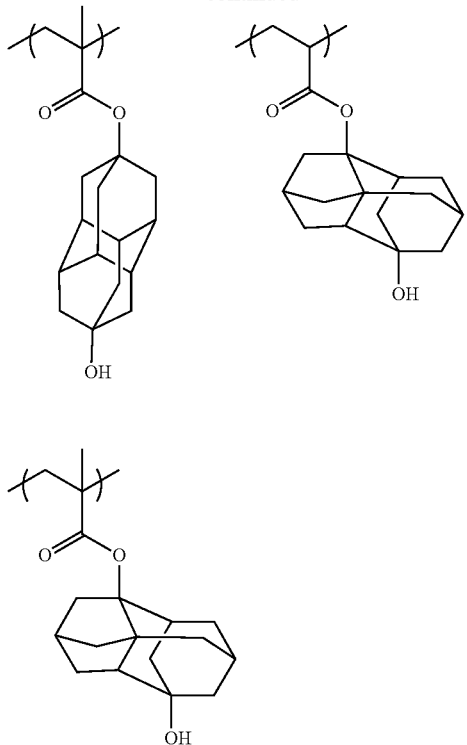

The resin (P) used in the composition of the present invention may have a repeating unit having an alkali-soluble group. Examples of the alkali-soluble group include a carboxyl group, a sulfonamide group, a sulfonylimide group, a bisulfonylimide group, and an aliphatic alcohol group with the α-position being substituted with an electron-withdrawing group (for example, a hexafluoroisopropanol group). It is more preferable to contain a repeating unit having a carboxyl group. By virtue of containing a repeating unit having an alkali-soluble group, the resolution increases in the usage of forming contact holes. As the repeating unit having an alkali-soluble group, all of a repeating unit in which an alkali-soluble group is directly bonded to the main chain of the resin, such as a repeating unit by an acrylic acid or a methacrylic acid, a repeating unit in which an alkali-soluble group is bonded to the main chain of the resin through a linking group, and a repeating unit in which an alkali-soluble group is introduced into the polymer chain terminal by using an alkali-soluble group-containing polymerization initiator or a chain transfer agent at the polymerization, are preferable. The linking group may have a monocyclic or polycyclic hydrocarbon structure. A repeating unit by an acrylic acid or a methacrylic acid is particularly preferable.

The content of the repeating units having an alkali-soluble group is preferably 0% by mole to 20% by mole, more preferably 3% by mole to 15% by mole, and still more preferably 5% by mole to 10% by mole, with respect to all the repeating units in the resin (P).

Specific examples of the repeating unit having an alkali-soluble group are shown below, but the present invention is not limited thereto.

In the specific examples, Rx represents H, CH$_3$, CH$_2$OH, or CF$_3$.

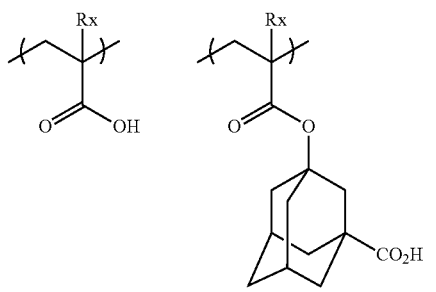
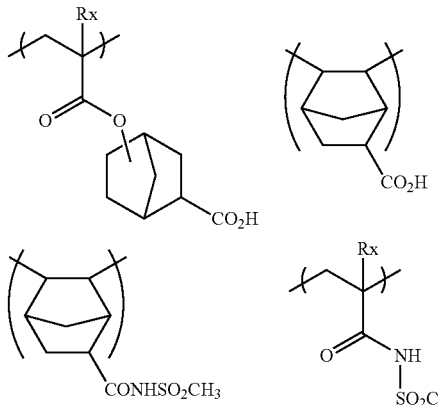
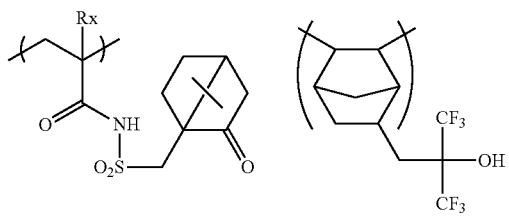
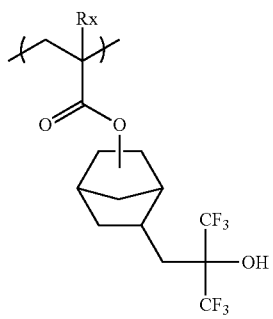
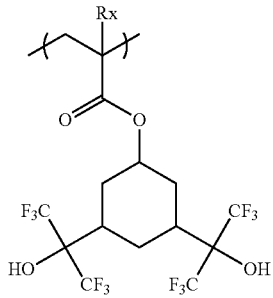

The resin (P) can further have a repeating unit which has an alicyclic hydrocarbon structure not having a polar group (for example, an alkali-soluble group, a hydroxyl group, and a cyano group) and does not exhibit acid decomposability. Examples of such a repeating unit include a repeating unit represented by General Formula (IV).

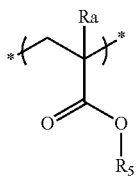
(IV)

In General Formula (IV), $R_5$ represents a hydrocarbon group having at least one cyclic structure and not having a polar group.

Ra represents a hydrogen atom, an alkyl group, or a —CH$_2$—O—Ra$_2$ group. In the formula, Ra$_2$ represents a hydrogen atom, an alkyl group, or an acyl group. Ra$_2$ is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group, and a cyclooctyl group, and a cycloalkenyl group having 3 to 12 carbon atoms, such as a cyclohexenyl group. A preferred monocyclic hydrocarbon group is a monocyclic hydrocarbon group having 3 to 7 carbon atoms, and more preferred examples thereof include a cyclopentyl group and a cyclohexyl group.

Examples of the polycyclic hydrocarbon group include a ring-assembly hydrocarbon group and a crosslinked cyclic hydrocarbon group. Examples of the ring-assembly hydrocarbon group include a bicyclohexyl group and a perhydronaphthalenyl group, and examples of the crosslinked cyclic hydrocarbon ring include bicyclic hydrocarbon rings such as a pinane ring, a bornane ring, a norpinane ring, a norbornane ring, and a bicyclooctane ring (a bicyclo[2.2.2]octane ring, a bicyclo[3.2.1]octane ring, or the like); tricyclic hydrocarbon rings such as a homobledane ring, an adamantane ring, a tricyclo[5.2.1.0$^{2,6}$]decane ring, and a tricyclo[4.3.1.1$^{2,5}$]undecane ring; and tetracyclic hydrocarbon rings such as a tetracyclo[4.4.0.1$^{2,5}$.1$^{7,10}$]dodecane ring and a perhydro-1,4-methano-5,8-methanonaphthalene ring. Other examples of the crosslinked cyclic hydrocarbon ring include fused cyclic hydrocarbon rings, and more specifically fused rings formed by fusing a plurality of 5-to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring, and a perhydrophenalene ring.

Preferred examples of the crosslinked cyclic hydrocarbon groups include a norbornyl group, an adamantyl group, a bicyclooctanyl group, and a tricyclo[5.2.1.0$^{2,6}$]decanyl group. More preferred examples of the crosslinked cyclic hydrocarbon groups include a norbornyl group and an adamantyl group.

These crosslinked cyclic hydrocarbon groups may have a substituent, and preferred examples of the substituent include a halogen atom, an alkyl group, a hydroxyl group with a hydrogen atom being substituted, and an amino group with a hydrogen atom being substituted. Preferred examples of the halogen atom include a bromine atom, a chlorine atom, and a fluorine atom, and preferred examples of the alkyl group include a methyl group, an ethyl group, a butyl group, and a t-butyl group. The alkyl group may further have a substituent, and examples of the substituent, which the alkyl group may further have, may include a halogen atom, an alkyl group, a hydroxyl group with a hydrogen atom being substituted, and an amino group with a hydrogen atom being substituted.

Examples of the group with a hydrogen atom being substituted include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, preferred examples of the substituted methyl group include a methoxymethyl group, a methoxythiomethyl group, a benzyloxymethyl group, a t-butoxymethyl group, and a 2-methoxyethoxymethyl group, examples of the substituted ethyl group include a 1-ethoxyethyl group and a 1-methyl-1-methoxyethyl group, preferred examples of the acyl group include an aliphatic acyl group having 1 to 6 carbon atoms, such as a formyl group, an acetyl group, a propionyl group, a butyryl group, an isobutyryl group, a valeryl group, and a pivaloyl group, and examples of the alkoxycarbonyl group include an alkoxycarbonyl group having 1 to 4 carbon atoms.

The resin (P) may or may not contain a repeating unit which has an alicyclic hydrocarbon structure not having a polar group and does not exhibit acid decomposability, and in the case where the resin (P) contains the repeating unit, the content of the repeating unit is preferably 1% by mole to 40% by mole, and more preferably 2% by mole to 20% by mole, with respect to all the repeating units in the resin (P).

Specific examples of the repeating unit which has an alicyclic hydrocarbon structure not having a polar group and does not exhibit acid decomposability are shown below, but the present invention is not limited thereto. In the formulae, Ra represents H, CH$_3$, CH$_2$OH, or CF$_3$.

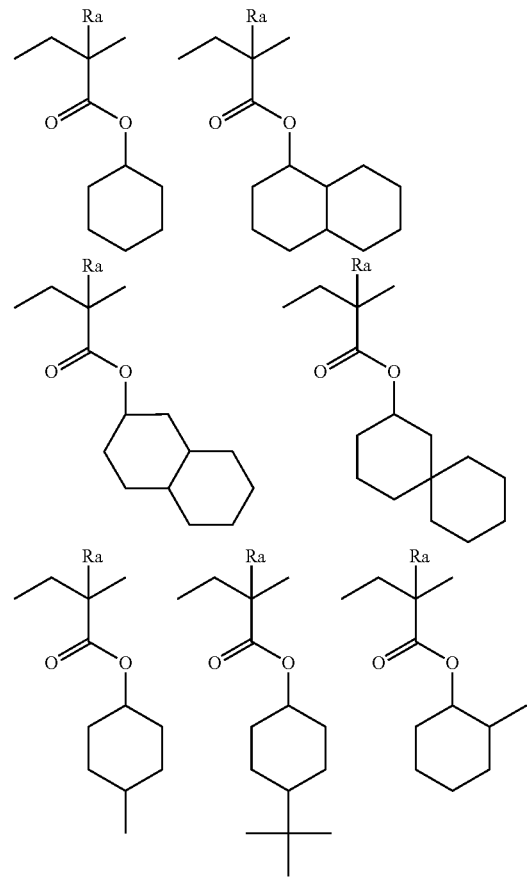

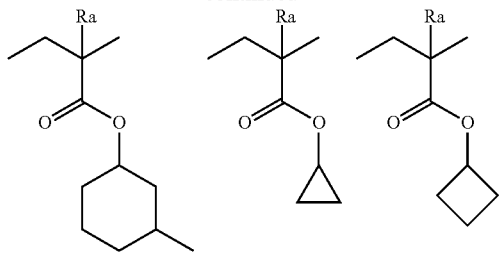
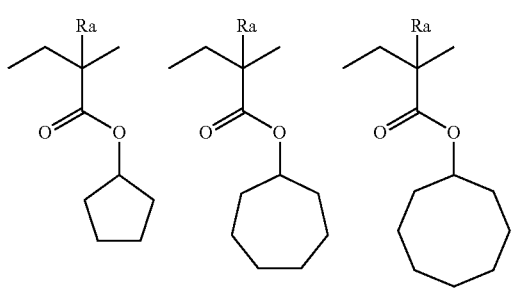
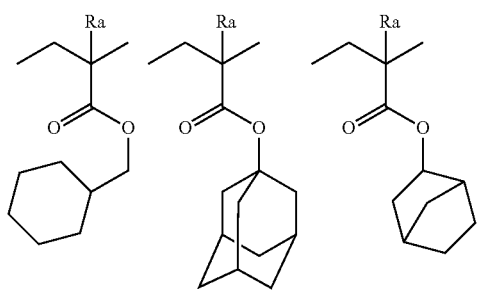
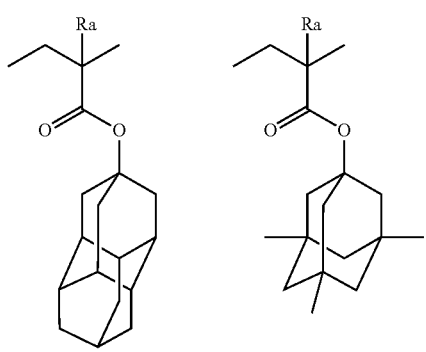
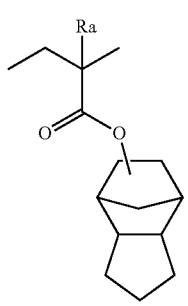

The resin (P) may contain a repeating unit represented by the following General Formula (nI) or (nII).

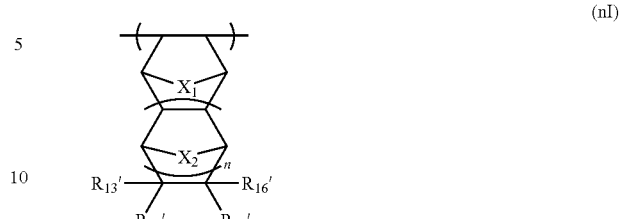

(nI)

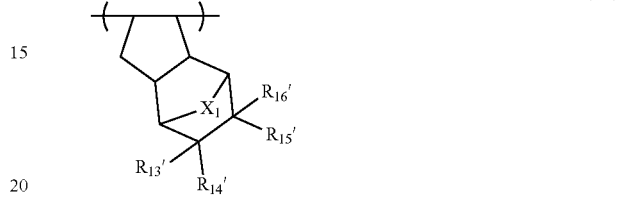

(nII)

In General Formulae (nI) and (nII), $R_{13}'$ to $R_{16}'$ each independently represent a hydrogen atom, a halogen atom, a cyano group, a hydroxyl group, a carboxyl group, an alkyl group, a cycloalkyl group, an alkoxy group, an alkoxycarbonyl group, an alkylcarbonyl group, a group having a lactone structure, or a group having an acid-decomposable group, $X_1$ and $X_2$ each independently represent a methylene group, an ethylene group, an oxygen atom, or a sulfur atom, and n represents an integer of 0 to 2.

Examples of the acid-decomposable group in the group having an acid-decomposable group as $R_{13}'$ to $R_{16}'$ include a cumyl ester group, an enol ester group, an acetal ester group, and a tertiary alkyl ester group, and the acid-decomposable group is preferably a tertiary alkyl ester group represented by —C(=O)—O—$R_0$.

In the formula, examples of $R_0$ include a tertiary alkyl group such as a t-butyl group and a t-amyl group, an isobornyl group, a 1-alkoxyethyl group such as a 1-ethoxyethyl group, a 1-butoxyethyl group, a 1-isobutoxyethyl group, and a 1-cyclohexyloxyethyl group, an alkoxymethyl group such as a 1-methoxymethyl group and a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2adamantyl group, and a mevalonic lactone residue.

At least one of $R_{13}'$, . . . , or $R_{16}'$ is preferably a group having an acid-decomposable group.

Examples of the halogen atom in $R_{13}'$ to $R_{16}'$ include a chlorine atom, a bromine atom, a fluorine atom, and an iodine atom.

The alkyl group of $R_{13}'$ to $R_{16}'$ is more preferably a group represented by the following General Formula (F1).

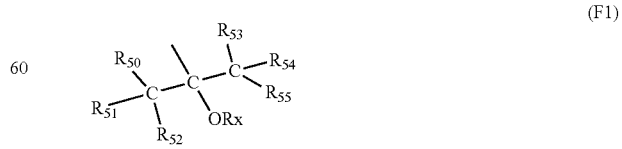

(F1)

In General Formula (F1), $R_{50}$ to $R_{55}$ each independently represent a hydrogen atom, a fluorine atom, or an alkyl group, provided that at least one of $R_{50}, \ldots,$ or $R_{55}$ represents a fluorine atom or an alkyl group having at least one hydrogen atom substituted with a fluorine atom; and Rx represents a hydrogen atom or an organic group (preferably an acid-decomposable protecting group, an alkyl group, a cycloalkyl group, an acyl group, or an alkoxycarbonyl group), and preferably a hydrogen atom.

It is preferable that all of $R_{50}$ to $R_{55}$ are fluorine atoms.

Examples of the repeating unit represented by General Formula (nI) or General Formula (nII) include the following specific examples, but the present invention is not limited to these compounds. Among those, repeating units represented by (II-f-16) to (II-f-19) are preferable.

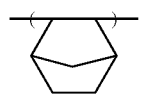 (II-a-1)

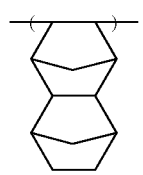 (II-a-2)

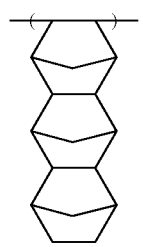 (II-a-3)

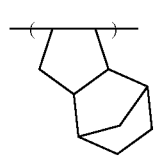 (II-a-4)

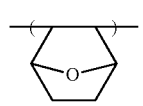 (II-a-5)

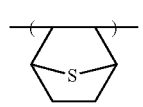 (II-a-6)

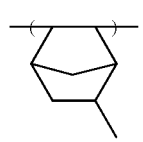 (II-a-7)

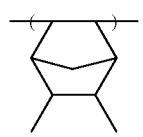 (II-a-8)

-continued

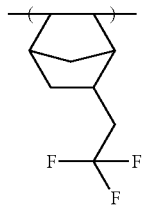 (II-a-9)

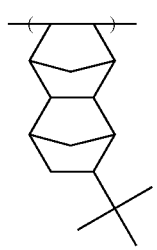 (II-a-10)

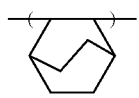 (II-a-11)

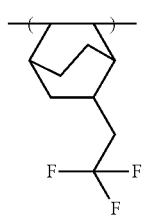 (II-a-12)

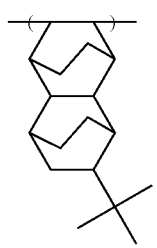 (II-a-13)

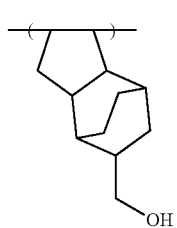 (II-a-14)

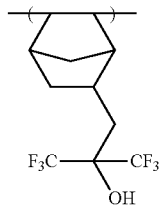 (II-b-1)

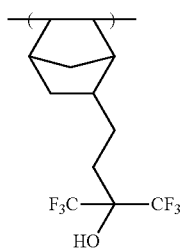 (II-b-2)
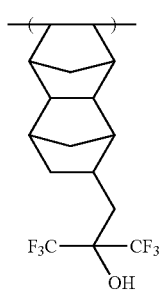 (II-b-3)
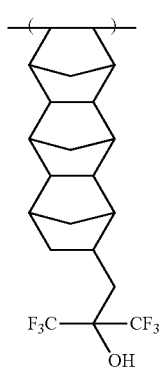 (II-b-4)
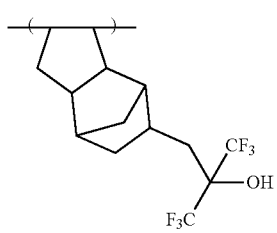 (II-b-5)
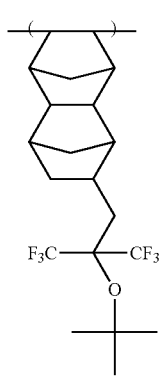 (II-b-6)
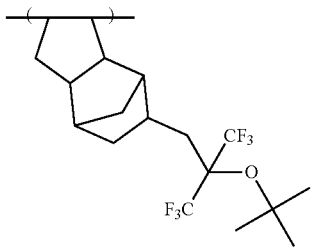 (II-b-7)
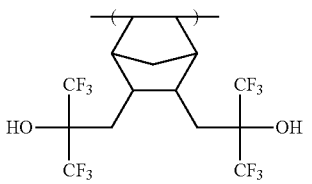 (II-b-8)
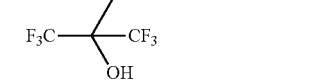 (II-b-9)
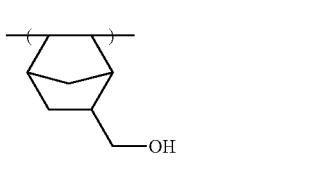 (II-c-1)
 (II-c-2)
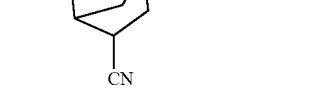 (II-c-3)
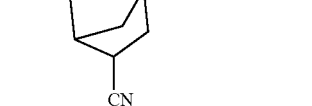 (II-c-4)
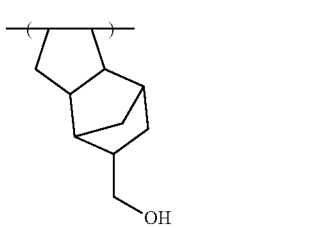 (II-c-5)

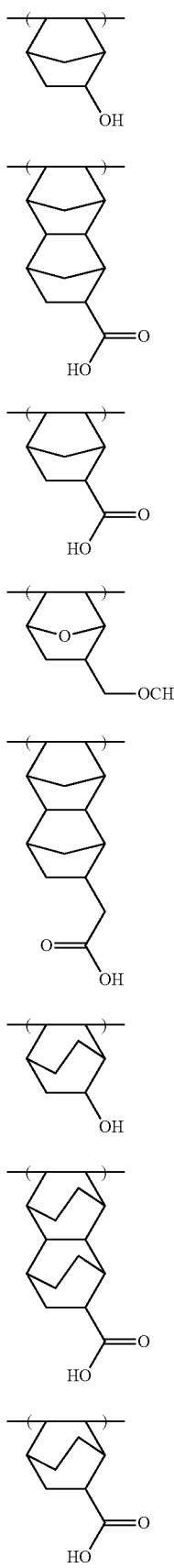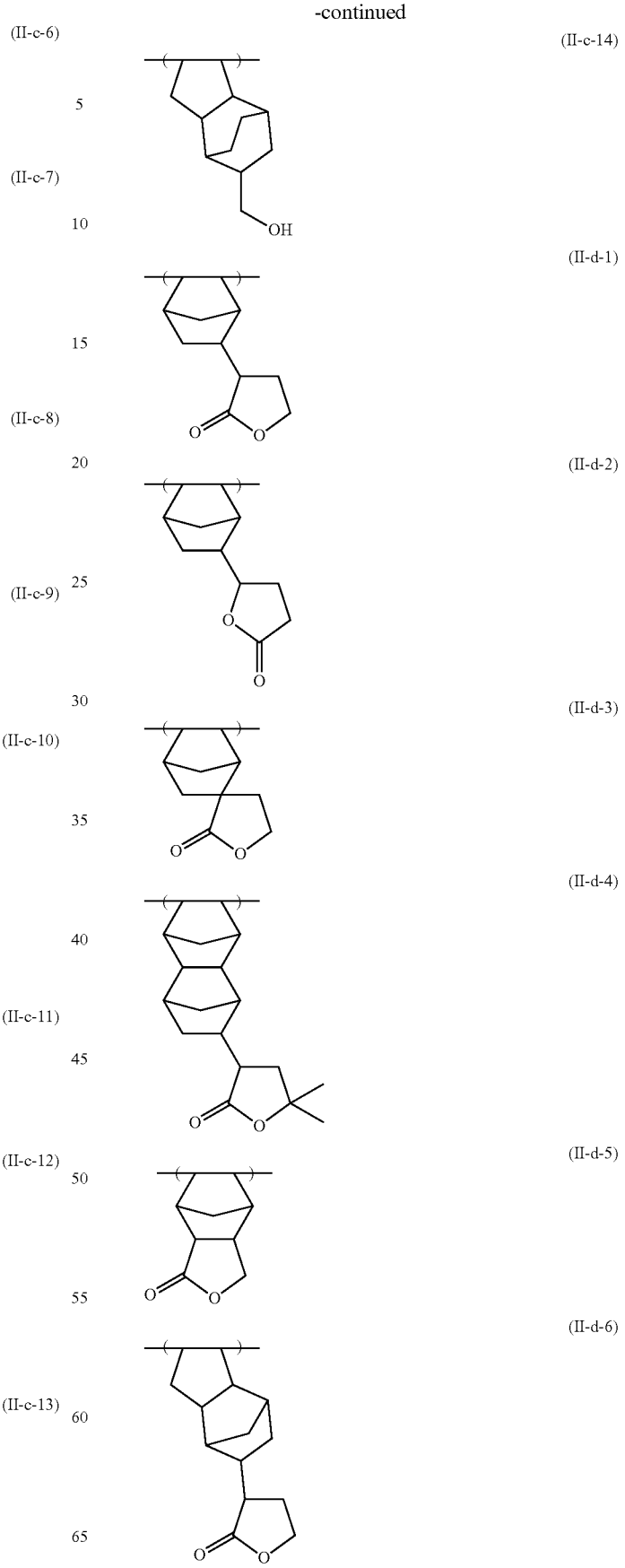

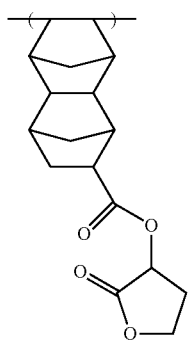 (II-d-7)
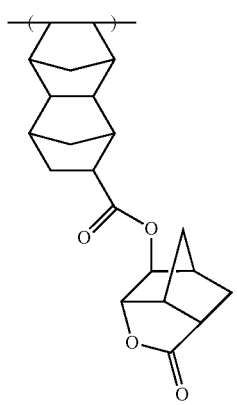 (II-d-8)
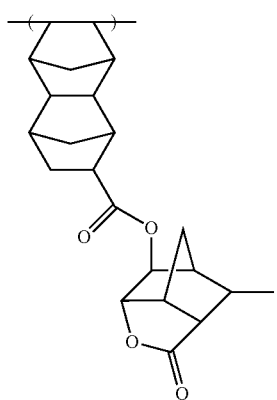 (II-d-9)
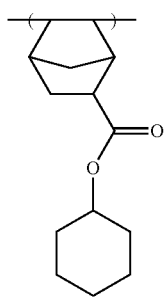 (II-e-1)
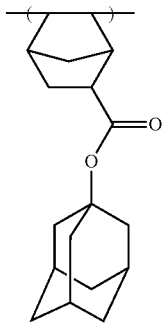 (II-e-2)
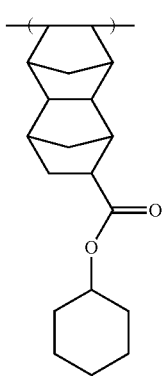 (II-e-3)
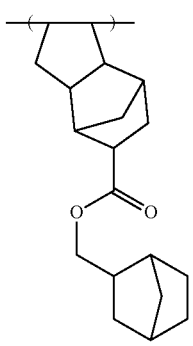 (II-e-4)
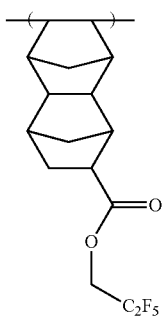 (II-e-5)
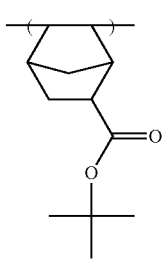 (II-f-1)

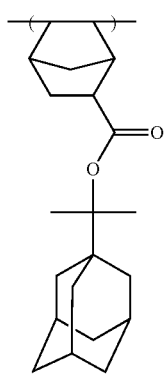 (II-f-2)
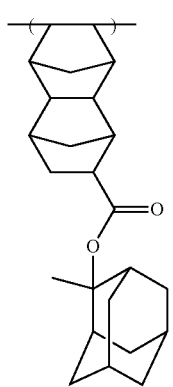 (II-f-3)
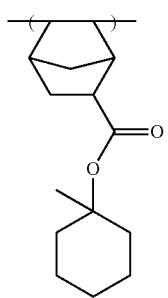 (II-f-4)
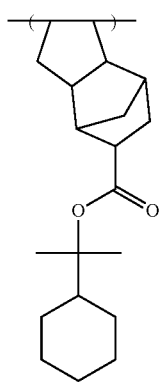 (II-f-5)
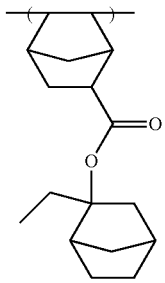 (II-f-6)
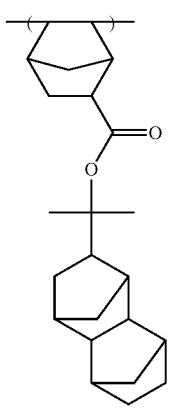 (II-f-7)
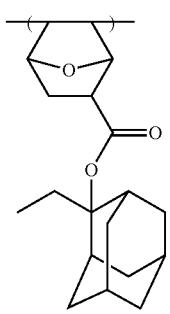 (II-f-8)
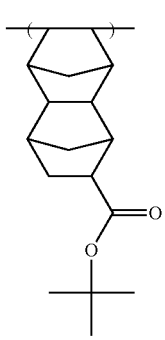 (II-f-9)

(II-f-10) 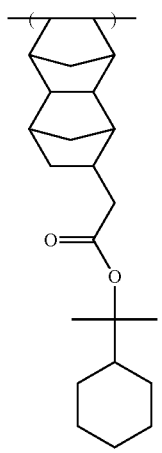
(II-f-11) 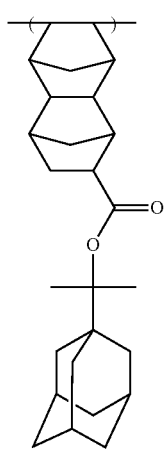
(II-f-12) 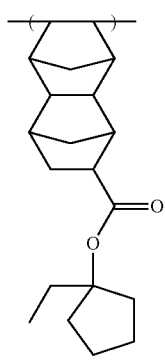
(II-f-13) 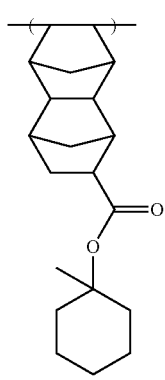
(II-f-14) 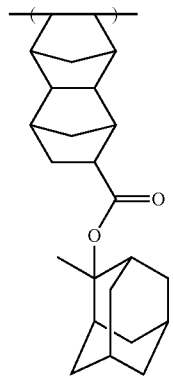
(II-f-15) 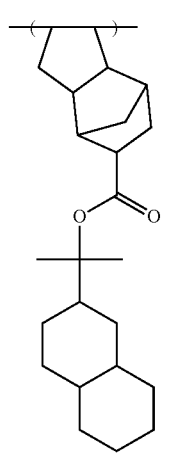
(II-f-16) 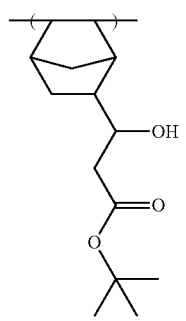
(II-f-17) 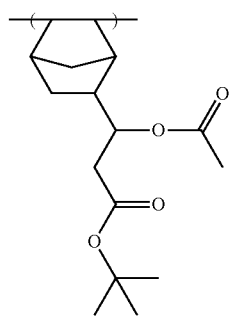

(II-f-18)

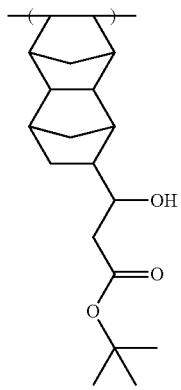

(II-f-19)

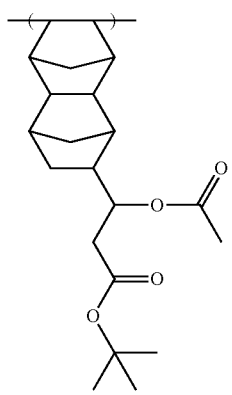

In addition to the repeating structural units, the resin (P) used in the composition of the present invention can have a variety of repeating structural units for the purpose of adjusting dry etching resistance, suitability for a standard developer, adhesion to a substrate, and a resist profile, and in addition, resolving power, heat resistance, sensitivity, and the like, which are characteristics generally required for the resist. Examples of such repeating structural units include, but are not limited to, repeating structural units corresponding to the following monomers.

Thus, it becomes possible to perform fine adjustments to performance required for the resin used in the composition of the present invention, in particular, (1) solubility in a coating solvent, (2) film-forming properties (glass transition point), (3) alkali developability, (4) film reduction (selection of hydrophilic, hydrophobic, or alkali-soluble groups), (5) adhesion of an unexposed area to a substrate, (6) dry etching resistance, and the like.

Examples of such a monomer include a compound having one addition-polymerizable unsaturated bond selected from acrylic esters, methacrylic esters, acrylamides, methacrylamides, allyl compounds, vinyl ethers, and vinyl esters.

In addition to these, an addition-polymerizable unsaturated compound that is copolymerizable with the monomers corresponding to various repeating structural units as described above may be copolymerized.

In the resin (P) used in the composition of the present invention, the molar ratio of each repeating structural unit content is appropriately set in order to adjust dry etching resistance, suitability for a standard developer, adhesion to a substrate, and a resist profile of the resist, and in addition, resolving power, heat resistance, sensitivity, and the like, each of which is performance generally required for the resist.

When the composition of the present invention is for ArF exposure, it is preferable that the resin (P) used in the composition of the present invention has substantially no aromatic groups in terms of transparency to ArF light. More specifically, the proportion of repeating units having an aromatic group in all the repeating units of the resin (P) is preferably 5% by mole or less, more preferably 3% by mole or less, and ideally 0% by mole of all the repeating units, that is, it is still more preferable that the resin (P) does not have a repeating unit having an aromatic group. In addition, it is preferable that the resin (P) has a monocyclic or polycyclic alicyclic hydrocarbon structure.

In the case of irradiating the composition of the present invention with KrF excimer laser light, electron beams, X-rays, or high-energy beams at a wavelength of 50 nm or less (for example, EUV), it is preferable that the resin (P) contains a hydroxystyrene repeating unit. The resin (P) is more preferably a copolymer of hydroxystyrene with hydroxystyrene protected with a group capable of leaving by the action of an acid, or a copolymer of hydroxystyrene with tertiary alkyl (meth)acrylate ester.

Specific examples of such a resin include a resin having a repeating unit represented by the following General Formula (A).

(A)

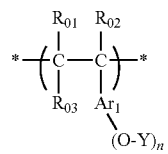

In the formula, $R_{01}$, $R_{02}$, and $R_{03}$ each independently represent, for example, a hydrogen atom, an alkyl group, a cycloalkyl group, a halogen atom, a cyano group, or an alkoxycarbonyl group. $Ar_1$ represents, for example, an aromatic ring group. Further, $R_{03}$ and $Ar_1$ are each an alkylene group, or both of them may be bonded to each other, together with a —C— chain, to form a 5- or 6-membered ring.

Y's in the number of n each independently represent a hydrogen atom or a group capable of leaving by an action of an acid, provided that at least one of Y's represents a group capable of leaving by an action of an acid.

n represents an integer of 1 to 4, and is preferably 1 or 2, and more preferably 1.

The alkyl group as $R_{01}$ to $R_{03}$ is, for example, preferably an alkyl group having 20 or less carbon atoms, preferably a methyl group, an ethyl group, a propyl group, an isopropyl group, a n-butyl group, a sec-butyl group, a hexyl group, a 2-ethylhexyl group, an octyl group, or a dodecyl group, and more preferably an alkyl group having 8 or less carbon atoms. Further, these alkyl groups may have substituents.

The alkyl group included in the alkoxycarbonyl group is preferably the same as the alkyl group in $R_{01}$ to $R_{03}$.

The cycloalkyl group may be a monocyclic cycloalkyl group or a polycyclic cycloalkyl group. Preferred examples thereof include a monocyclic cycloalkyl group having 3 to 8 carbon atoms, such as a cyclopropyl group, a cyclopentyl group, and a cyclohexyl group. Here, these cycloalkyl groups may have a substituent.

Examples of the halogen atom include a fluorine atom, a chlorine atom, a bromine atom, and an iodine atom, with the fluorine atom being more preferable.

In the case where $R_{03}$ represents an alkylene group, preferred examples of the alkylene group include ones having 1 to 8 carbon atoms, such as a methylene group, an ethylene group, a propylene group, a butylene group, a hexylene group, and an octylene group.

The aromatic ring group as $Ar_1$ is preferably one having 6 to 14 carbon atoms, and examples thereof include a benzene ring group, a toluene ring group, and a naphthalene ring group. Here, these aromatic ring groups may have a substituent.

Examples of the group Y capable of leaving by an action of an acid include a group represented by —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$), or —CH($R_{36}$)(Ar).

In the formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring structure.

$R_{01}$ and $R_{02}$ each independently represent a hydrogen atom, an alkyl group, a cycloalkyl group, an aryl group, an aralkyl group, or an alkenyl group.

Ar represents an aryl group.

As the alkyl group as $R_{36}$ to $R_{39}$, $R_{01}$, or $R_{02}$, an alkyl group having 1 to 8 carbon atoms is preferable and examples thereof include a methyl group, an ethyl group, a propyl group, a n-butyl group, a sec-butyl group, a hexyl group, and an octyl group.

A cycloalkyl group as $R_{36}$ to $R_{39}$, $R_{01}$, or $R_{02}$ may be a monocyclic cycloalkyl group or a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinanyl group, a tricyclodecanyl group, a tetracyclododecyl group, and an androstanyl group. Further, some of the carbon atoms in the cycloalkyl group may be substituted with hetero atoms such as an oxygen atom.

An aryl group as $R_{36}$ to $R_{39}$, $R_{01}$, $R_{02}$, or Ar is preferably an aryl group having 6 to 10 carbon atoms and examples thereof include a phenyl group, a naphthyl group, and an anthryl group.

An aralkyl group as $R_{36}$ to $R_{39}$, $R_{01}$, or $R_{02}$ is preferably an aralkyl group having 7 to 12 carbon atoms and for example, a benzyl group, a phenethyl group, and a naphthylmethyl group are preferable.

An alkenyl group as $R_{36}$ to $R_{39}$, $R_{01}$, or $R_{02}$ is preferably an alkenyl group having 2 to 8 carbon atoms and examples thereof include a vinyl group, an allyl group, a butenyl group, and a cyclohexenyl group.

A ring which can be formed by the mutual bonding of $R_{36}$ and $R_{37}$ may be monocyclic or may be polycyclic. As the monocyclic ring, a cycloalkane structure having 3 to 8 carbon atoms is preferable, and examples thereof include a cyclopropane structure, a cyclobutane structure, a cyclopentane structure, a cyclohexane structure, a cycloheptane structure, and a cyclooctane structure. As the polycyclic ring, a cycloalkane structure having 6 to 20 carbon atoms is preferable, and examples thereof include an adamantane structure, a norbornane structure, a dicyclopentane structure, a tricyclodecane structure, and a tetracyclododecane structure. Further, some of the carbon atoms in the ring structure may be substituted with hetero atoms such as an oxygen atom.

Each of the groups described above may have a substituent. Examples of the substituent include an alkyl group, a cycloalkyl group, an aryl group, an amino group, an amide group, an ureido group, an urethane group, a hydroxyl group, a carboxyl group, a halogen atom, an alkoxy group, a thioether group, an acyl group, an acyloxy group, an alkoxycarbonyl group, a cyano group, and a nitro group. These substituents preferably have 8 or less carbon atoms.

As a group Y capable of leaving by an action of an acid, a structure represented by the following General Formula (B) is more preferable.

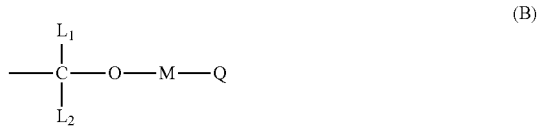

In the formula, $L_1$ and $L_2$ each independently represent a hydrogen atom, an alkyl group, a cycloalkyl group, an aryl group, or an aralkyl group, M represents a single bond or a divalent linking group, and Q represents an alkyl group, a cycloalkyl group, a cyclic aliphatic group, an aromatic ring group, an amino group, an ammonium group, a mercapto group, a cyano group, or an aldehyde group. Further, these cyclic aliphatic groups and aromatic ring groups may include hetero atoms.

Furthermore, at least two of Q, M, or $L_1$ may be bonded to each other to form a 5- or 6-membered ring.

An alkyl group as $L_1$ and $L_2$ is, for example, an alkyl group having 1 to 8 carbon atoms, and specific examples thereof include a methyl group, an ethyl group, a propyl group, a n-butyl group, a sec-butyl group, a hexyl group, and an octyl group.

A cycloalkyl group as $L_1$ and $L_2$ is, for example, a cycloalkyl group having 3 to 15 carbon atoms, and specific examples thereof include a cyclopentyl group, a cyclohexyl group, a norbornyl group, and an adamantyl group.

An aryl group as $L_1$ and $L_2$ is, for example, an aryl group having 6 to 15 carbon atoms, and specific examples thereof include a phenyl group, a tolyl group, a naphthyl group, and an anthryl group.

An aralkyl group as $L_1$ and $L_2$ is, for example, an aralkyl group having 6 to 20 carbon atoms, and specific examples thereof include a benzyl group and a phenethyl group.

A divalent linking group as M is, for example, an alkylene group (for example, a methylene group, an ethylene group, a propylene group, a butylene group, a hexylene group, or an octylene group), a cycloalkylene group (for example, a cyclopentylene group or a cyclohexylene group), an alkenylene group (for example, an ethenylene group, a propenylene group, or a butenylene group), an arylene group (for example, a phenylene group, a tolylene group, or a naphthylene group), —S—, —O—, —CO—, —SO$_2$—, —N($R_0$)—, and a combination of two or more thereof. Here, $R_0$ is a hydrogen atom or an alkyl group. The alkyl group as $R_0$ is, for example, an alkyl group having 1 to 8 carbon atoms, and specific examples thereof include a methyl group, an ethyl group, a propyl group, a n-butyl group, a sec-butyl group, a hexyl group, and an octyl group.

The alkyl group and the cycloalkyl group as Q are the same as each group as $L_1$ and $L_2$ described above.

Examples of the cyclic aliphatic group or the aromatic ring group as Q include the cycloalkyl group and the aryl group as $L_1$ and $L_2$ described above. The cycloalkyl group and the aryl group are preferably groups having 3 to 15 carbon atoms.

Examples of the cyclic aliphatic group or the aromatic ring group, including a hetero atom, as Q include groups such as thiirane, cyclothiolane, thiophene, furan, pyrrole, benzothiophene, benzofuran, benzopyrrole, triazine, imidazole, benzimidazole, triazole, thiadiazole, thiazole, pyrrolidone, and the like which have a heterocyclic structure. However, the cyclic aliphatic group or the aromatic ring group is not limited thereto as long as it is a ring which is formed by carbon and hetero atoms or a ring which is formed by only hetero atoms.

Examples of a ring structure which at least two of Q, M, or $L_1$ may form by being bonded to each other include a 5- or 6-membered ring structure which is formed by these forming a propylene group or a butylene group. Here, the 5- or 6-membered ring structure contains an oxygen atom.

Each of the groups represented by $L_1$, $L_2$, M, and Q in General Formula (B) may have a substituent. Examples of the substituent include an alkyl group, a cycloalkyl group, an aryl group, an amino group, an amide group, an ureido group, an urethane group, a hydroxyl group, a carboxyl group, a halogen atom, an alkoxy group, a thioether group, an acyl group, an acyloxy group, an alkoxycarbonyl group, a cyano group, and a nitro group. The substituents preferably have 8 or less carbon atoms.

As a group represented by -(M-Q), a group having 1 to 20 carbon atoms is preferable, a group having 1 to 10 carbon atoms is more preferable, and a group having 1 to 8 carbon atoms is still more preferable.

Furthermore, it is preferable that the resin (P) contains neither a fluorine atom nor a silicon atom from the viewpoint of compatibility with a hydrophobic resin (D) which will be described later.

The resin (P) used in the composition of the present invention is preferably a resin in which all the repeating units are composed of (meth)acrylate-based repeating units. In this case, any one of a resin in which all the repeating units are methacrylate-based repeating units, a resin in which all the repeating units are acrylate-based repeating units, or a resin in which all the repeating units are composed of methacrylate-based repeating units and acrylate-based repeating units can be used, but the acrylate-based repeating units preferably accounts for 50% by mole or less with respect to all the repeating units. Further, a copolymerization polymer including 20% by mole to 50% by mole of a (meth)acrylate-based repeating unit having an acid-decomposable group, 20% by mole to 50% by mole of a (meth) acrylate-based repeating unit having a lactone group, and 5% by mole to 30% by mole of a (meth)acrylate-based repeating unit having an alicyclic hydrocarbon structure substituted with a hydroxyl group or cyano group, and in addition to these, 0% by mole to 20% by mole of other (meth)acrylate-based repeating units are also preferable.

The resin (P) in the present invention can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 hour to 10 hours, with the dropwise addition polymerization method being preferable. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and a solvent which dissolves the composition of the present invention, such as propylene glycol monomethyl ether acetate, propylene glycol monomethyl ether, and cyclohexanone, which will be described later. It is more preferable to perform polymerization using the same solvent as the solvent used in the composition of the present invention. Thus, generation of the particles during storage can be inhibited.

It is preferable that the polymerization reaction is carried out in an inert gas atmosphere such as nitrogen and argon. As the polymerization initiator, commercially available radical initiators (an azo-based initiator, peroxide, or the like) are used to initiate the polymerization. As the radical initiator, an azo-based initiator is preferable, and the azo-based initiator having an ester group, a cyano group, or a carboxyl group is preferable. Preferable initiators include azobisisobutyronitrile, azobisdimethylvaleronitrile, dimethyl 2,2'-azobis(2-methyl propionate), or the like. The initiator is added or added in portionwise, as desired, a desired polymer is recovered after the reaction is completed, the reaction mixture is poured into a solvent, and then a method such as powder or solid recovery is used. The concentration of the reactant is 5% by mass to 50% by mass and preferably 10% by mass to 30% by mass. The reaction temperature is normally 10° C. to 150° C., preferably 30° C. to 120° C., and more preferably 60° C. to 100° C.

The weight-average molecular weight of the resin (P) of the present invention is preferably 1,000 to 200,000, more preferably 2,000 to 20,000, still more preferably 3,000 to 15,000, and particularly preferably 3,000 to 11,000 as a polystyrene-value by means of GPC. By setting the weight-average molecular weight to 1,000 to 200,000, it is possible to prevent the deterioration of heat resistance or dry etching resistance, and also prevent the deterioration of film forming properties due to deterioration of developability or increased viscosity.

The dispersity (molecular weight distribution) to be used is usually in the range of 1.0 to 3.0, preferably 1.0 to 2.6, more preferably 1.0 to 2.0, and particularly preferably 1.1 to 2.0. The smaller the molecular weight distribution is, the better the resolution and the resist shape are, the smoother the side wall of the resist pattern is, and the better roughness is.

The content of the resin (P) in the entire composition is preferably 30% by mass to 99% by mass, and more preferably 50% by mass to 95% by mass, with respect to the total solid contents.

Furthermore, the resin (P) may be used alone or in combination of two or more kinds thereof.

[2] Compound Capable of Generating Acid upon Irradiation with Active Light or Radiation The composition of the present invention preferably further contains a compound (B) capable of generating an acid upon irradiation with active light or radiation (hereinafter also referred to as an "acid generator" or a "compound (B)"). As the compound (B) capable of generating an acid upon irradiation with active light or radiation, a compound capable of generating an organic acid upon irradiation with active light or radiation is preferable. Further, the compound (B) may be included in the aforementioned resin (P). More specifically, the compound (B) may be linked to the resin (P) via a chemical bond.

The compound (B) may be in a form of a low-molecular-weight compound or a form in which the compound (B) is introduced into a part of a polymer. Further, a combination of the form of a low-molecular-weight compound and the form in which the compound (B) is introduced into a part of a polymer may also be used.

In the case where the compound (B) is in the form of a low-molecular-weight compound, the molecular weight is preferably 3,000 or less, more preferably 2,000 or less, and still more preferably 1,000 or less.

In the case where the compound (B) is in the form in which the compound (B) is introduced into a part of a polymer, it may be introduced into a part of the aforementioned resin (P) or into a resin other than the resin (P). Specific examples of the case where the compound (B) is in the form in which the compound (B) is introduced into a part of a polymer include those described in, for example, paragraphs "0191" to "0209" of JP2013-54196A.

The acid generator which can be used may be appropriately selected from a photoinitiator for cationic photopolymerization, a photoinitiator for radical photopolymerization, a photodecoloring agent for dyes, a photodiscoloring agent, a known compound capable of generating an acid upon irradiation with active light or radiation, which is used for a microresist or the like, and a mixture thereof.

Examples of the acid generator include a diazonium salt, a phosphonium salt, a sulfonium salt, an iodonium salt, imidosulfonate, oxime sulfonate, diazodisulfone, disulfone, and o-nitrobenzyl sulfonate.

Preferred examples of the compounds among the acid generators include compounds represented by the following General Formulae (ZI), (ZII), and (ZIII).

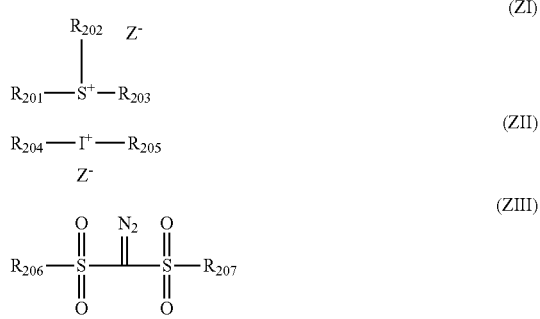

In General Formula (ZI), $R_{201}$, $R_{202}$, and $R_{203}$ each independently represent an organic group, the number of carbon atoms of the organic group as $R_{201}$, $R_{202}$, and $R_{203}$ is generally 1 to 30, and preferably 1 to 20, two of $R_{201}$ to $R_{203}$ may be bonded to each other to form a ring structure, the ring may include an oxygen atom, a sulfur atom, an ester bond, an amide bond, or a carbonyl group, and examples of the group formed by the mutual bonding of two of $R_{201}$ to $R_{203}$ include an alkylene group (for example, a butylene group and a pentylene group), and $Z^-$ represents a non-nucleophilic anion.

Examples of the non-nucleophilic anion as $Z^-$ include a sulfonic acid anion, a carboxylic acid anion, a sulfonylimide anion, a bis(alkylsulfonyl)imide anion, and a tris(alkylsulfonyl)methide anion.

The non-nucleophilic anion is an anion having an extremely low ability of causing a nucleophilic reaction and this anion can suppress the decomposition with aging due to an intramolecular nucleophilic reaction. With this anion, the stability over time of the composition is improved.

Examples of the sulfonic acid anion include an aliphatic sulfonic acid anion, an aromatic sulfonic acid anion, and a camphorsulfonic acid anion.

Examples of the carboxylic acid anion include an aliphatic carboxylic acid anion, an aromatic carboxylic acid anion, and an aralkylcarboxylic acid anion.

The aliphatic moiety in the aliphatic sulfonic acid anion and the aliphatic carboxylic acid anion may be an alkyl group, or a cycloalkyl group, and preferred examples thereof include an alkyl group having 1 to 30 carbon atoms or a cycloalkyl group having 3 to 30 carbon atoms and preferred examples of the aromatic group in the aromatic sulfonic acid anion and the aromatic carboxylic acid anion include an aryl group having 6 to 14 carbon atoms, for example, a phenyl group, a tolyl group, and a naphthyl group.

The alkyl group, the cycloalkyl group, and the aryl group in the aliphatic sulfonic acid anion and the aromatic sulfonic acid anion may have a substituent.

Examples of other non-nucleophilic anions include fluorinated phosphorus (for example, $PF_6^-$), fluorinated boron (for example, $BF_4^-$), and fluorinated antimony (for example, $SbF_6^-$).

The non-nucleophilic anion of $Z^-$ is preferably an aliphatic sulfonic acid anion substituted with a fluorine atom at least at the α-position of sulfonic acid, an aromatic sulfonic acid anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonic acid anion having 4 to 8 carbon atoms or a benzenesulfonic acid anion having a fluorine atom, and still more preferably a nonafluorobutanesulfonic acid anion, a perfluorooctanesulfonic acid anion, a pentafluorobenzenesulfonic acid anion, or a 3,5-bis(trifluoromethyl)benzenesulfonic acid anion.

The acid generator is preferably a compound capable of generating an acid represented by the following General Formula (IIIB) or (IVB) upon irradiation with active light or radiation. Since the compound is a compound capable of generating an acid represented by the following General Formula (IIIB) or (IVB), a cyclic organic group is contained, and thus, resolution and roughness performance can be further improved.

As the non-nucleophilic anion, an anion capable of generating an organic acid represented by the following General Formula (TIM) or (IVB) can be used.

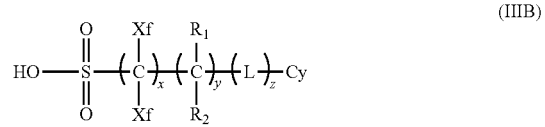

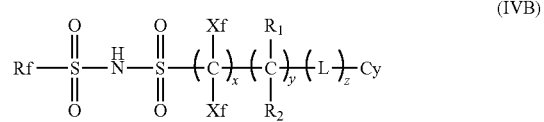

In the general formulae,

Xf's each independently represent a fluorine atom or an alkyl group substituted with at least one fluorine atom, $R_1$ and $R_2$ each independently represent a hydrogen atom or an alkyl group, L's each independently represent a divalent linking group, Cy represents a cyclic organic group, Rf represents a group including a fluorine atom, x represents an integer of 1 to 20, y represents an integer of 0 to 10, and z represents an integer of 0 to 10.

Xf represents a fluorine atom or an alkyl group substituted with at least one fluorine atom. The number of carbon atoms of the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. It is particularly preferable that both Xf's are fluorine atoms.

$R_1$ and $R_2$ each independently represent a hydrogen atom or an alkyl group.

The alkyl group of $R_1$ and $R_2$ may have a substituent, and is preferably an alkyl group having 1 to 4 carbon atoms. $R_1$ and $R_2$ are preferably a hydrogen atom.

L represents a divalent linking group. Examples of the divalent linking group include —COO—, —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 10 carbon atoms), an alkenylene group (preferably having 2 to 6 carbon atoms), and a divalent linking group formed by combination of a plurality of these members. Among these, —COO—, —OCO—, —CONH—, —NHCO—, —CO—, —O—, —$SO_2$—, —COO-alkylene group-, —OCO-alkylene group-, —CONH-alkylene group-, or —NHCO-alkylene group- is preferable, and —COO-, —OCO—, —CONH—, —$SO_2$—, —COO-alkylene group-, or —OCO-alkylene group- is more preferable.

Cy represents a cyclic organic group. Examples of the cyclic organic group include an alicyclic group, an aryl group, and a heterocyclic group.

The alicyclic group may be monocyclic or polycyclic. Examples of the monocyclic alicyclic group include a monocyclic cycloalkyl group such as a cyclopentyl group, a cyclohexyl group, and a cyclooctyl group. Examples of the polycyclic alicyclic group include a polycyclic cycloalkyl group such as a norbornyl group, a tricyclodecanyl group, a tetracyclodecanyl group, a tetracyclododecanyl group, and an adamantyl group. Among these, an alicyclic group having a bulky structure with 7 or more carbon atoms, such as a norbornyl group, a tricyclodecanyl group, a tetracyclodecanyl group, a tetracyclododecanyl group, and an adamantyl group, is preferable from the viewpoints of inhibiting the in-film diffusion in a post-exposure baking (PEB) step and improving the mask error enhancement factor (MEEF).

The aryl group may be monocyclic or polycyclic. Examples of the aryl group include a phenyl group, a naphthyl group, a phenanthryl group, and an anthryl group. Among these, a naphthyl group having a relatively low absorbance at 193 nm is preferable.

The heterocyclic group may be monocyclic or polycyclic, but with a polycyclic heterocyclic group, the diffusion of an acid can further be inhibited. In addition, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having aromaticity include a tetrahydropyran ring, a lactone ring, a sultone ring, and a decahydroisoquinoline ring. The heterocycle in the heterocyclic group is particularly preferably a furan ring, a thiophene ring, a pyridine ring, or a decahydroisoquinoline ring. Examples of the lactone ring or sultone ring include lactone structures or sultone structures exemplified in the resin (P) as mentioned above.

The cyclic organic group as described above may have a substituent, and examples of the substituent include an alkyl group (which may be linear or branched, and preferably has 1 to 12 carbon atoms), a cycloalkyl group (may be monocyclic, polycyclic, or spirocyclic, preferably having 3 to 20 carbon atoms), an aryl group (preferably having 6 to 14 carbon atoms), a hydroxyl group, an alkoxy group, an ester group, an amide group, a urethane group, a ureido group, a thioether group, a sulfonamide group, and a sulfonic ester group. Incidentally, the carbon constituting the cyclic organic group (the carbon contributing to ring formation) may be carbonyl carbon.

x is preferably 1 to 8, more preferably 1 to 4, and particularly preferably 1. y is preferably 0 to 4, and more preferably 0. z is preferably 0 to 8, more preferably 0 to 4, and still more preferably 1.

Examples of the group including a fluorine atom, represented by Rf, include an alkyl group having at least one fluorine atom, a cycloalkyl group having at least one fluorine atom, and an aryl group having at least one fluorine atom.

The alkyl group, a cycloalkyl group, and aryl group may be substituted with a fluorine atom or may be substituted with another substituent including a fluorine atom. In the case where Rf is a cycloalkyl group having at least one fluorine atom or an aryl group having at least one fluorine atom, examples of other such substituents including a fluorine atom include an alkyl group substituted with at least one fluorine atom.

Moreover, the alkyl group, a cycloalkyl group, and aryl group may further be substituted with a substituent not including a fluorine atom. Examples of this substituent include ones not including a fluorine atom out of those described above for Cy.

Examples of the alkyl group having at least one fluorine atom, represented by Rf, are the same as ones described above as the alkyl group substituted with at least one fluorine atom represented by Xf. Examples of the cycloalkyl group having at least one fluorine atom, represented by Rf, include a perfluorocyclopentyl group and a perfluorocyclohexyl group. Examples of the aryl group having at least one fluorine atom represented by Rf include a perfluorophenyl group.

In the general formulae, a particularly preferred aspect is an aspect in which x is 1, two Xf s are fluorine atoms, y is 0 to 4, both of $R_1$ and $R_2$ are hydrogen atoms, and z is 1. In such an aspect, the group has a small number of fluorine atoms and is hard to be distributed unevenly on the surface during formation of a resist film, and thus, is easily dispersed in the resist film.

Examples of the organic group represented by $R_{201}$, $R_{202}$, and $R_{203}$ include corresponding groups in the compounds (ZI-1), (ZI-2), (ZI-3), and (ZI-4) which will be described later.

Incidentally, the compound may be a compound having a plurality of structures represented by General Formula (ZI). For example, the compound may be a compound having a structure in which at least one of $R_{201}$, . . . , or $R_{203}$ in a compound represented by General Formula (ZI) is bonded to at least one of $R_{201}$, . . . , or $R_{203}$ in another compound represented by General Formula (ZI) through a single bond or a linking group.

More preferred examples of the components (ZI) include the compounds (ZI-1), (ZI-2), (ZI-3), and (ZI-4) which will be described below.

First, the compound (ZI-1) will be described.

The compound (ZI-1) is an arylsulfonium compound in which at least one of $R_{201}, \ldots,$ or $R_{203}$ in General Formula (ZI) is an aryl group, that is, a compound having arylsulfonium as the cation.

In the arylsulfonium compound, all of $R_{201}$ to $R_{203}$ may be an aryl group, or a part of $R_{201}$ to $R_{203}$ may be an aryl group, with the remainder being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group in the arylsulfonium compound, a phenyl group or a naphthyl group is preferable, and a phenyl group is more preferable. The aryl group may be an aryl group having a heterocyclic structure containing an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same as or different from each other.

The alkyl group or the cycloalkyl group which may be contained in the arylsulfonium compound, if desired, is preferably a linear or branched alkyl group having 1 to 15 carbon atoms or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of $R_{201}$ to $R_{203}$ may have, as the substituent, an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group.

Next, the compound (ZI-2) will be described.

The compound (ZI-2) is a compound in which $R_{201}$ to $R_{203}$ in Formula (ZI) each independently represent an organic group not having an aromatic ring. The aromatic ring as used herein encompasses an aromatic ring containing a hetero atom.

The organic group not having an aromatic ring as $R_{201}$ to $R_{203}$ has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

$R_{201}$ to $R_{203}$ may further be substituted with a halogen atom, an alkoxy group (for example, having 1 to 5 carbon atoms), a hydroxyl group, a cyano group, and a nitro group.

Next, the compound (ZI-3) will be described.

The compound (ZI-3) is a compound represented by the following General Formula (ZI-3), having a phenacylsulfonium salt structure.

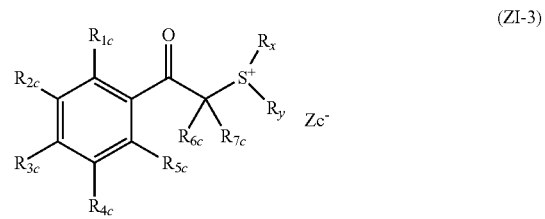

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group, $R_{6c}$ and $R_{7c}$ each independently represent a hydrogen atom, an alkyl group, a cycloalkyl group, a halogen atom, a cyano group, or an aryl group, and $R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more members out of $R_{1c}$ to $R_{5c}$, $R_{5c}$ and $R_{6c}$, $R_{6c}$ and $R_{7c}$, $R_{5c}$ and $R_x$, or $R_x$ and $R_y$ may be respectively bonded to each other to form a ring structure, and this ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocycle, and a polycyclic fused ring formed by combination of two or more members out of these rings. Examples of the ring structure include 3-to 10-membered rings, with 4-to 8-membered rings being preferable, and 5- or 6-membered rings being more preferable.

Examples of the group formed by combination of any two or more members out of $R_{1c}$ to $R_{5c}$, a pair of $R_{6c}$ and $R_{7c}$, or a pair of $R_x$ and $R_y$ include a butylene group, and a pentylene group.

The group formed by combination of a pair of $R_{5c}$ and $R_{6c}$, or a pair of $R_{5c}$ and $R_x$ is preferably a single bond or an alkylene group, and examples of the alkylene group include a methylene group and an ethylene group.

$Z_c^-$ represents a non-nucleophilic anion, and examples thereof include the same ones as the non-nucleophilic anions of $Z^-$ in General Formula (ZI).

Specific examples of the alkoxy group in the alkoxycarbonyl group as $R_{1c}$ to $R_{5c}$ are the same as the specific examples of the alkoxy group as $R_{1c}$ to $R_{5c}$ above.

Specific examples of the alkyl group in the alkylcarbonyloxy group and the alkylthio group as $R_{1c}$ to $R_{5c}$ are the same as the specific examples of the alkyl group as $R_{1c}$ to $R_{5c}$ above.

Specific examples of the cycloalkyl group in the cycloalkylcarbonyloxy group as $R_{1c}$ to $R_{5c}$ are the same as the specific examples of the cycloalkyl group as $R_{1c}$ to $R_{5c}$ above.

Specific examples of the aryl group in the aryloxy group and the arylthio group as $R_{1c}$ to $R_{5c}$ are the same as the specific examples of the aryl group as $R_{1c}$ to $R_{5c}$ above.

Examples of the cation in the compound (ZI-2) or (ZI-3) in the present invention include the cations described after paragraph "0036" in the specification of US2012/0076996A.

Next, the compound (ZI-4) will be described.

The compound (ZI-4) is represented by the following General Formula (ZI-4).

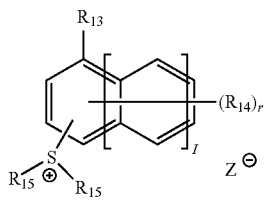

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group, and these groups may have a substituent, in the case where $R^{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group, and these groups may have a substituent, $R_{15}$'s each independently represent an alkyl group, a cycloalkyl group, or a naphthyl group, these groups may have a substituent, two $R_{15}$'s may be bonded to each other to form a ring, and when two $R_{15}$'s are bonded to each other to form a ring, the ring skeleton may include a hetero atom such as an oxygen atom and a nitrogen atom; and in an aspect, two $R_{15}$'s are alkylene groups, and are preferably bonded to each other to form a ring structure, l represents an integer of 0 to 2, r represents an integer of 0 to 8, and $Z^-$ represents a non-nucleophilic anion, and examples thereof include the same ones as the nucleophilic anions of $Z^-$ in General Formula (ZI).

In General Formula (ZI-4), the alkyl groups of $R_{13}$, $R_{14}$, and $R_{15}$ are linear or branched, and they are preferably those having 1 to 10 carbon atoms, and more preferably a methyl group, an ethyl group, an n-butyl group, a t-butyl group, or the like.

Examples of the cation represented by General Formula (ZI-4) in the present invention include the cations described in paragraphs "0121", "0123", and "0124" of JP2010-256842A, paragraphs "0127", "0129", and "0130" of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may be an aryl group having a heterocyclic structure containing an oxygen atom, a nitrogen atom, a sulfur atom, or the like. Examples of the framework of the aryl group having a heterocyclic structure include pyrrole, furan, thiophene, indole, benzofuran, and benzothiophene.

The alkyl group and the cycloalkyl group with respect to $R_{204}$ to $R_{207}$ are preferably a linear or branched alkyl group having 1 to 10 carbon atoms (for example, a methyl group, an ethyl group, a propyl group, a butyl group, and a pentyl group) and a cycloalkyl group having 3 to 10 carbon atoms (for example, a cyclopentyl group, a cyclohexyl group, and a norbornyl group).

The aryl group, the alkyl group, and the cycloalkyl group of $R_{204}$ to $R_{207}$ may have a substituent, and examples of the substituent which the aryl group, an alkyl group and cycloalkyl group of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples thereof include the same ones as the non-nucleophilic anions of $Z^-$ in General Formula (ZI).

Other examples of the acid generator include compounds represented by the following General Formulae (ZIV), (ZV), and (ZVI).

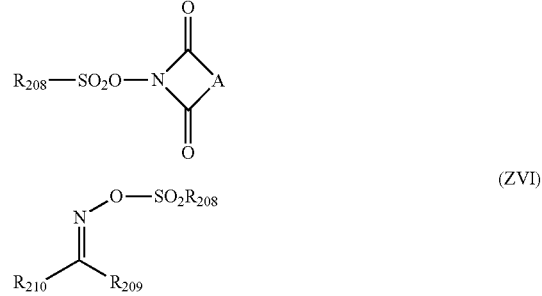

In General Formulae (ZIV) to (ZVI), $Ar_3$ and $Ar_4$ each independently represent an aryl group, $R_{208}$, $R_{209}$, and $R_{210}$ each independently represent an alkyl group, a cycloalkyl group, or an aryl group, and A represents an alkylene group, an alkenylene group, or an arylene group.

Specific examples of the aryl group of $Ar_3$, $Ar_4$, $R_{208}$, $R_{209}$, and $R_{210}$ include the same ones as the specific examples of the aryl group of $R_{201}$, $R_{202}$, and $R_{203}$ in General Formula (ZI-1).

Specific examples of the alkyl group and the cycloalkyl group of $R_{208}$, $R_{209}$, and $R_{210}$ include the same ones as the specific examples of the alkyl group and the cycloalkyl group of $R_{201}$, $R_{202}$, and $R_{203}$ in General Formula (ZI-2).

Examples of the alkylene group of A include alkylene group having 1 to 12 carbon atoms (for example, a methylene group, an ethylene group, a propylene group, an isopropylene group, a butylene group, and an isobutylene group), examples of the alkenylene group of A include an alkenylene group having 2 to 12 carbon atoms (for example, an ethenylene group, a propenylene group, and a butenylene group), and examples of the arylene group of A include an arylene group having 6 to 10 carbon atoms (for example, a phenylene group, a tolylene group, and a naphthylene group).

Among the acid generators, particularly preferred examples thereof include the compounds exemplified in "0143" of US2012/0207978A1.

The acid generator can be synthesized by a known method, and can be synthesized in accordance with, for example, the method described in JP2007-161707A.

The acid generators may be used alone or in combination of two or more kinds thereof.

The content (the total content in the case where the compounds (B) are present in plural numbers) of the compound (B) in the composition is preferably 0.1% by mass to 30% by mass, more preferably 0.5% by mass to 25% by mass, still more preferably 3% by mass to 20% by mass, and particularly preferably 3% by mass to 15% by mass, with respect to the total solid content of the composition.

Incidentally, in the case where the acid generator is represented by General Formula (ZI-3) or (ZI-4), the content thereof (the total content in the case where the acid generators are present in plural numbers) is preferably 5% by mass to 35% by mass, more preferably 8% by mass to 30% by mass, still more preferably 9% by mass to 30% by mass, and particularly preferably 9% by mass to 25% by mass, with respect to the total solid content of the composition.

Specific examples of the acid generator are shown below, but the present invention is not limited thereto.

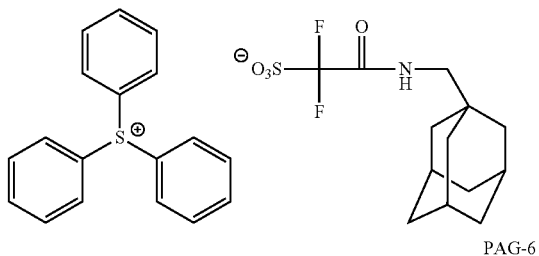

PAG-1

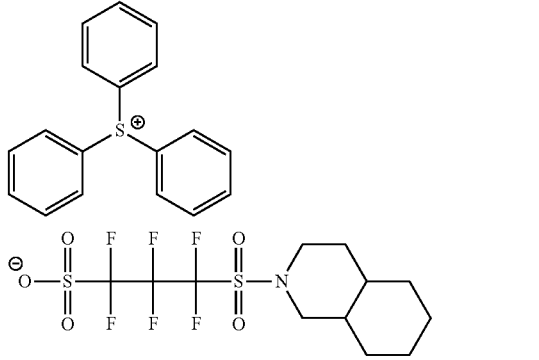

PAG-2

PAG-3

PAG-4

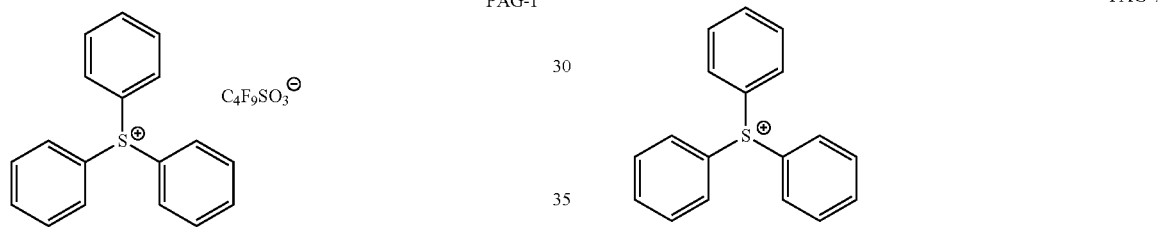

PAG-5

PAG-6

PAG-7

PAG-8

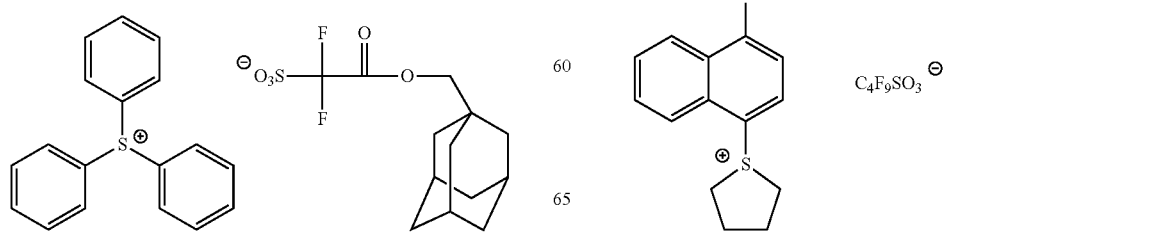

PAG-9

PAG-10
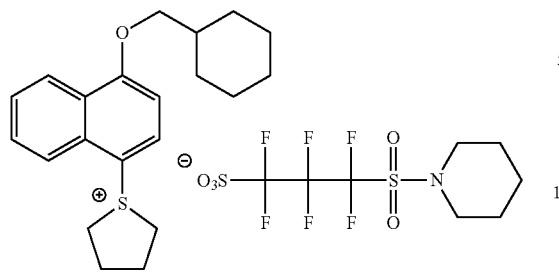
PAG-11
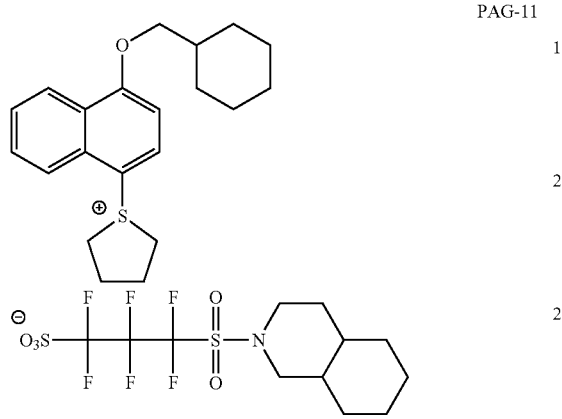
PAG-12
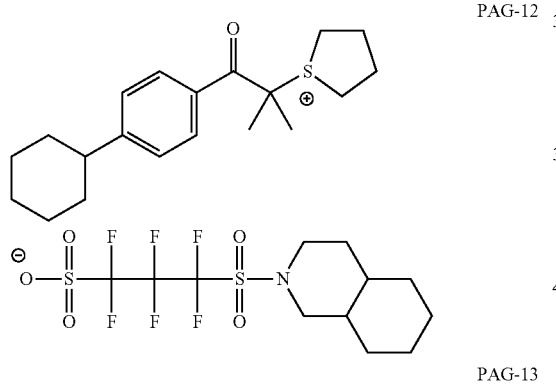
PAG-13
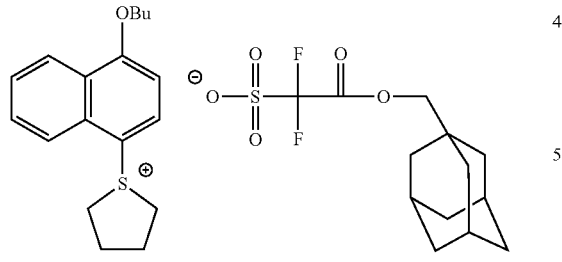
PAG-14
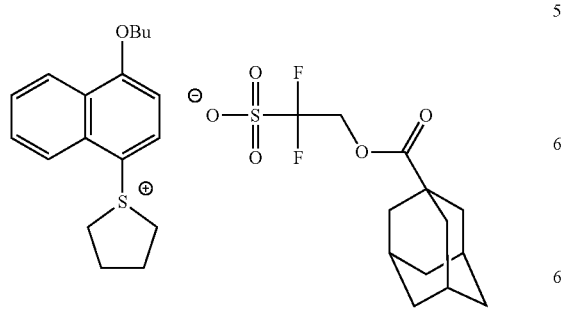
PAG-15
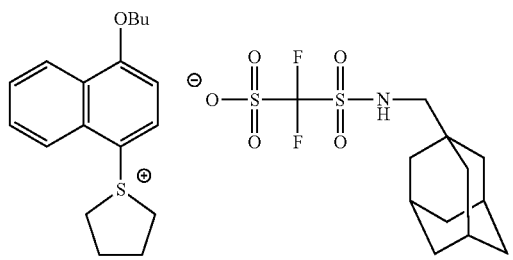
PAG-16
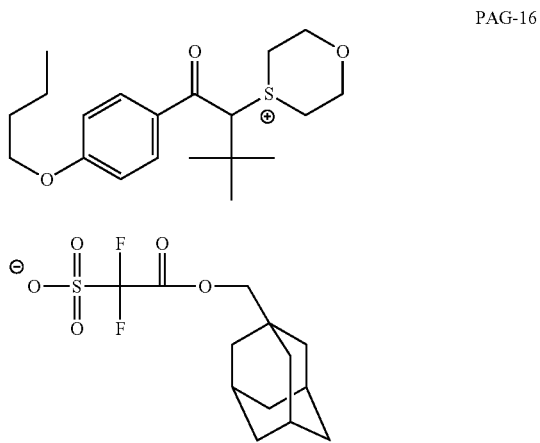
PAG-17
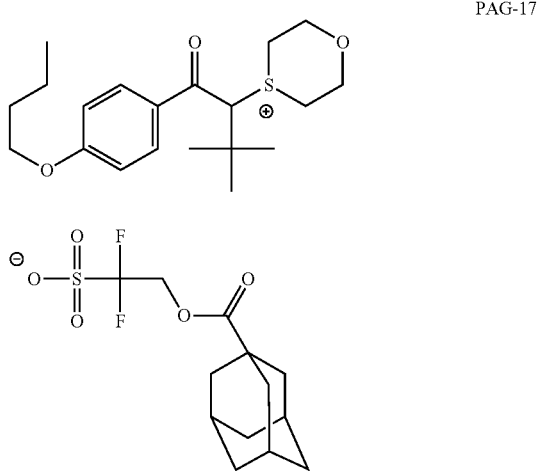
PAG-18
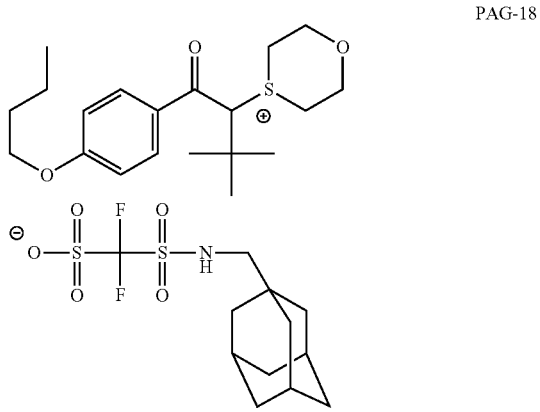

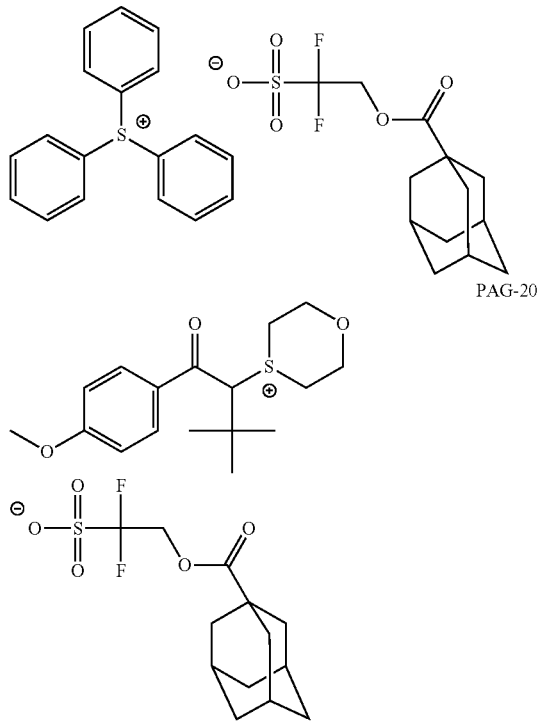

PAG-19

PAG-20

[3] Hydrophobic Resin

The composition of the present invention may contain a hydrophobic resin (hereinafter also referred to as a "hydrophobic resin (D)" or simply a "resin (D)"). Further, it is preferable that the hydrophobic resin (D) is different from the resin (P).

Although the hydrophobic resin (D) is preferably designed to be distributed unevenly on an interface as described above, it does not necessarily have to have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, improvement of the immersion liquid tracking properties, and inhibition of outgassing.

The hydrophobic resin (D) preferably has one or more types of any of a "fluorine atom", a "silicon atom", and a "$CH_3$ partial structure which is contained in a side chain portion of a resin" from the point of view of uneven distribution on the film surface layer, and more preferably has two or more types.

In the case where hydrophobic resin (D) includes a fluorine atom and/or a silicon atom, the fluorine atom and/or the silicon atom in the hydrophobic resin (D) may be included in the main chain or the side chain of the resin.

In the case where the hydrophobic resin (D) includes a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group such as a phenyl group and a naphthyl group, in which at least one hydrogen atom is substituted with a fluorine atom, and may further have a substituent other than a fluorine atom.

Preferred examples of the alkyl group having a fluorine atom, the cycloalkyl group having a fluorine atom, and the aryl group having a fluorine atom include groups represented by the following General Formulae (F2) to (F4), but the present invention is not limited thereto.

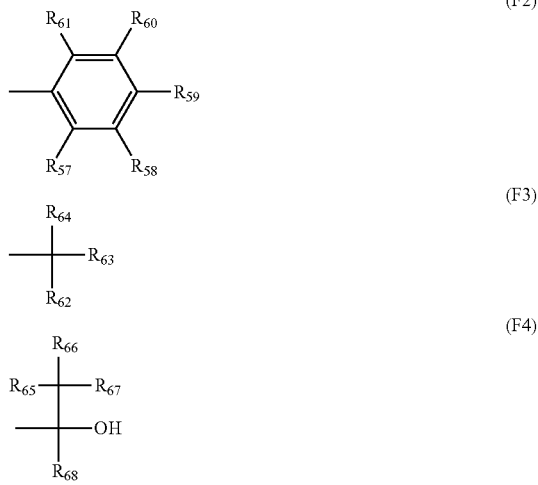

In General Formulae (F2) to (F4), $R_{57}$ to $R_{68}$ each independently represent a hydrogen atom, a fluorine atom, or an (linear or branched) alkyl group, provided that at least one of $R_{57}$, . . . , or $R_{61}$, at least one of $R_{62}$, . . . , or $R_{64}$, and at least one of $R_{65}$, . . . , or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

Specific examples of the group represented by General Formula (F2) include a p-fluorophenyl group, a pentafluorophenyl group, and a 3,5-di(trifluoromethyl)phenyl group.

Specific examples of the group represented by General Formula (F3) include those exemplified in "0500" of US2012/0251948A1.

Specific examples of the group represented by General Formula (F4) include —C(CF$_3$)$_2$OH, —C(C$_2$F$_5$)$_2$OH, —C(CF$_3$)(CH$_3$)OH, and —CH(CF$_3$)OH, with —C(CF$_3$)$_2$OH being preferable.

The partial structure including a fluorine atom may be bonded directly to the main chain or may be bonded to the main chain through a group selected from the group consisting of an alkylene group, a phenylene group, an ether bond, a thioether bond, a carbonyl group, an ester bond, an amide bond, an urethane bond, and an ureylene bond, or a group formed by combination of two or more thereof.

The hydrophobic resin (D) may contain a silicon atom. As a partial structure having a silicon atom, a resin having an alkylsilyl structure (preferably a trialkylsilyl group), or a cyclic siloxane structure is preferable.

Specific examples of the alkylsilyl structure or the cyclic siloxane structure include a group represented by the following General Formulae (CS-1) to (CS-3).

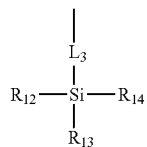
(CS-1)

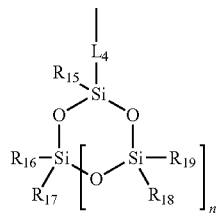
(CS-2)

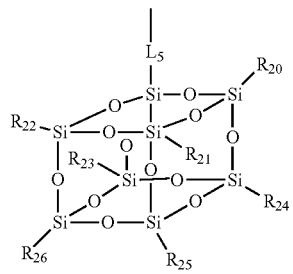
(CS-3)

In General Formulae (CS-1) to (CS-3), $R_{12}$ to $R_{26}$ each independently represent a linear or branched alkyl group (preferably having 1 to 20 carbon atoms) or a cycloalkyl group (preferably having 3 to 20 carbon atoms), $L_3$ to $L_5$ represent a single bond or a divalent linking group, and examples of a divalent linking group include one, or a combination (the total number of carbon atoms is preferably 12 or less) of two or more, which are selected from a group formed of an alkylene group, a phenylene group, an ether bond, a thioether bond, a carbonyl group, an ester bond, an amide bond, an urethane bond, and an urea bond, and n represents an integer of 1 to 5. n is preferably an integer of 2 to 4.

Examples of the repeating unit having a fluorine atom or a silicon atom include those exemplified in "0519" of US2012/0251948A1.

Furthermore, it is also preferable that the hydrophobic resin (D) includes a CH$_3$ partial structure in the side chain portion as described above.

Here, the CH$_3$ partial structure contained in the side chain portion in the hydrophobic resin (D) (hereinafter also simply referred to as a "side chain CH$_3$ partial structure") is intended to include CH$_3$ partial structures contained in an ethyl group, a propyl group, and the like.

On the other hand, a methyl group bonded directly to the main chain of the hydrophobic resin (D) (for example, an α-methyl group in a repeating unit having a methacrylic acid structure) makes only a small contribution of uneven distribution to the surface of the hydrophobic resin (D) due to the effect of the main chain, and it is therefore not included in the CH$_3$ partial structure in the present invention.

More specifically, in the case where the hydrophobic resin (D) includes a repeating unit derived from a monomer having a polymerizable moiety with a carbon-carbon double bond, such as a repeating unit represented by the following General Formula (M), and in addition, $R_{11}$ to $R_{14}$ are CH$_3$ "themselves", such CH$_3$ is not included in the CH$_3$ partial structure contained in the side chain portion in the present invention.

On the other hand, a CH$_3$ partial structure which is present through some atom(s) from the C—C main chain is intended to correspond to the CH$_3$ partial structure in the present invention. For example, in the case where $R_{11}$ is an ethyl group (CH$_2$CH$_3$), it is intended that the repeating unit has "one" CH$_3$ partial structure in the present invention.

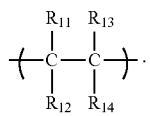
(M)

In General Formula (M), $R_{11}$ to $R_{14}$ each independently represent a side chain portion.

Examples of $R_{11}$ to $R_{14}$ at the side chain portion include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

It is preferable that the hydrophobic resin (D) is a resin including a repeating unit having the CH$_3$ partial structure in the side chain portion. Further, it is more preferable that the hydrophobic resin has at least one repeating unit (x) of a repeating unit represented by the following General Formula (II) or a repeating unit represented by the following General Formula (III) as the repeating unit.

Hereinafter, the repeating unit represented by General Formula (II) will be described in detail.

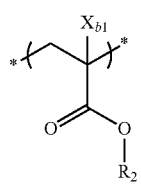
(II)

In General Formula (II), $X_{b1}$ represents a hydrogen atom, an alkyl group, a cyano group, or a halogen atom, and $R_2$ represents an organic group which has one or more CH$_3$ partial structures and is stable against an acid. Here, more specifically, the organic group which is stable against an acid is preferably an organic group which does not have "the acid-decomposable group" as described in the resin (P).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of the $CH_3$ partial structures contained in the organic group which has one or more $CH_3$ partial structures and is stable against an acid as $R_2$ is preferably 2 to 10, and more preferably 2 to 8.

Specific preferred examples of the repeating unit represented by General Formula (II) are shown below. Further, the present invention is not limited thereto.

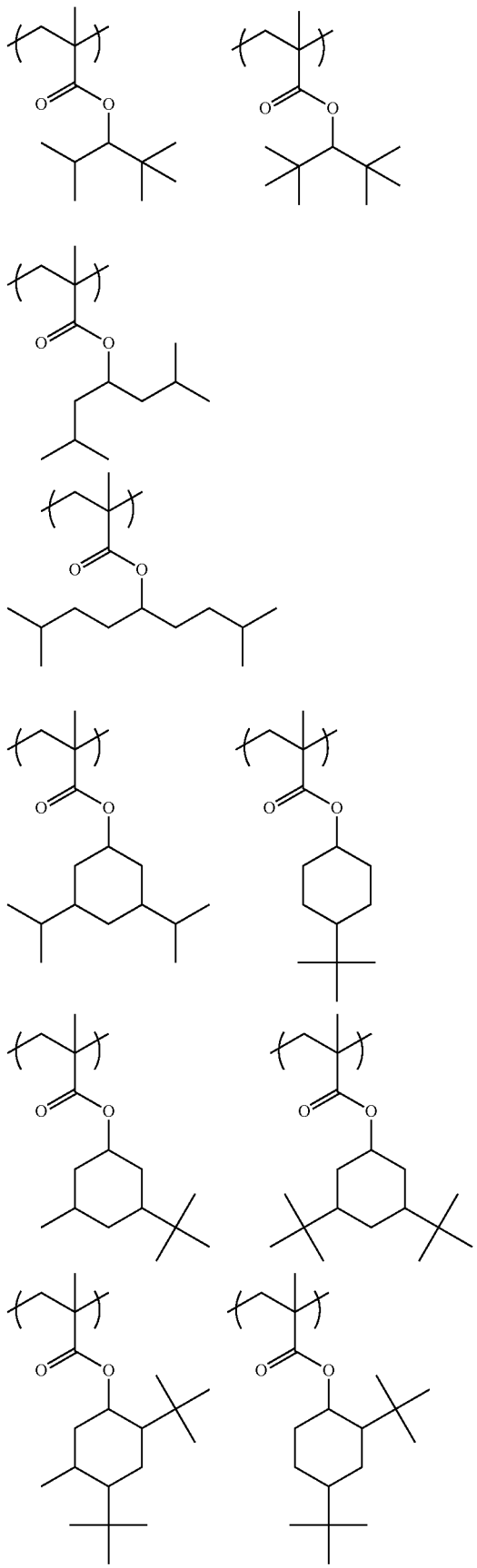

-continued

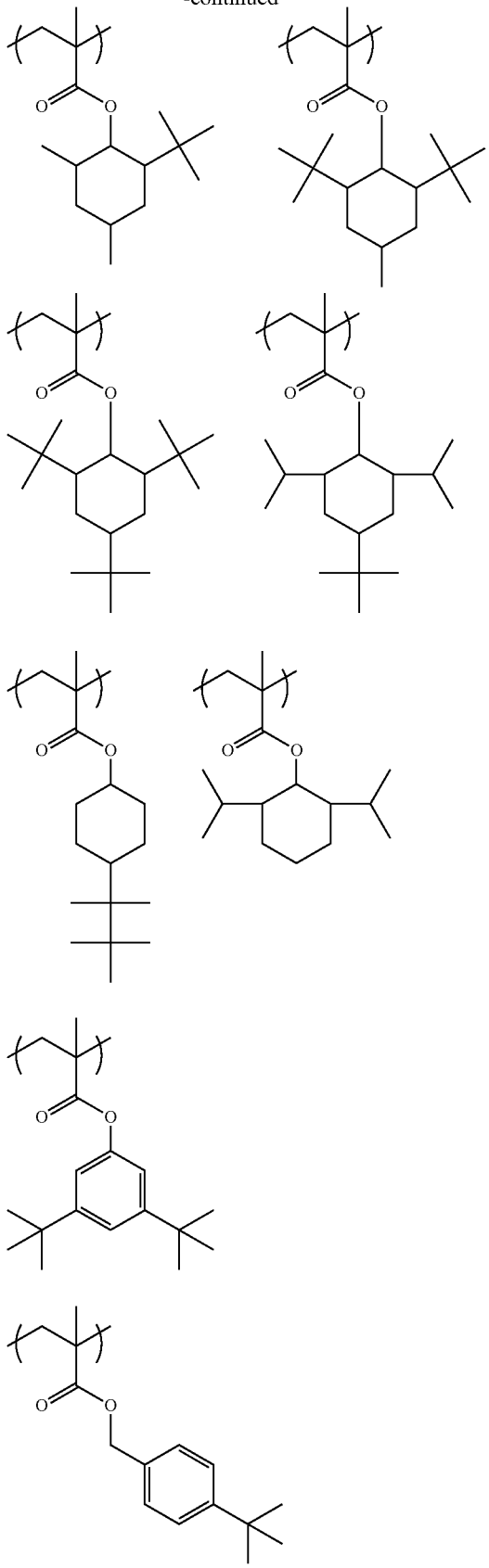

The repeating unit represented by General Formula (II) is preferably a repeating unit which is stable against an acid (non-acid-decomposable), and specifically, it is preferably a repeating unit having no group which decomposes by the action of an acid to generate a polar group.

Hereinafter, the repeating unit represented by General Formula (III) will be described in detail.

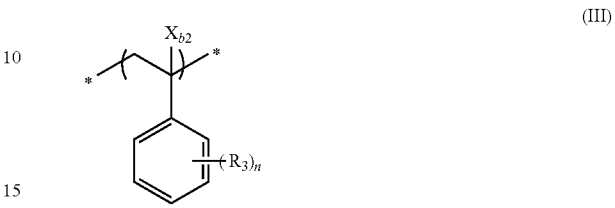

(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, with the hydrogen atom being preferable.

$X_{b2}$ is preferably a hydrogen atom.

$R_3$ is an organic group which is stable against an acid, and therefore, more specifically, $R_3$ is preferably an organic group which does not have "the acid-decomposable group" as described in the resin (P).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

n represents an integer of 1 to 5, more preferably 1 to 3, and still more preferably 1 or 2.

Specific preferred examples of the repeating unit represented by General Formula (III) are shown below. Further, the present invention is not limited thereto.

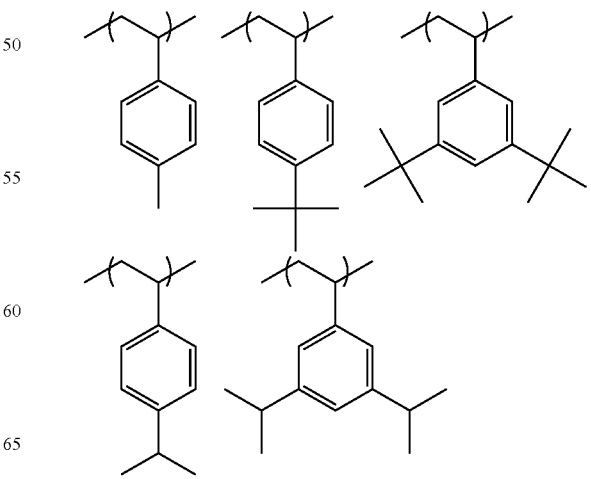

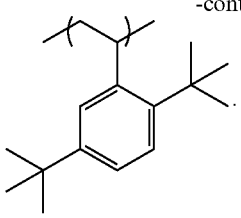
-continued

The repeating unit represented by General Formula (III) is preferably a repeating unit which is stable against an acid (non-acid-decomposable), and specifically, it is preferably a repeating unit which has no group which decomposes by the action of an acid to generate a polar group.

In the case where the hydrophobic resin (D) includes a $CH_3$ partial structure in the side chain portion, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin (D). Further, the content is usually 100% by mole or less with respect to all the repeating units of the hydrophobic resin (D).

By incorporating at least one repeating unit (x) of the repeating unit represented by General Formula (II) or the repeating unit represented by General Formula (III) in a proportion of 90% by mole or more with respect to all the repeating units of the hydrophobic resin (D) into the hydrophobic resin (D), the surface free energy of the hydrophobic resin (D) is increased. As a result, it is difficult for the hydrophobic resin (D) to be unevenly distributed on the surface of the resist film and the static/dynamic contact angle of the resist film with respect to water can be securely increased, thereby enhancing the immersion liquid tracking properties.

In addition, the hydrophobic resin (D) may have at least one group selected from the following groups (x) to (z) in the case (i) of including a fluorine atom and/or a silicon atom as well as in the case (ii) of including a $CH_3$ partial structure in the side chain portion:

(x) an acid group,
(y) a group having a lactone structure, an acid anhydride group, or an acid imide group, and
(z) a group which decomposes by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the acid group include a fluorinated alcohol group (preferably a hexafluoroisopropanol group), a sulfonimide group, and a bis(alkylcarbonyl)methylene group. Examples of the repeating unit having an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent having an acid group during the polymerization. All of these cases are preferable. The repeating unit having an acid group (x) may have at least one of a fluorine atom or a silicon atom.

The content of the repeating units having an acid group (x) is preferably 1% by mole to 50% by mole, more preferably 3% by mole to 35% by mole, and still more preferably 5% by mole to 20% by mole, with respect to all the repeating units in the hydrophobic resin (D).

Specific examples of the repeating unit having an acid group (x) are shown below, but the present invention is not limited thereto. In the formulae, Rx represents a hydrogen atom, $CH_3$, $CF_3$, or $CH_2OH$.

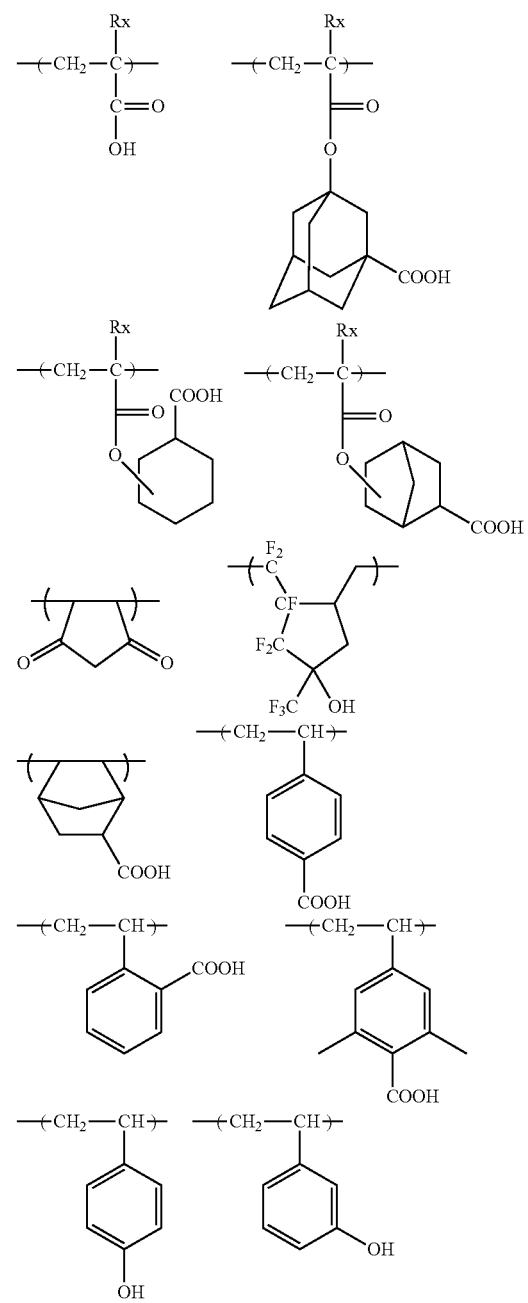

-continued
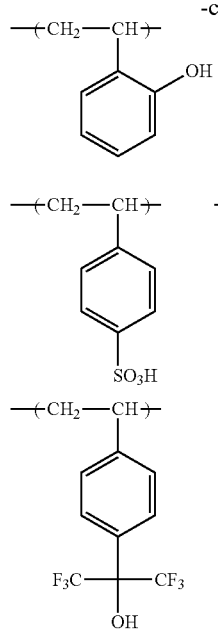
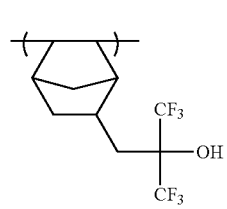
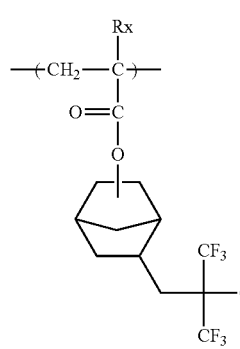
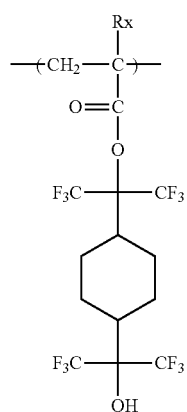
-continued
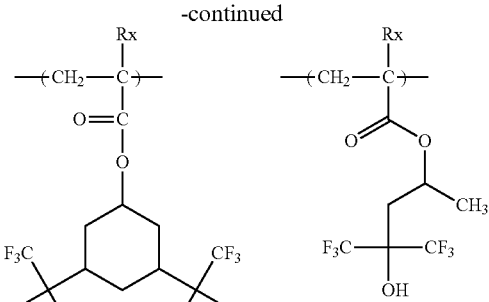
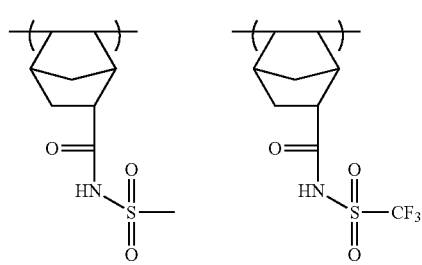
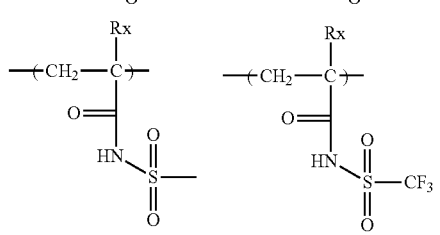
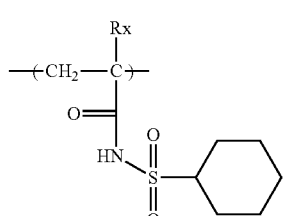
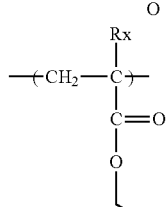
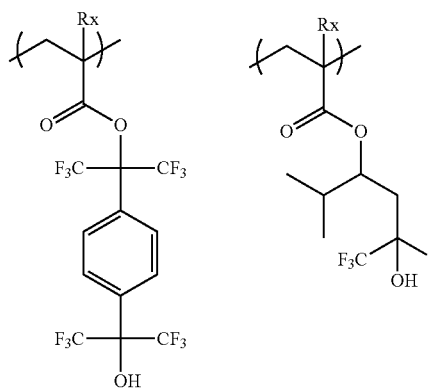

-continued

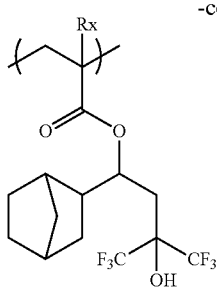

As the group having a lactone structure, the acid anhydride group, or the acid imide group (y), the group having a lactone structure is particularly preferable.

The repeating unit including such a group is, for example, a repeating unit in which the group is directly bonded to the main chain of the resin, such as a repeating unit by an acrylic ester or a methacrylic ester. This repeating unit may be a repeating unit in which the group is bonded to the main chain of the resin through a linking group. Alternatively, this repeating unit may be introduced into the terminal of the resin by using a polymerization initiator or chain transfer agent having the group during the polymerization.

Examples of the repeating unit having a group having a lactone structure include the same ones as those of the repeating unit having a lactone structure as described earlier in the section of the resin (P).

The content of the repeating units having a group having a lactone structure, an acid anhydride group, or an acid imide group is preferably 1% by mole to 100% by mole, more preferably 3% by mole to 98% by mole, and still more preferably 5% by mole to 95% by mole, with respect to all the repeating units in the hydrophobic resin (D).

In the hydrophobic resin (D), examples of the repeating unit having a group (z) which decomposes by the action of an acid include the same ones as the repeating units containing an acid-decomposable group, as mentioned with respect to the resin (P). The repeating unit having a group (z) which decomposes by the action of an acid may contain at least one of a fluorine atom or a silicon atom. In the hydrophobic resin (D), the content of the repeating units having a group (z) which decomposes by the action of an acid is preferably 1% by mole to 80% by mole, more preferably 10% by mole to 80% by mole, and still more preferably 20% by mole to 60% by mole, with respect to all the repeating units in the resin (D).

The hydrophobic resin (D) may further have a repeating unit represented by the following General Formula (III).

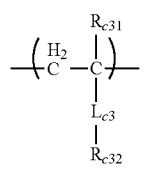
(III)

In General Formula (III), $R_{c31}$ represents a hydrogen atom, an alkyl group (which may be substituted with a fluorine atom or the like), a cyano group, or a —$CH_2$—O—$R_{ac2}$ group, in which $Rac_2$ represents a hydrogen atom, an alkyl group, or an acyl group, and $R_{c31}$ is preferably a hydrogen atom, a methyl group, a hydroxymethyl group, or a trifluoromethyl group, and particularly preferably a hydrogen atom or a methyl group, $R_{c32}$ represents a group having an alkyl group, a cycloalkyl group, an alkenyl group, a cycloalkenyl group, or an aryl group, each of which may be substituted with a group including a fluorine atom or a silicon atom, and $L_{c3}$ represents a single bond or a divalent linking group.

In General Formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and more preferably a phenyl group or a naphthyl group, and these groups may have a substituent.

$R_{c32}$ is preferably an unsubstituted alkyl group or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating units represented by General Formula (III) is preferably 1% by mole to 100% by mole, more preferably 10% by mole to 90% by mole, and still more preferably 30% by mole to 70% by mole, with respect to all the repeating units in the hydrophobic resin (D).

It is also preferable that the hydrophobic resin (D) further has a repeating unit represented by the following General Formula (CII-AB).

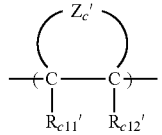
(C11-AB)

In Formula (CII-AB), $R_{c11}'$ and $R_{c12}'$ each independently represent a hydrogen atom, a cyano group, a halogen atom, or an alkyl group, and $Zc'$ represents an atomic group for forming an alicyclic structure containing two carbon atoms (C—C) to which $Z_c'$ is bonded.

The content of the repeating units represented by General Formula (CII-AB) is preferably 1% by mole to 100% by mole, more preferably 10% by mole to 90% by mole, and still more preferably 30% by mole to 70% by mole, with respect to all the repeating units in the hydrophobic resin (D).

Specific examples of the repeating units represented by General Formulae (III) and (CII-AB) are shown below, but the present invention is not limited thereto. In the formulae, Ra represents H, $CH_3$, $CH_2OH$, $CF_3$, or CN.

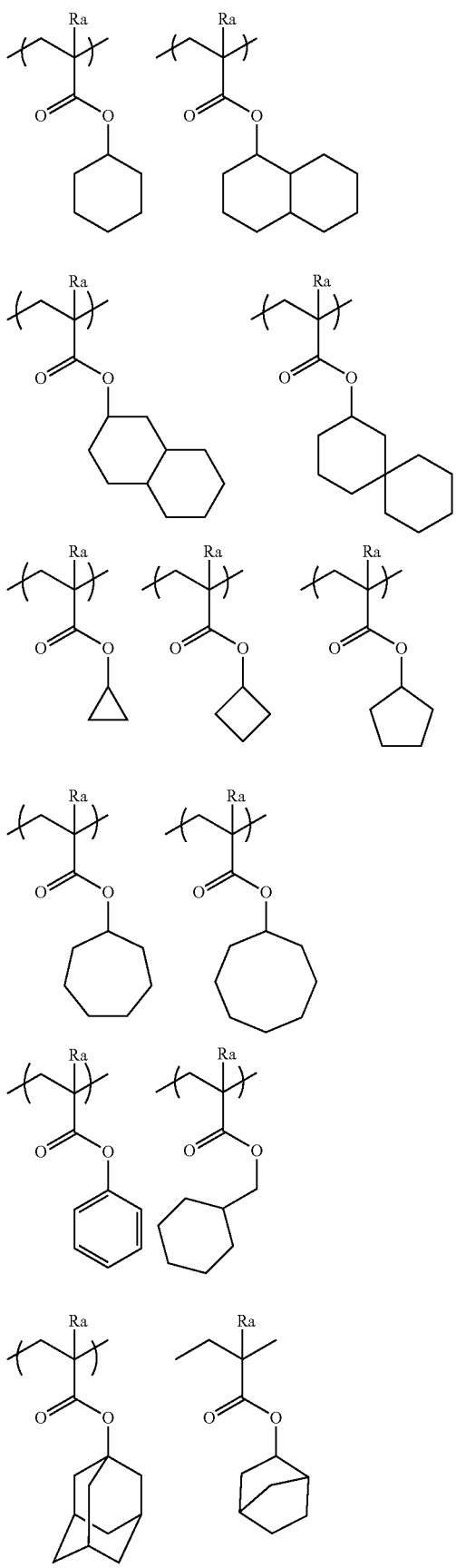
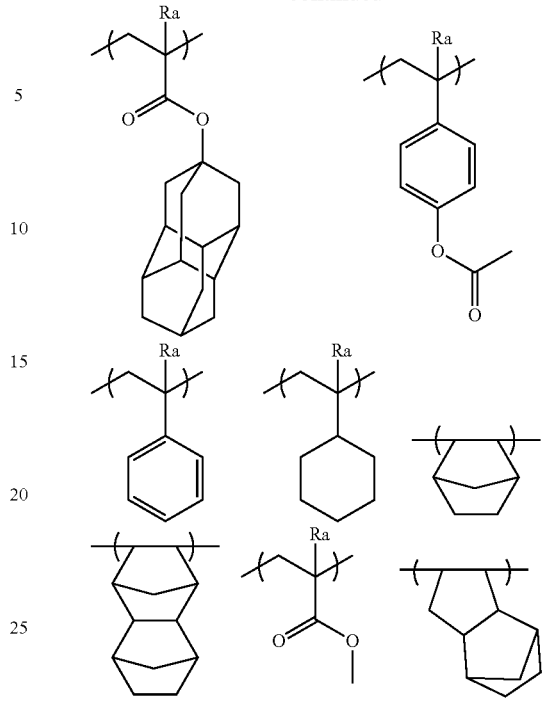

In the case where the hydrophobic resin (D) has a fluorine atom, the content of the fluorine atoms is preferably 5% by mass to 80% by mass, and more preferably 10% by mass to 80% by mass, with respect to the weight-average molecular weight of the hydrophobic resin (D). Further, the proportion of the repeating units including a fluorine atom is preferably 10% by mole to 100% by mole, and more preferably 30% by mole to 100% by mole, with respect to all the repeating units included in the hydrophobic resin (D).

In the case where the hydrophobic resin (D) has a silicon atom, the content of the silicon atoms is preferably 2% by mass to 50% by mass, and more preferably 2% by mass to 30% by mass, with respect to the weight-average molecular weight of the hydrophobic resin (D). Further, the proportion of the repeating unit including a silicon atom is preferably 10% by mole to 100% by mole, and more preferably 20% by mole to 100% by mole, with respect to all the repeating units included in the hydrophobic resin (D).

On the other hand, in particular, in the case where the hydrophobic resin (D) includes a $CH_3$ partial structure in the side chain portion, it is also preferable that the hydrophobic resin (D) has a form having substantially neither a fluorine atom nor a silicon atom. In this case, specifically the content of the repeating units having a fluorine atom or a silicon atom is preferably 5% by mole or less, more preferably 3% by mole or less, still more preferably 1% by mole or less, and ideally 0% by mole, that is, containing neither a fluorine atom nor a silicon atom, with respect to all the repeating units in the hydrophobic resin (D). In addition, it is preferable that the hydrophobic resin (D) is composed substantially of a repeating unit constituted with only an atom selected from the group consisting of a carbon atom, an oxygen atom, a hydrogen atom, a nitrogen atom, and a sulfur atom. More specifically, the proportion of the repeating unit constituted with only an atom selected from the group consisting of a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, of all the repeating units in the hydrophobic resin (D).

The weight-average molecular weight of the hydrophobic resin (D) in terms of standard polystyrene is preferably 1,000 to 100,000, more preferably 1,000 to 50,000, and still more preferably 2,000 to 15,000.

Furthermore, the hydrophobic resins (D) may be used alone or in combination of two or more kinds thereof.

The content of the hydrophobic resins (D) in the composition is preferably 0.01% by mass to 10% by mass, more preferably 0.05% by mass to 8% by mass, and still more preferably 0.1% by mass to 7% by mass, with respect to the total solid content of the composition of the present invention.

In the hydrophobic resin (D), it is certain that the content of impurities such as metal is small, but the content of residual monomers or oligomer components is also preferably 0.01% by mass to 5% by mass, more preferably 0.01% by mass to 3% by mass, and still more preferably 0.05% by mass to 1% by mass. Within these ranges, a composition free from a change in in-liquid extraneous materials or sensitivity over time, or the like can be obtained. Further, from the viewpoints of a resolution, a resist profile, the side wall of a resist pattern, a roughness, and the like, the molecular weight distribution (Mw/Mn, also referred to as a dispersity) is preferably in the range of 1 to 5, more preferably in the range of 1 to 3, and still more preferably in the range of 1 to 2.

As the hydrophobic resin (D), various commercial products may be used, or the hydrophobic resin (D) may be synthesized by an ordinary method (for example, radical polymerization). Examples of the general synthesis method include a batch polymerization method of dissolving monomer species and an initiator in a solvent and heating the solution, thereby carrying out the polymerization, and a dropping polymerization method of adding dropwise a solution of monomer species and an initiator to a heated solvent for 1 hour to 10 hours, with the dropping polymerization method being preferable.

The reaction solvent, the polymerization initiator, the reaction conditions (a temperature, a concentration, and the like) and the method for purification after reaction are the same as ones described for the resin (P), and in the synthesis of the hydrophobic resin (D), the concentration of the reactant is preferably 30% by mass to 50% by mass.

Specific examples of the hydrophobic resin (D) are shown below. Further, the molar ratio of the repeating units (corresponding to the respective repeating units in order from the left side), the weight-average molecular weight, and the dispersity with respect to the respective resins are shown in the following tables.

| Resin | Compositional ratio | Molecular weight | Dispersity |
|---|---|---|---|
| B-1 | 50/50 | 4800 | 1.4 |
| B-2 | 50/50 | 5100 | 2.1 |
| B-3 | 40/60 | 6600 | 1.8 |
| B-4 | 100 | 5500 | 1.7 |
| B-5 | 45/55 | 4400 | 1.6 |
| B-6 | 50/50 | 6000 | 1.5 |
| B-7 | 40/10/50 | 6200 | 1.6 |
| B-8 | 50/50 | 5800 | 1.5 |
| B-9 | 80/20 | 4800 | 1.8 |
| B-10 | 50/20/30 | 4900 | 1.9 |
| B-11 | 50/10/40 | 5300 | 2.0 |
| B-12 | 40/20/40 | 5500 | 1.4 |
| B-13 | 60/40 | 5900 | 1.3 |
| B-14 | 50/50 | 6200 | 1.5 |

-continued

| Resin | Compositional ratio | Molecular weight | Dispersity |
|---|---|---|---|
| B-15 | 40/15/45 | 6100 | 1.8 |
| B-16 | 57/39/2/2 | 6000 | 1.6 |
| B-17 | 45/20/35 | 6600 | 1.6 |
| B-18 | 40/30/30 | 5500 | 1.7 |
| B-19 | 100 | 4900 | 1.6 |
| B-20 | 100 | 4400 | 1.8 |
| B-21 | 60/40 | 4500 | 1.9 |
| B-22 | 55/45 | 6200 | 1.3 |
| B-23 | 100 | 5700 | 1.5 |
| B-24 | 100 | 5800 | 2.0 |
| B-25 | 100 | 6000 | 1.5 |
| B-26 | 100 | 6000 | 1.6 |
| B-27 | 100 | 6200 | 1.8 |
| B-28 | 50/50 | 6500 | 1.7 |
| B-29 | 90/8/2 | 6500 | 1.5 |
| B-30 | 90/10 | 6900 | 1.7 |
| B-31 | 95/5 | 4900 | 1.8 |
| B-32 | 80/20 | 5200 | 1.9 |
| B-33 | 75/15/10 | 5900 | 1.6 |
| B-34 | 75/25 | 6000 | 1.5 |
| B-35 | 80/20 | 5700 | 1.4 |
| B-36 | 100 | 5300 | 1.7 |
| B-37 | 20/80 | 5400 | 1.6 |
| B-38 | 50/50 | 4800 | 1.6 |
| B-39 | 70/30 | 4500 | 1.6 |
| B-40 | 100 | 5500 | 1.5 |
| B-41 | 40/40/20 | 5800 | 1.5 |
| B-42 | 35/35/30 | 6200 | 1.4 |

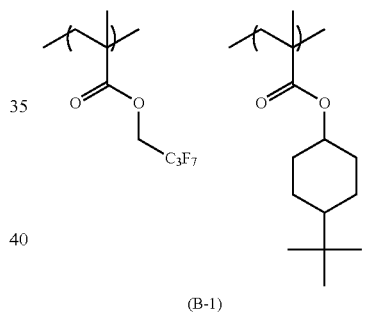

(B-1)

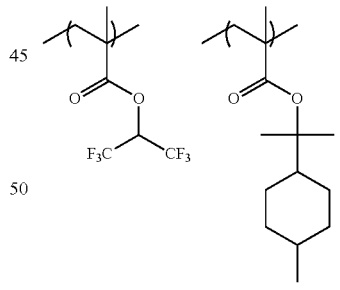

(B-2)

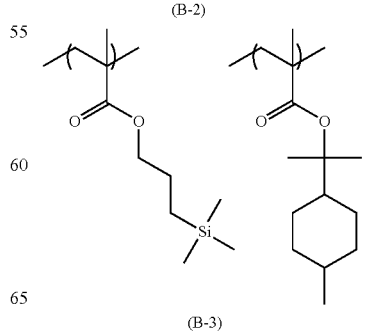

(B-3)

| Resin | Compositional ratio | Molecular weight | Dispersity |
|---|---|---|---|

| Resin | Compositional ratio | Molecular weight | Dispersity |
|---|---|---|---|
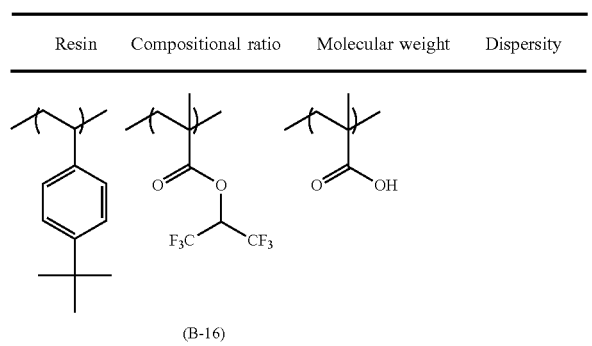
(B-16)
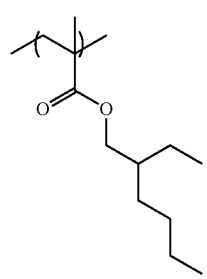
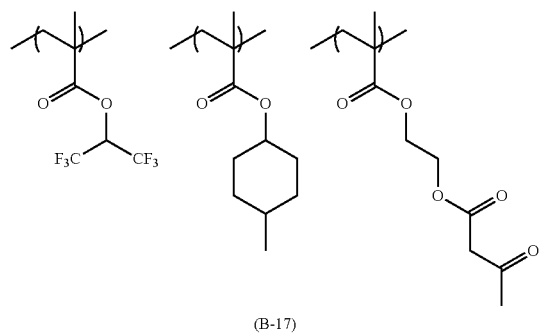
(B-17)
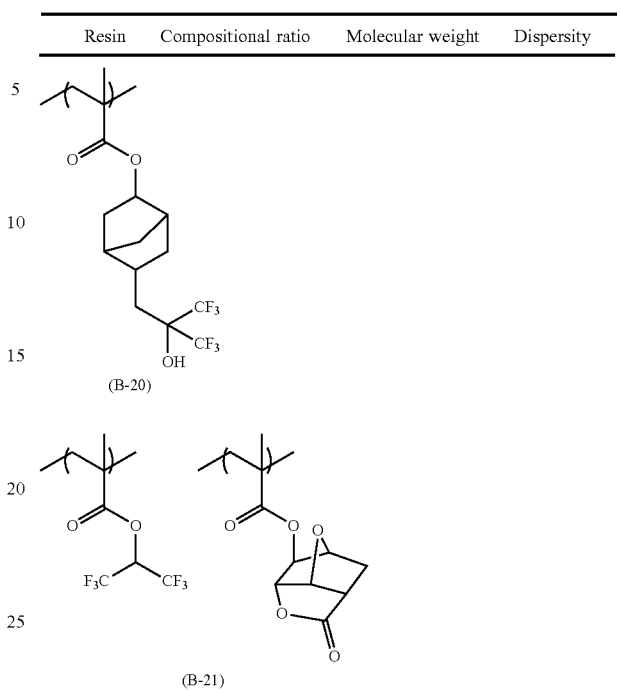
(B-20)
(B-21)
(B-22)
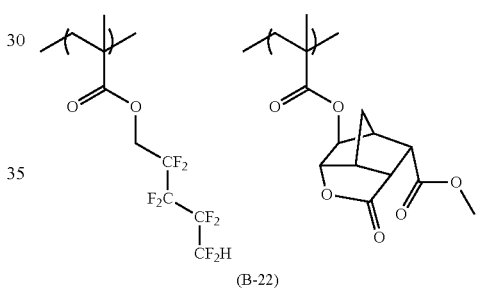
(B-18)
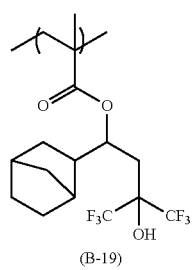
(B-19)
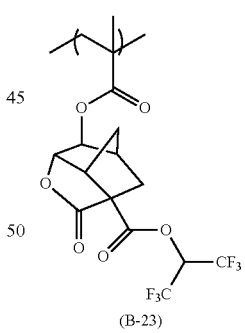
(B-23)
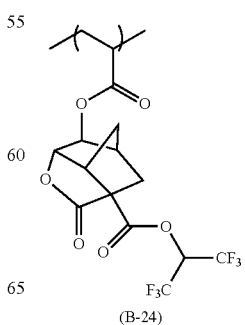
(B-24)

| Resin | Compositional ratio | Molecular weight | Dispersity |
|---|---|---|---|
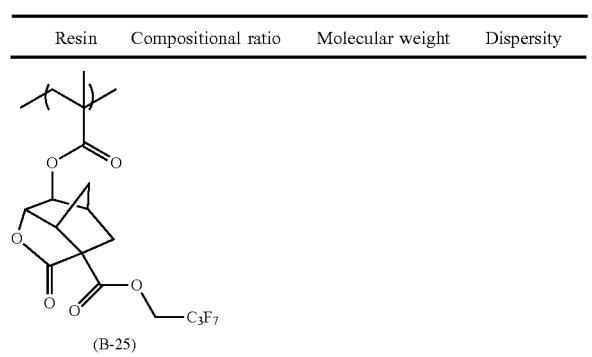
(B-25)
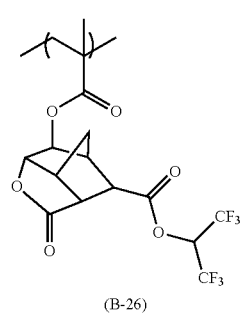
(B-26)
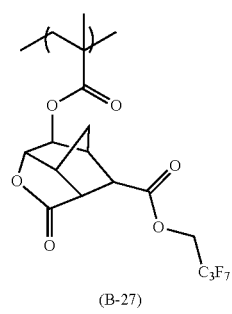
(B-27)
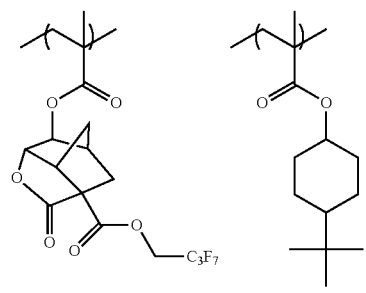
(B-28)
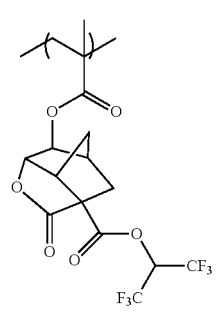
(B-29)
| Resin | Compositional ratio | Molecular weight | Dispersity |
|---|---|---|---|
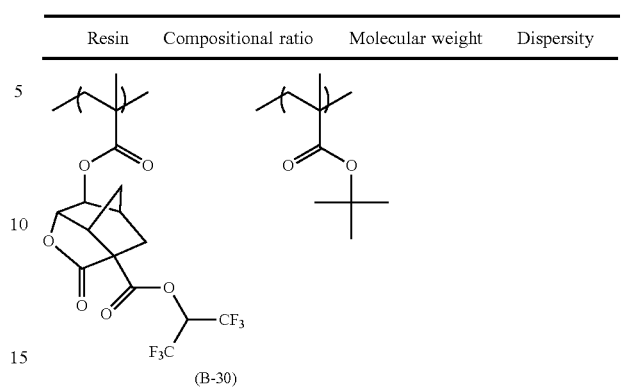
(B-30)
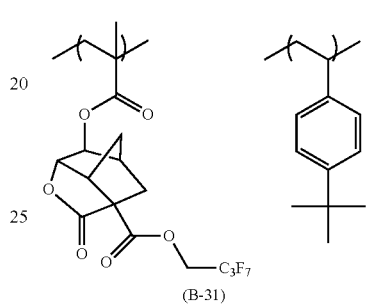
(B-31)
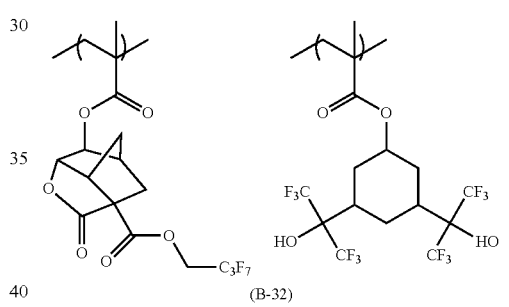
(B-32)
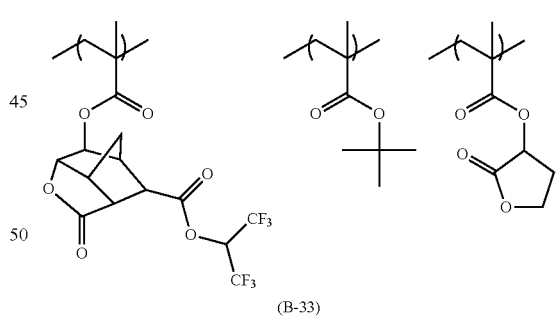
(B-33)
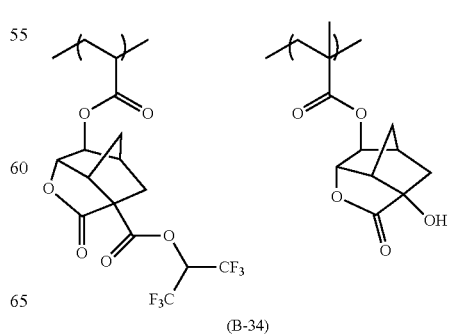
(B-34)

-continued
| Resin | Compositional ratio | Molecular weight | Dispersity |
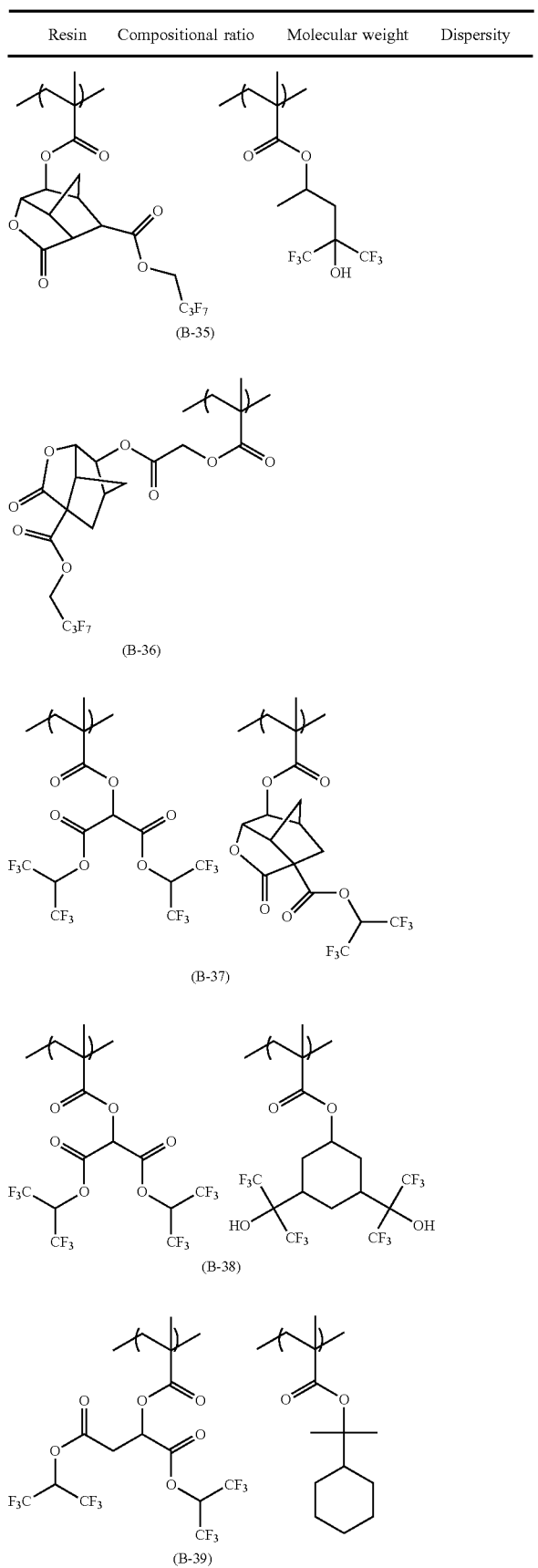
| Resin | Compositional ratio | Molecular weight | Dispersity |
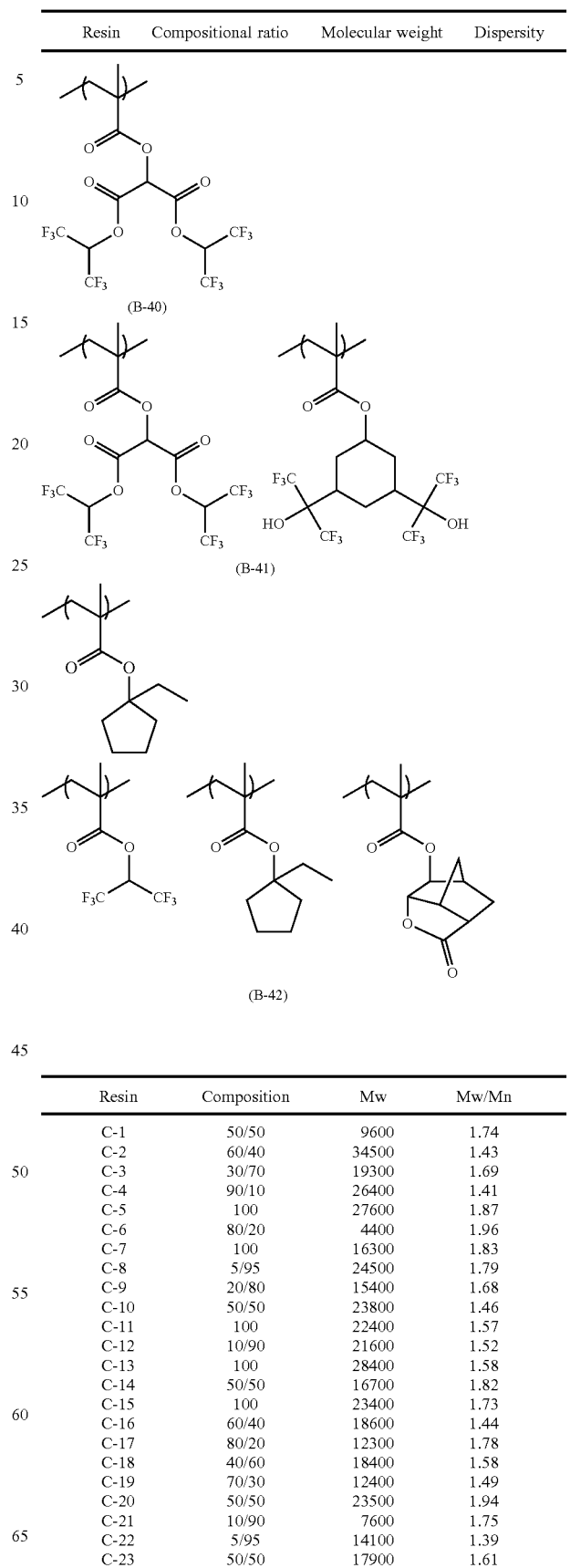
| Resin | Composition | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |

-continued
| Resin | Composition | Mw | Mw/Mn |
|---|---|---|---|
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |
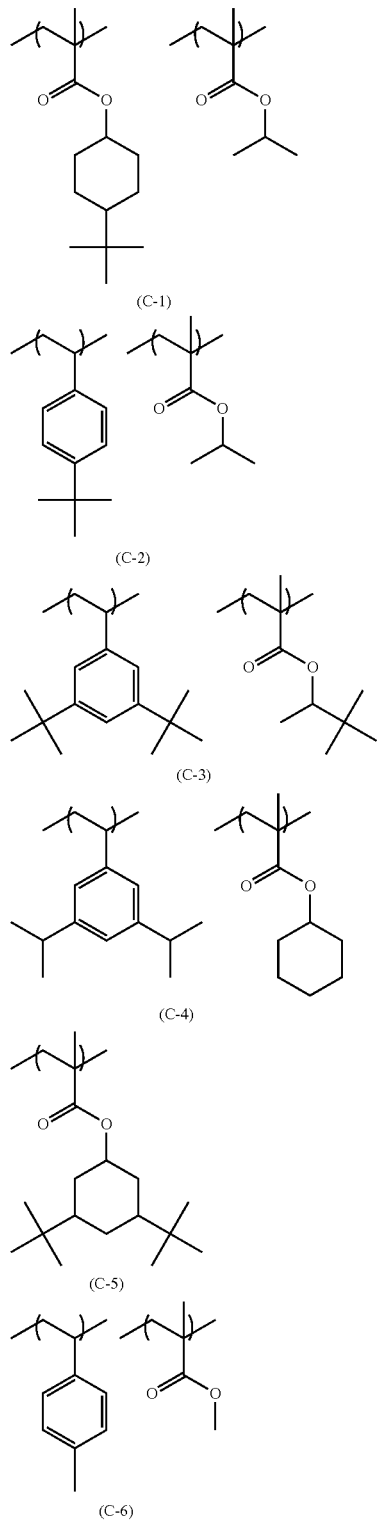

| Resin | Composition | Mw | Mw/Mn |
|---|---|---|---|
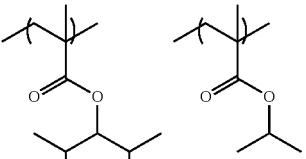
(C-14)
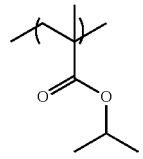
(C-15)
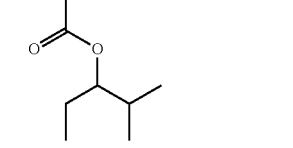
(C-16)
(C-17)
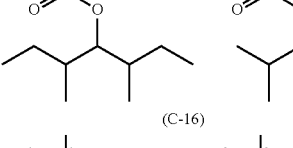
(C-18)
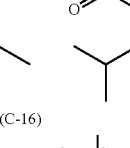
(C-19)
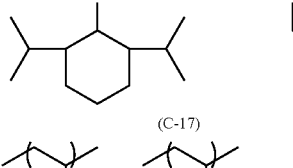
(C-20)
| Resin | Composition | Mw | Mw/Mn |
|---|---|---|---|
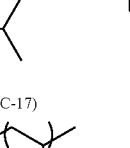
(C-21)
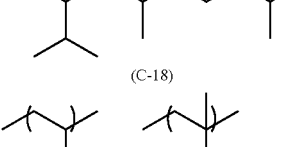
(C-22)
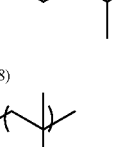
(C-23)
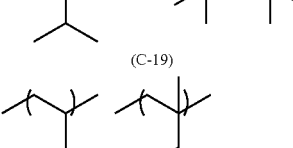
(C-24)
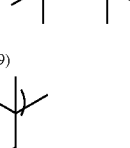
(C-25)
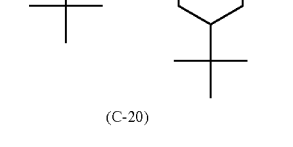
(C-26)

| Resin | Composition | Mw | Mw/Mn |
|---|---|---|---|

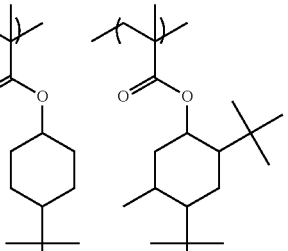

(C-27)

(C-28)

[4] Acid Diffusion Control Agent

The composition of the present invention preferably contains an acid diffusion control agent. The acid diffusion control agent acts as a quencher that inhibits a reaction of the acid-decomposable resin in the unexposed area by excessive generated acids by trapping the acids generated from an acid generator or the like upon exposure. As the acid diffusion control agent, a basic compound, a low-molecular-weight compound which has a nitrogen atom and a group capable of leaving by the action of an acid, a basic compound whose basicity is reduced or lost upon irradiation with actinic ray or radiation, or an onium salt which becomes a relatively weak acid with respect to an acid generator can be used.

Preferred examples of the basic compound include compounds having structures represented by the following Formulae (A) to (E).

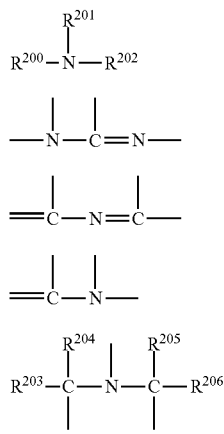

In General Formulae (A) and (E), $R^{200}$, $R^{201}$, and $R^{202}$ may be the same as or different from each other, and represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{102}$ and $R^{202}$ may be bonded to each other to form a ring.

$R^{203}$, $R^{204}$, $R^{205}$, and $R^{206}$ may be the same as or different from each other, and represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

It is more preferable that the alkyl groups in General Formulae (A) and (E) are unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Specific preferred examples of the compound include the compounds exemplified in "0379" of US2012/0219913A1.

Preferred examples of the basic compound include an amine compound having a phenoxy group, an ammonium salt compound having a phenoxy group, an amine compound containing a sulfonic ester group, and an ammonium salt compound having a sulfonic ester group.

As the amine compound, a primary, secondary, or tertiary amine compound can be used, and an amine compound in which at least one alkyl group is bonded to a nitrogen atom is preferable. The amine compound is more preferably a tertiary amine compound. Any amine compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The amine compound preferably has an oxygen atom in the alkyl chain to form an oxyalkylene group. The number of the oxyalkylene groups within the molecule is 1 or more, preferably 3 to 9, and more preferably 4 to 6. Among the oxyalkylene groups, an oxyethylene group (—$CH_2CH_2O$—) or an oxypropylene group (—$CH(CH_3)CH_2O$— or —$CH_2CH_2CH_2O$—) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. Any ammonium salt compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group. The ammonium salt compound preferably has an oxygen atom in the alkyl chain to form an oxyalkylene group. The number of the oxyalkylene groups within the molecule is 1 or more, preferably 3 to 9, and more preferably 4 to 6. Among the oxyalkylene groups, an oxyethylene group (—$CH_2CH_2O$—) or an oxypropylene group (—$CH(CH_3)CH_2O$— or —$CH_2CH_2CH_2O$—) is preferable, and an oxyethylene group is more preferable.

Examples of the anion of the ammonium salt compound include a halogen atom, sulfonate, borate, and phosphate, and among these, the halogen atom and sulfonate are preferable.

Furthermore, the following compounds are also preferable as a basic compound.

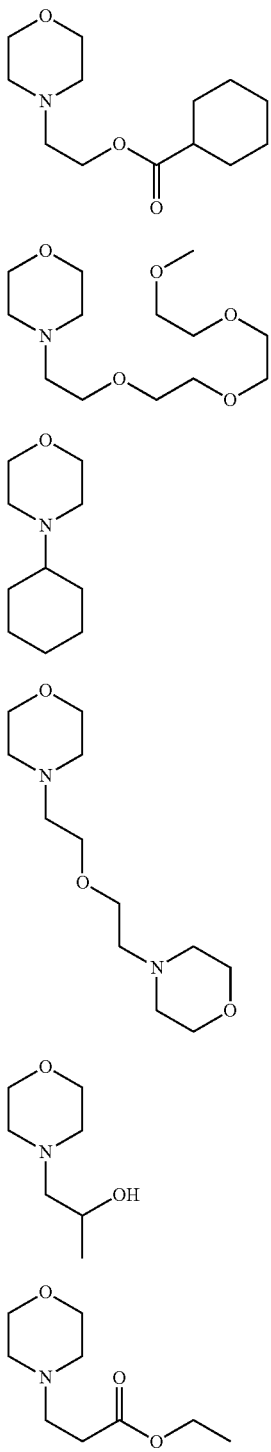

In addition to the compounds as described above, as the basic compound, the compounds described in "0180" to "0225" of JP2011-22560A, "0218" and "0219" of JP2012-137735A, and "0416" to "0438" of WO2011/158687A1, and the like can also be used.

These basic compounds may be used alone or in combination of two or more kinds thereof.

The composition of the present invention may or may not contain the basic compound, and in the case where it contains the basic compound, the content of the basic compound is usually 0.001% by mass to 10% by mass, and preferably 0.01% by mass to 5% by mass, with respect to the solid content of the composition.

The ratio between the acid generator and the basic compound to be used in the composition is preferably the acid generator/basic compound (molar ratio)=2.5 to 300. That is, the molar ratio is preferably 2.5 or more in view of sensitivity and resolution, and is preferably 300 or less in view of suppressing the reduction in resolution due to thickening of the resist pattern with aging after exposure until the heat treatment. The acid generator/basic compound (molar ratio) is more preferably 5.0 to 200, and still more preferably 7.0 to 150.

The low-molecular-weight compound (hereinafter also referred to as a "compound (C)") which has a nitrogen atom and a group capable of leaving by the action of an acid is preferably an amine derivative having a group capable of leaving by the action of an acid on a nitrogen atom.

As the group capable of leaving by the action of an acid, an acetal group, a carbonate group, a carbamate group, a tertiary ester group, a tertiary hydroxyl group, or a hemiaminal ether group are preferable, and a carbamate group or a hemiaminal ether group is particularly preferable.

The molecular weight of the compound (C) is preferably 100 to 1,000, more preferably 100 to 700, and particularly preferably 100 to 500.

The compound (C) may have a carbamate group having a protecting group on a nitrogen atom. The protecting group constituting the carbamate group can be represented by the following General Formula (d-1).

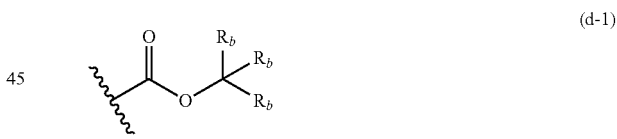

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be bonded to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, structures disclosed in paragraph "0466" of US2012/0135348A1.

It is particularly preferable that the compound (C) is one having a structure represented by the following General Formula (6).

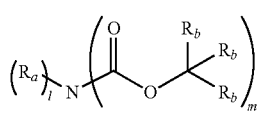

(6)

In General Formula (6), $R_a$ represents a hydrogen atom, an alkyl group, a cycloalkyl group, an aryl group, or an aralkyl group. When l is 2, two $R_a$'s may be the same as or different from each other. Two $R_a$'s may be linked to each other to form a heterocycle together with the nitrogen atom in the formula. The heterocycle may include a hetero atom other than the nitrogen atom in the formula.

$R_b$ has the same meaning as $R_b$ in General Formula (d-1), and preferred examples are also the same.

l represents an integer of 0 to 2, and m represents an integer of 1 to 3, satisfying l+m=3.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (such the alkyl group, cycloalkyl group, aryl group, and aralkyl group may be substituted with the groups as described above) of $R_a$ include the same groups as the specific of examples as described above with respect to $R_b$.

Specific examples of the particularly preferred compound (C) in the present invention include, but are not limited to, the compounds disclosed in paragraph "0475" of US2012/0135348A1.

The compound represented by General Formula (6) can be synthesized in accordance with JP2007-298569A, JP2009-199021A, and the like.

In the present invention, the low-molecular-weight compound (C) having a group capable of leaving by the action of an acid on a nitrogen atom may be used alone or as a mixture of two or more kinds thereof.

The content of the compounds (C) in the composition of the present invention is preferably 0.001% by mass to 20% by mass, more preferably 0.001% by mass to 10% by mass, and still more preferably 0.01% by mass to 5% by mass, with respect to the total solid content of the composition.

The basic compound whose basicity is reduced or lost upon irradiation with actinic ray or radiation (hereinafter also referred to as a "compound (PA)") is a compound which has a functional group with proton acceptor properties, and decomposes upon irradiation with actinic ray or radiation to exhibit deterioration in proton acceptor properties, no proton acceptor properties, or a change from the proton acceptor properties to acid properties.

The functional group with proton acceptor properties refers to a functional group having a group or an electron which is capable of electrostatically interacting with a proton, and for example, means a functional group with a macrocyclic structure, such as a cyclopolyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

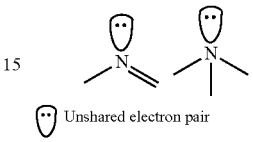

Unshared electron pair

Preferred examples of the partial structure of the functional group with proton acceptor properties include crown ether, azacrown ether, primary to tertiary amine, pyridine, imidazole, and pyrazine structures.

The compound (PA) decomposes upon irradiation with actinic ray or radiation to generate a compound exhibiting deterioration in proton acceptor properties, no proton acceptor properties, or a change from the proton acceptor properties to acid properties. Here, exhibiting deterioration in proton acceptor properties, no proton acceptor properties, or a change from the proton acceptor properties to acid properties means a change of proton acceptor properties due to the proton being added to the functional group with proton acceptor properties, and specifically a decrease in the equilibrium constant at chemical equilibrium when a proton adduct is generated from the compound (PA) having the functional group with proton acceptor properties and the proton.

The proton acceptor properties can be confirmed by carrying out pH measurement. In the present invention, the acid dissociation constant pKa of the compound generated by the decomposition of the compound (PA) upon irradiation with actinic ray or radiation preferably satisfies pKa<−1, more preferably −13<pKa<−1, and still more preferably −13<pKa<3.

In the present invention, the acid dissociation constant pKa indicates an acid dissociation constant pKa in an aqueous solution, and is described, for example, in Chemical Handbook (II) (Revised $4^{th}$ Edition, 1993, compiled by the Chemical Society of Japan, Maruzen Company, Ltd.), and a lower value thereof indicates higher acid strength. Specifically, the pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by the following General Formula (PA-1), for example, as the proton adduct generated by decomposition upon irradiation with actinic ray or radiation. The compound represented by General Formula (PA-1) is a compound exhibiting deterioration in proton acceptor properties, no proton acceptor properties, or a change from the proton acceptor properties to acid properties since the compound has a functional group with proton acceptor properties as well as an acidic group, as compared with the compound (PA).

$$Q\text{-}A\text{-}(X)_n\text{---}B\text{---}R \quad\quad (PA\text{-}1)$$

In General Formula (PA-1),

Q represents —$SO_3H$, —$CO_2H$, or —$W_1NHW_2R_f$, in which $R_f$ represents an alkyl group (preferably having 1 to 20 carbon atoms), a cycloalkyl group (preferably having 3 to 20 carbon atoms), or an aryl group (preferably having 6 to 30 carbon atoms), and $W_1$ and $W_2$ each independently represent —$SO_2$— or —CO—, A represents a single bond or a divalent connecting group, X represents —$SO_2$— or —CO—, n represents 0 or 1, B represents a single bond, an oxygen atom, or —N($R_x$)$R_y$—, in which $R_x$ represents a hydrogen atom or a monovalent organic group, and $R_y$ represents a single bond or a divalent organic group, provided that $R_x$ may be bonded to $R_y$ to form a ring or may be bonded to R to form a ring, and R represents a monovalent organic group having a functional group with proton acceptor properties.

General Formula (PA-1) will be described in more detail.

The divalent linking group in A is preferably a divalent linking group having 2 to 12 carbon atoms, such as and examples thereof include an alkylene group and a phenylene group. The divalent linking group is more preferably an alkylene group having at least one fluorine atom, preferably having 2 to 6 carbon atoms, and more preferably having 2 to 4 carbon atoms. The alkylene chain may contain a linking group such as an oxygen atom and a sulfur atom. In particular, the alkylene group is preferably an alkylene group in which 30% to 100% by number of the hydrogen atoms are substituted with fluorine atoms is preferable, and more preferably, the carbon atom bonded to the Q site has a fluorine atom. The alkylene group is still more preferably a perfluoroalkylene group, and even still more preferably a perfluoroethylene group, a perfluoropropylene group, or a perfluorobutylene group.

The monovalent organic group in $R_x$ is preferably an organic group having 1 to 30 carbon atoms, and examples thereof include an alkyl group, a cycloalkyl group, an aryl group, an aralkyl group, and an alkenyl group. These groups may further have a substituent.

The alkyl group in $R_x$ may have a substituent, is preferably a linear and branched alkyl group having 1 to 20 carbon atoms, and may have an oxygen atom, a sulfur atom, or a nitrogen atom in the alkyl chain.

The cycloalkyl group in $R_x$ may have a substituent, is preferably a monocyclic cycloalkyl or polycyclic cycloalkyl group having 3 to 20 carbon atoms, and may have an oxygen atom, a sulfur atom, or a nitrogen atom in the ring.

The aryl group in $R_x$ may have a substituent, is preferably an aryl group having 6 to 14 carbon atoms, and examples thereof include a phenyl group and a naphthyl group.

The aralkyl group in $R_x$ may have a substituent, is preferably an aralkyl group having 7 to 20 carbon atoms, and examples thereof include a benzyl group and a phenethyl group.

The alkenyl group in $R_x$ may have a substituent and may be linear, branched, or chained. The alkenyl group is preferably an alkenyl group having 3 to 20 carbon atoms. Examples of the alkenyl group include a vinyl group, an allyl group, and a styryl group.

Examples of a substituent in the case where $R_x$ further has a substituent include a halogen atom, a linear, branched, or cyclic alkyl group, an alkenyl group, an alkanyl group, an aryl group, an acyl group, an alkoxycarbonyl group, an aryloxycarbonyl group, a carbamoyl group, a cyano group, a carboxyl group, a hydroxyl group, an alkoxy group, an aryloxy group, an alkylthio group, an arylthio group, a heterocyclic oxy group, an acyloxy group, an amino group, a nitro group, a hydrazino group, and a heterocyclic group.

Preferred examples of the divalent organic group in $R_y$ include an alkylene group.

Examples of the ring structure which may be formed by the mutual bonding of $R_x$ and $R_y$ include 5-to 10-membered rings, and particularly preferably a 6-membered ring, which include a nitrogen atom.

The functional group with proton acceptor properties in R is the same as above, and examples thereof include groups having a nitrogen-containing heterocyclic aromatic structure, such as azacrown ether, primary to tertiary amine, pyridine, and imidazole.

The organic group having such a structure is preferably an organic group having 4 to 30 carbon atoms, and examples thereof include an alkyl group, a cycloalkyl group, an aryl group, an aralkyl group, and an alkenyl group.

The alkyl group, the cycloalkyl group, the aryl group, the aralkyl group, or the alkenyl group containing a functional group with proton acceptor properties or an ammonium group in R is the same as the alkyl group, the cycloalkyl group, the aryl group, the aralkyl group, or the alkenyl group as mentioned as R.

When B is —N($R_x$)$R_y$—, it is preferable that R and $R_x$ are bonded to each other to form a ring. The formation of a ring structure improves the stability and enhances the storage stability of a composition using the same. The number of carbon atoms which form a ring is preferably 4 to 20, the ring may be monocyclic or polycyclic, and an oxygen atom, and a sulfur atom, or a nitrogen atom may be included in the ring.

Examples of the monocyclic structure include a 4-membered ring, a 5-membered ring, a 6-membered ring, a 7-membered ring, and a 8-membered ring, each including a nitrogen atom, or the like. Examples of the polycyclic structure include structures formed by a combination of two, or three or more monocyclic structures.

$R_f$ of —$W_1NHW_2R_f$ represented by Q is preferably an alkyl group having 1 to 6 carbon atoms, which may have a fluorine atom, and more preferably a perfluoroalkyl group having 1 to 6 carbon atoms. Further, it is preferable that at least one of $W_1$ or $W_2$ is —$SO_2$—, with a case where both $W_1$ and $W_2$ are —$SO_2$— being more preferable.

Q is particularly preferably —$SO_3H$ or —$CO_2H$ from the viewpoint of the hydrophilicity of an acid group.

The compound represented by General Formula (PA-1) in which Q moiety is sulfonic acid can be synthesized by a common sulfonamidation reaction. For example, the compound can be obtained by a method in which one sulfonyl halide moiety of a bissulfonyl halide compound is selectively reacted with an amine compound after forming a sulfonamide bond, and the another sulfonyl halide moiety thereof is hydrolyzed, or a method in which cyclic sulfonic acid anhydride is reacted with an amine compound to cause ring opening.

The compound (PA) is preferably an ionic compound. The functional group with proton acceptor properties may be contained in an anion moiety or a cation moiety, and it is preferable that the functional group is contained in an anion moiety.

Preferred examples of the compound (PA) include compounds represented by the following General Formulae (4) to (6).

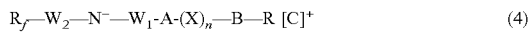  (4)

  (5)

  (6)

In General Formulae (4) to (6), A, X, n, B, R, $R_f$, $W_1$, and $W_2$ each have the same definitions as those in General Formula (PA-1).

$C^+$ represents a counter cation.

The counter cation is preferably an onium cation. More specifically, preferred examples thereof include the sulfonium cations described as $S^+(R_{201})(R_{202})(R_{203})$ in General Formula (ZI) and the iodonium cations described as $I^+(R_{204})(R_{205})$ in General Formula (ZII) with regard to the acid generator.

Specific examples of the compound (PA) include the compounds exemplified in "0280" of US2011/0269072A1.

Furthermore, in the present invention, compounds (PA) other than the compound capable of generating the compound represented by General Formula (PA-1) can also be appropriately selected. For example, a compound which is an ionic compound and contains a proton acceptor moiety at its cation moiety may be used. More specifically, examples thereof include a compound represented by the following General Formula (7).

  (7)

In the formula, A represents a sulfur atom or an iodine atom, m represents 1 or 2 and n represents 1 or 2, provided that m+n=3 when A is a sulfur atom and that m+n=2 when A is an iodine atom, R represents an aryl group, $R_N$ represents an aryl group substituted with the functional group with proton acceptor properties, and $X^-$ represents a counter anion.

Specific examples of $X^-$ include the same anions as those of the anion of the acid generator.

Specific preferred examples of the aryl group of R and $R_N$ include a phenyl group.

Specific examples of the functional group with proton acceptor properties contained in $R_N$ are the same as those of the functional group with proton acceptor properties in Formula (PA-1) above.

Specific examples of the ionic compounds having a proton acceptor site at a cationic moiety include the compounds exemplified in "0291" of US2011/0269072A1.

Furthermore, such compounds can be synthesized, for example, with reference to the methods described in JP2007-230913A, JP2009-122623A, and the like.

The compound (PA) may be used alone or in combination of two or more kinds thereof.

The content of the compound (PA) is preferably 0.1% by mass to 10% by mass, and more preferably 1% by mass to 8% by mass, with respect to the total solid content of the composition.

In the composition of the present invention, an onium salt which becomes a relatively weak acid with respect to the acid generator can be used as an acid diffusion control agent.

In the case of mixing the acid generator and an onium salt generating an acid which is a relatively weak acid with respect to the acid generated from the acid generator, and using the mixture, when the acid generated from the acid generator upon irradiation with actinic ray or radiation collides with an onium salt having an unreacted weak acid anion, a weak acid is discharged by salt exchange to generate an onium salt having a strong acid anion. In this process, the strong acid is exchanged with a weak acid having a lower catalytic ability, and therefore, the acid is deactivated in appearance, and thus, it is possible to carry out the control of acid diffusion.

As the onium salt which becomes a relatively weak acid with respect to the acid generator, compounds represented by the following General Formulae (d1-1) to (d1-3) are preferable.

  (d1-1)

  (d1-2)

  (d1-3)

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group including a fluorine atom, and $M^+$'s are each independently a sulfonium or iodonium cation.

Preferred examples of the sulfonium cation or the iodonium cation represented by $M^+$ include the sulfonium cations represented by General Formula (ZI) and the iodonium cations represented by General Formula (ZII).

Preferred examples of the anionic moiety of the compound represented by General Formula (d1-1) include the structures exemplified in paragraph "0198" of JP2012-242799A.

Preferred examples of the anionic moiety of the compound represented by General Formula (d1-2) include the structures exemplified in paragraph "0201" of JP2012-242799A.

Preferred examples of the anionic moiety of the compound represented by General Formula (d1-3) include the structures exemplified in paragraphs "0209" and "0210" of JP2012-242799A.

The onium salt which becomes a relatively weak acid with respect to the acid generator may be a compound (C) (hereinafter also referred to as a "compound (CA)") which has a cationic moiety and an anionic moiety in the same molecule, and further, the cationic moiety and the anionic moiety are linked to each other via a covalent bond.

As the compound (CA), a compound represented by any one of the following General Formulae (C-1) to (C-3) is preferable.

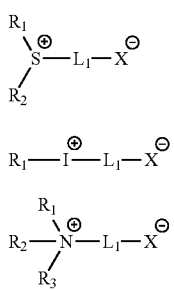

In General Formulae (C-1) to (C-3), $R_1$, $R_2$, and $R_3$ represent a substituent having 1 or more carbon atoms, $L_1$ represents a divalent linking group that links a cationic moiety with an anionic moiety, or a single bond, —$X^-$ represents an anionic moiety selected from —COO$^-$, —SO$_3^-$, —SO$_2^-$, and —N$^-$R$_4$. $R_4$ represents a monovalent substituent having a carbonyl group: —C(=O)—, a sulfonyl group: —S(=O)$_2$—, or a sulfinyl group: —S(=O)— at a site for linking to an adjacent N atom, and $R_1$, $R_2$, $R_3$, $R_4$, and $L_1$ may be bonded to one another to form a ring structure. Further, in (C-3), two of $R_1$ to $R_3$ may be combined to form a double bond with an N atom.

Examples of the substituent having 1 or more carbon atoms in $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, an ester bond, an amide bond, an urethane bond, an urea bond, and a group formed by a combination of two or more kinds of these groups. $L_1$ is more preferably alkylene group, an arylene group, an ether bond, an ester bond, and a group formed by a combination of two or more kinds of these groups.

Preferred examples of the compound represented by General Formula (C-1) include the compounds exemplified in paragraphs "0037" to "0039" of JP2013-6827A and paragraphs "0027" to "0029" of JP2013-8020A.

Preferred examples of the compound represented by General Formula (C-2) include the compounds exemplified in paragraphs "0012" and "0013" of JP2012-189977A.

Preferred examples of the compound represented by General Formula (C-3) include the compounds exemplified in paragraphs "0029" to "0031" of JP2012-252124A.

The content of the onium salt which becomes a relatively weak acid with respect to the acid generator is preferably 0.5% by mass to 10.0% by mass, more preferably 0.5% by mass to 8.0% by mass, and still more preferably 1.0% by mass to 8.0% by mass, with respect to the solid content of the composition.

[5] Solvent

The composition of the present invention usually contains a solvent.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Specific examples of these solvents include those described in "0441" to "0455" of US2008/0187860A.

In the present invention, a mixed solvent obtained by mixing a solvent containing a hydroxyl group and a solvent containing no hydroxyl group in the structure may be used as the organic solvent.

As the solvent containing a hydroxyl group and the solvent containing no hydroxyl group, the aforementioned exemplary compounds can be appropriately selected and used, and as the solvent containing a hydroxyl group, alkylene glycol monoalkyl ether, alkyl lactate, and the like are preferable, and propylene glycol monomethyl ether (PGME, alternative name: 1-methoxy-2-propanol) and ethyl lactate are more preferable. Further, as the solvent containing no hydroxyl group, alkylene glycol monoalkyl ether acetate, alkyl alkoxy propionate, a monoketone compound which may contain a ring, cyclic lactone, alkyl acetate, and the like are preferable. Among these, propylene glycol monomethyl ether acetate (PGMEA, alternative name: 1-methoxy-2-acetoxypropane), ethyl ethoxypropionate, 2-heptanone, γ-butyrolactone, cyclohexanone, and butyl acetate are particularly preferable, and propylene glycol monomethyl ether acetate, ethyl ethoxypropionate, and 2-heptanone are most preferable.

The mixing ratio (based on the mass) of the solvent containing a hydroxyl group and the solvent containing no hydroxyl group is 1/99 to 99/1, preferably 10/90 to 90/10, and more preferably 20/80 to 60/40. A mixed solvent whose proportion of the solvent containing no hydroxyl group is 50% by mass or more is particularly preferable from the viewpoint of coating evenness.

The solvent is preferably one including propylene glycol monomethyl ether acetate, and is more preferably a solvent composed of propylene glycol monomethyl ether acetate alone or a mixed solvent of two or more kinds of solvents containing propylene glycol monomethyl ether acetate.

[6] Surfactant

The composition of present invention may or may not further contain a surfactant, and in the case where the composition contains a surfactant, it is more preferable that the composition contains any one of fluorine- and/or silicon-based surfactants (a fluorine-based surfactant, a silicon-based surfactant, and a surfactant having both a fluorine atom and a silicon atom), or two or more kinds thereof.

By incorporating the surfactant into the composition of the present invention, it becomes possible to provide a resist pattern which is improved in adhesion and decreased in development defects with good sensitivity and resolution when an exposure light source of 250 nm or less, and particularly 220 nm or less, is used.

Examples of the fluorine- and/or silicon-based surfactants include the surfactants described in paragraph "0276" of US2008/0248425A.

In addition, in the present invention, a surfactant other than the fluorine- and/or silicon-based surfactants described in paragraph "0280" of US2008/0248425A can also be used.

These surfactants may be used alone or in combination of some kinds thereof.

In the case where the composition of the present invention contains a surfactant, the amount of the surfactant used is preferably 0.0001% by mass to 2% by mass, and more preferably 0.0005% by mass to 1% by mass, with respect to the total solid content of the composition.

On the other hand, by setting the amount of the surfactant added to 10 ppm or less with respect to the total amount (excluding the solvent) of the composition, the hydrophobic resin is more unevenly distributed to the surface, so that the resist film surface can be made more hydrophobic, which can enhance the water tracking properties during the liquid immersion exposure.

[7] Other Additives

The composition of the present invention may or may not contain an onium carboxylate salt. Examples of such an onium carboxylate salt include those described in "0605" to "0606" of US2008/0187860A.

The onium carboxylate salt can be synthesized by reacting sulfonium hydroxide, iodonium hydroxide, ammonium hydroxide, and carboxylic acid with silver oxide in a suitable solvent.

In the case where the composition of the present invention contains an onium carboxylate salt, the content of the salt is generally 0.1% by mass to 20% by mass, preferably 0.5% by mass to 10% by mass, and more preferably 1% by mass to 7% by mass, with respect to the total solids of the composition.

The composition of the present invention may further contain an acid amplifier, a dye, a plasticizer, a light sensitizer, a light absorbent, an alkali-soluble resin, a dissolution inhibitor, a compound promoting solubility in a developer (for example, a phenol compound with a molecular weight of 1,000 or less, and an alicyclic or an aliphatic compound having a carboxyl group), and the like, if desired.

Such a phenol compound having a molecular weight of 1,000 or less may be easily synthesized by those skilled in the art with reference to the method disclosed in, for example, JP1992-122938A (JP-H04-122938A), JP1990-28531A (JP-H02-28531A), U.S. Pat. No. 4,916,210A, EP219294B, and the like.

Specific examples of the alicyclic or aliphatic compound having a carboxyl group include, but not limited to, a carboxylic acid derivative having a steroid structure, such as cholic acid, deoxycholic acid, and lithocholic acid, an adamantane carboxylic acid derivative, adamantane dicarboxylic acid, cyclohexane carboxylic acid, and cyclohexane dicarboxylic acid.

The composition of the present invention is preferably a resist film having a film thickness of 80 nm or less from the viewpoint of improving the resolving power. It is possible to set the film thickness by setting the solid content concentration in the composition to an appropriate range to have suitable viscosity to improve coatability and film formability.

The solid content concentration of the composition in the present invention is usually 1.0% by mass to 10% by mass, preferably 2.0% by mass to 5.7% by mass, and more preferably 2.0% by mass to 5.3% by mass. By setting the solid content concentration to these ranges, it is possible to uniformly apply the resist solution on a substrate, and additionally, it is possible to form a resist pattern with excellent line-width-roughness. The reason is not clear; however, it is considered that, by setting the solid content concentration to 10% by mass or less, and preferably 5.7% by mass or less, the aggregation of materials, particularly the photoacid generator, in the resist solution is suppressed and, as the result, it is possible to form a uniform resist film.

The solid content concentration is a weight percentage of the weight of other resist components excluding the solvent with respect to the total weight of the composition.

The composition of the present invention is used by dissolving the components in a predetermined organic solvent, and preferably in the mixed solvent, filtering the solution through a filter, and then applying the filtered solution on a predetermined support (substrate). The filter used for filtration using a filter is preferably a polytetrafluoroethylene-, polyethylene-, or nylon-made filter having a pore size of 0.1 µm or less, more preferably 0.05 µm or less, and still more preferably 0.03 µm or less. In the filtration through a filter, as described in, for example, JP2002-62667A, circulating filtration may be carried out, or the filtration may be carried out by connecting two or more kinds of filters in series or in parallel. In addition, the composition may be filtered a plurality of times. Furthermore, the composition may be subjected to a deaeration treatment or the like before or after filtration through a filter.

The composition of the present invention is related to an actinic ray-sensitive or radiation-sensitive resin composition whose properties change by a reaction upon irradiation with actinic ray or radiation. More specifically, the present invention relates to an actinic ray-sensitive or radiation-sensitive resin composition which can be used in for a process for manufacturing a semiconductor such as an IC, for the manufacture of a circuit board for a liquid crystal, a thermal head, or the like, the manufacture of a mold structure for imprinting, or other photofabrication processes, or used in a lithographic printing plate or an acid-curable composition.

[8] Pattern Forming Method

Next, the pattern forming method according to the present invention will be described.

The pattern forming method of the present invention has at least the following steps:

(a) a step of forming a film on a substrate using the composition of the present invention (an actinic ray-sensitive or radiation-sensitive resin composition film, a composition film, or a resist film), (b) a step of irradiating (exposing) the film with actinic ray or radiation (exposing step), and (c) a step of developing the film irradiated with actinic ray or radiation using a developer (developing step).

The exposure in the step (b) may be a liquid immersion exposure.

The pattern forming method of the present invention preferably includes a (d) heating step after the (b) exposing step.

The pattern forming method of the present invention may include the (b) exposing step in plural times.

The pattern forming method of the present invention may include the (d) heating step in plural times.

The resist film of the present invention is formed of the composition of the present invention, and more specifically, is preferably a film which is formed by applying the composition on a substrate. In the pattern forming method of the present invention, it is possible to carry out a step of forming a film on a substrate using the composition, a step of exposing the film, and a developing step by a general known method.

The substrate on which the film is formed in the present invention is not particularly limited, and it is possible to use an inorganic substrate such as silicon, $SiO_2$, and SiN, a coating type inorganic substrate such as SOG, or a substrate generally used in a process for manufacturing a semiconductor such as an IC, in a process for the manufacture of a circuit board for a liquid crystal, a thermal head, or the like, and used in other lithographic processes of photofabrication. Further, if desired, an antireflection film may be formed between the resist film and the substrate. As the antireflection film, a known organic or inorganic antireflection film can be appropriately used.

It is also preferable that the method includes a pre-heating step (PB; Prebake) after forming a film and before the exposing step.

In addition, it is also preferable that the method includes a step of heating after exposure (PEB: Post Exposure Bake), after the exposing step and before the development step.

For both PB and PEB, the heating is preferably carried out at a heating temperature of 70° C. to 130° C., and more preferably 80° C. to 120° C.

The heating time is preferably 30 seconds to 300 seconds, more preferably 30 seconds to 180 seconds, and still more preferably 30 seconds to 90 seconds.

The heating may be carried out using a device installed in an ordinary exposure-and-development machine, or may also be carried out using a hot plate or the like.

The baking accelerates the reaction in the exposed areas, and thus, the sensitivity and the pattern profile are enhanced.

The light source wavelength used in the exposure device in the present invention is not particularly limited, and examples thereof include infrared rays, visible light, ultraviolet rays, far ultraviolet rays, extreme ultraviolet rays, X-rays, and electron beams, for example, far ultraviolet rays at a wavelength of preferably 250 nm or less, more preferably 220 nm or less, and particularly preferably 1 nm to 200 nm, specifically a KrF excimer laser (248 nm), an ArF excimer laser (193 nm), an $F_2$ excimer laser (157 nm), X-rays, EUV (13 nm), electron beams, and the like, with the KrF excimer laser, the ArF excimer laser, EUV, or the electron beams being preferable, and the ArF excimer laser being more preferable.

Furthermore, a liquid immersion exposure method can be applied to the step of carrying out exposure of the present invention. It is possible to combine the liquid immersion exposure method with super-resolution technology such as a phase shift method and a modified illumination method.

In the case of carrying out the liquid immersion exposure, a step of cleaning the surface of a film with an aqueous chemical liquid may be carried out (1) after forming a film on a substrate and before an exposing step, and/or (2) after a step of subjecting the film to exposure through an immersion liquid and before heating the film.

The immersion liquid is preferably a liquid which is transparent to exposure wavelength and has a minimum temperature coefficient of refractive index so as to minimize the distortion of an optical image projected on the film. In particular, in the case where the exposure light source is an ArF excimer laser (wavelength: 193 nm), water is preferably used in terms of easy availability and easy handling, in addition to the above-described viewpoints.

In the case of using water, an additive (liquid) that decreases the surface tension of water while increasing the interfacial activity may be added at a slight proportion. It is preferable that this additive does not dissolve the resist film of a wafer, and gives a negligible effect on the optical coat at the undersurface of a lens element.

Such an additive is preferably for example, an aliphatic alcohol having a refractive index substantially equal to that of water, and specific examples thereof include methyl alcohol, an ethyl alcohol, and isopropyl alcohol. By adding an alcohol having a refractive index substantially equal to that of water, even when the alcohol component in water is evaporated and its content concentration is changed, an advantage in that the change in the refractive index of the liquid as a whole can be advantageously made very small is obtained.

On the other hand, in the case where materials opaque to light at 193 nm or impurities having a great difference in the refractive index from water are incorporated, the distortion of an optical image projected on a resist is caused. Therefore, the water to be used is preferably distilled water. Further, pure water after filtration through an ion exchange filter or the like may also be used.

The electrical resistance of water used as the immersion liquid is preferably 18.3 MΩcm or more, and Total Organic Concentration (TOC) is preferably 20 ppb or less. The water is preferably one which has been subjected to a deaeration treatment.

In addition, the lithography performance can be enhanced by increasing the refractive index of the immersion liquid. From such a viewpoint, an additive for increasing the refractive index, for example, may be added to water, or heavy water ($D_2O$) may be used in place of water.

The receding contact angle of the resist film formed using the composition in the present invention is preferably 70° or more at a temperature of 23±3° C. at a humidity of 45±5%, which is appropriate in the case of the exposure through a liquid immersion medium. The receding contact angle is preferably 75° or more, and more preferably 75° to 85°.

If the receding contact angle is extremely small, the resist film cannot be appropriately used in the case of the exposure through a liquid immersion medium. Further, it is not possible to sufficiently exhibit the effect of reducing defects due to remaining water (water marks). In order to realize a favorable receding contact angle, it is preferable to incorporate the hydrophobic resin (D) into the composition. Alternatively, a film (hereinafter also referred to as a "top coat") sparingly soluble in an immersion liquid formed of the hydrophobic resin (D) may be provided on the upper layer of the resist film. The functions required for the top coat are coating suitability with respect to the upper layer part on a resist film and sparingly soluble properties in an immersion liquid. The top coat which is not mixed with a composition film and can be uniformly applied on the upper layer of the composition film is preferable.

Specific examples of the top coat include a hydrocarbon polymer, an acrylic acid ester polymer, a polymethacrylic acid, a polyacrylic acid, a polyvinyl ether, a silicon-containing polymer, and a fluorine-containing polymer. From the viewpoint that the optical lens is contaminated when impurities are eluted from the top coat to the immersion liquid, it is preferable that the amounts of residual monomer components of the polymer included in the top coat are small.

When the top coat is peeled off, a developer may be used or a separate peeling agent may be used. As the peeling agent, a solvent having low penetration into the film is preferable. From the viewpoint that the peeling step can be carried out at the same time with the developing step the film, it is preferable that the top coat can be peeled off by the developer containing an organic solvent.

When there is no difference in the refractive index between the top coat and the immersion liquid, the resolving power is improved. In the case where water is used as the immersion liquid, it is preferable that the top coat has a refractive index close to the refractive index of the immersion liquid. From the viewpoint of setting the refractive index close to that of the immersion liquid, it is preferable that the top coat has a fluorine atom. Further, from the viewpoint of the transparency and the refractive index, the top coat is preferably a thin film.

It is preferable that the top coat is not mixed with the film nor with the immersion liquid. From this viewpoint, in the case where the immersion liquid is water, it is preferable that the solvent used for the top coat is sparingly soluble in the solvent used for the composition of the present invention and is a water-insoluble medium. In addition, in the case where the immersion liquid is an organic solvent, the top coat may be water-soluble or water-insoluble.

In the case of the liquid immersion exposure, formation of the top coat layer is not limited, and may also be carried out in the case of dry exposure (exposure not through an immersion liquid). By forming the top coat layer, for example, generation of outgases can be inhibited.

Hereinafter, the top coat composition used for formation of the top coat layer will be described.

For the top coat composition in the present invention, the solvent is preferably an organic solvent, and more preferably an alcohol-based solvent.

In the case where the solvent is an organic solvent, the solvent which does not dissolve the resist film is preferable. As the usable solvent, an alcohol-based solvent, a fluorine-based solvent, or a hydrocarbon-based solvent is preferably used, and a non-fluorine-based and alcohol-based solvent is more preferably used. Among the alcohol-based solvents, from the viewpoint of coatability, a primary alcohol is preferable, and a primary alcohol having 4 to 8 carbon atoms is more preferable. As the primary alcohol having 4 to 8 carbon atoms, a linear, branched, or cyclic alcohol can be used, and preferred examples thereof include 1-butanol, 1-hexanol, 1-pentanol, 3-methyl-1-butanol, 2-ethylbutanol, and perfluorobutyl tetrahydrofuran.

Furthermore, as the resin for a top coat composition, the resins containing acid groups described in JP2009-134177A and JP2009-91798A can also be preferably used.

The weight-average molecular weight of the water-soluble resin is not particularly limited, and is preferably 2,000 to 1,000,000, more preferably 5,000 to 500,000, and particularly preferably 10,000 to 100,000. Herein, the weight-average molecular weight of the resin refers to a polystyrene-equivalent molecular weight measured by GPC (carrier: THF or N-methyl-2-pyrrolidone (NMP)).

The pH of the top coat composition is not particularly limited, and is preferably 0 to 10, more preferably 0 to 8, and particularly preferably 1 to 7.

The concentration of the resin in the top coat composition is preferably 0.1% by mass to 10% by mass, more preferably 0.2% by mass to 5% by mass, and particularly preferably 0.3% by mass to 3% by mass.

The top coat material may include components other than the resin, and the proportion of the resin occupying the solid content of the top coat composition is preferably 80% by mass to 100% by mass, more preferably 90% by mass to 100% by mass, and particularly preferably 95% by mass to 100% by mass.

The solid content concentration in the top coat composition in the present invention is preferably 0.1% by mass to 10% by mass, more preferably 0.2% by mass to 6% by mass, and still more preferably 0.3% by mass to 5% by mass. By setting the solid content concentration to the range, the top coat composition can be uniformly coated on the resist film.

In the pattern forming method of the present invention, a resist film can be formed on a substrate using the composition, and a top coat layer can also be formed on the resist film using the top coat composition. The film thickness of the resist film is preferably 10 nm to 100 nm, and the film thickness of the top coat layer is preferably 10 nm to 200 nm, more preferably 20 nm to 100 nm, and particularly preferably 40 nm to 80 nm.

The method for coating the composition on a substrate is preferably spin coating, and the rotation speed is preferably 1,000 rpm to 3,000 rpm.

For example, the composition is coated on a substrate (e.g.: silicon/silicon dioxide coating), such as one for use in the manufacture of precision integrated circuit elements, by appropriate coating means, such as a spinner and a coater, and dried, thereby forming a resist film. Further, a heretofore known antireflection film can also be coated in advance. In addition, it is preferable that the resist film is dried before the top coat layer is formed.

Then, the top coat composition can be coated and dried on the obtained resist film in the same manner as in the method for forming the resist film, thereby forming a top coat layer.

The resist film having the top coat layer provided on the upper layer thereof is exposed, usually through a mask, to actinic ray or radiation, preferably baked (heated), and developed. Thus, a good pattern can be obtained.

In the liquid immersion exposing step, the immersion liquid needs to move on a wafer following the movement of an exposure head that scans on the wafer at a high speed and forms an exposure pattern, and thus the contact angle of the immersion liquid for the resist film in a dynamic state is important, and the resist requires a performance of following the high-speed scanning of the exposure head, while a liquid droplet no longer remains.

A developer for use in the step of developing the actinic ray-sensitive or radiation-sensitive composition film formed using the resin composition of the present invention is not particularly limited, but, for example, an alkali developer or a developer containing an organic solvent (hereinafter also referred to as an organic developer) can also be used.

As the alkali developer, an alkaline aqueous solution containing, for example, an inorganic alkali such as sodium hydroxide, potassium hydroxide, sodium carbonate, sodium silicate, sodium metasilicate, and aqueous ammonia; a primary amine such as ethylamine and n-propylamine, a secondary amine such as diethylamine and di-n-butylamine, a tertiary amine such as triethylamine and methyldiethylamine; an alcoholamine such as dimethylethanolamine and triethanolamine; a tetraalkylammonium hydroxide such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, triamylammonium hydroxide, and dibutylammonium hydroxide; a quaternary ammonium salt such as trimethylphenylammonium hydroxide, trimethylbenzylammonium hydroxide, and triethylbenzylammonium hydroxide; or a cycloamine such as pyrrole and piperidine can be used. Further, an appropriate amount of alcohols or a surfactant can be added to the alkaline aqueous solution and the mixture can be used. The alkali concentration of the alkali developer is usually 0.1% by mass to 20% by mass. The pH of the alkali developer is usually 10.0 to 15.0. The alkali concentration and the pH of the alkali developer can be appropriately adjusted and used. A surfactant or an organic solvent is added to the alkali developer and the mixture is used.

As the rinsing liquid in the rinse treatment carried out after the alkali development, pure water is used, and further, an appropriate amount of a surfactant can also be added thereto and used.

In addition, after the development treatment or the rinse treatment, a treatment of removing the developer or rinsing liquid adhering on the pattern by a supercritical fluid can be carried out.

As the organic developer, a polar solvent such as a ketone-based solvent, an ester-based solvent, an alcohol-based solvent, an amide-based solvent, and an ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; a glycol-based solvent such as ethylene glycol, diethylene glycol, and triethylene glycol; and a glycol ether-based solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethyl butanol.

Examples of the ether-based solvent include, in addition to the glycol ether-based solvents, dioxane and tetrahydrofuran.

As the amide-based solvent, N-methyl-2-pyrrolidone, N,N-dimethylacetamide, N,N-dimethylformamide, hexamethylphosphoric triamide, 1,3-dimethyl-2-imidazolidinone, and the like can be used.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing it with a solvent other than those described above or with water. However, in order to sufficiently bring out the effects of the present invention, the water content ratio in the entire developer is preferably less than 10% by mass, and it is more preferable that the developer contains substantially no water.

That is, the amount of the organic solvent used with respect to the organic developer is preferably 90% by mass to 100% by mass, and more preferably 95% by mass to 100% by mass, with respect to the entire amount of the developer.

Particularly, the organic developer is preferably a developer containing at least one kind of organic solvent selected from the group consisting of a ketone-based solvent, an ester-based solvent, an alcohol-based solvent, an amide-based solvent, and an ether-based solvent.

The vapor pressure of the organic developer is preferably 5 kPa or less, more preferably 3 kPa or less, and particularly preferably 2 kPa or less, at 20° C. By setting the vapor pressure of the organic developer to 5 kPa or less, the evaporation of the developer on a substrate or in a development cup is inhibited, and the temperature uniformity within a wafer plane is improved, whereby the dimensional uniformity within a wafer plane is enhanced.

An appropriate amount of a surfactant may be added to the organic developer, if desired.

The surfactant is not particularly limited, and for example, an ionic or nonionic, fluorine- and/or silicon-based surfactant can be used. Examples of such a fluorine- and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720A, 5,360,692A, 5,529,881A, 5,296,330A, 5,436,098A, 5,576,143A, 5,294,511A, and 5,824,451A, with the nonionic surfactant being preferable. The nonionic surfactant is not particularly limited, and the fluorine-based surfactant or the silicon-based surfactant is more preferably used.

The amount of the surfactant used is usually 0.001% by mass to 5% by mass, preferably 0.005% by mass to 2% by mass, and more preferably 0.01% by mass to 0.5% by mass, with respect to the total amount of the developer.

The organic developer may also include a basic compound. Specific examples of the basic compound which may included in the organic developer used in the present invention, and preferred examples thereof are the same as those for the basic compounds which can be included in the composition described above as an acid diffusion inhibitor.

As the developing method, for example, a method in which a substrate is immersed in a tank filled with a developer for a certain period of time (a dip method), a method in which a developer is heaped up to the surface of a substrate by surface tension and developed by resting for a certain period of time (a paddle method), a method in which a developer is sprayed on the surface of a substrate (a spray method), a method in which a developer is continuously discharged on a substrate spun at a constant rate while scanning a developer discharging nozzle at a constant rate (a dynamic dispense method), or the like, can be applied.

In the case where the various developing methods include a process of discharging a developer toward a resist film from a development nozzle of a developing device, the discharge pressure of the developer discharged (the flow velocity per unit area of the developer discharged) is preferably 2 mL/sec/mm$^2$ or less, more preferably 1.5 mL/sec/mm$^2$ or less, and still more preferably 1 mL/sec/mm$^2$ or less. The flow velocity has no particular lower limit, and is preferably 0.2 mL/sec/mm$^2$ or more in consideration of throughput.

By setting the discharge pressure of the discharged developer to the aforementioned range, pattern defects resulting from the resist scum after development may be significantly reduced.

Although details on the mechanism are not clear, it is thought to be due to a fact that the pressure imposed on the resist film by the developer is decreased by setting the discharge pressure to the above range so that the resist film and the resist pattern are inhibited from being inadvertently cut or collapsing.

Furthermore, the discharge pressure (mL/sec/mm$^2$) of the developer is a value at the outlet of the development nozzle in the developing device.

Examples of the method for adjusting the discharge pressure of the developer include a method of adjusting the discharge pressure by a pump or the like, and a method of supplying a developer from a pressurized tank and adjusting the pressure to change the discharge pressure.

In addition, after the step of carrying out development using a developer including an organic solvent, a step of stopping the development while replacing the solvent with another solvent may also be carried out.

In the pattern forming method of the present invention, a step of developing with a developer including an organic solvent (organic solvent developing step) and a step of developing with an alkaline aqueous solution (alkali developing step) is used. Thus, a finer pattern can be formed.

In the present invention, areas with low exposure intensity are removed by the organic solvent developing step, while areas with high exposure intensity are removed by the alkali developing step. Thus, this multi-development process in which development is carried out two or more times can realize pattern formation while not dissolving only areas with intermediate exposure intensity, and therefore, finer patterns than usually can be formed (in the same mechanism as described in "0077" of JP2008-292975A).

In the pattern forming method of the present invention, the order of the alkali developing step and organic solvent developing step is not particularly limited, and it is more preferable that the alkali development is carried out before the organic solvent developing step.

It is preferable that a cleaning step using a rinsing liquid is included after the step of performing development using a developer including an organic solvent.

The rinsing liquid used in the rinsing step after the step of carrying out development using a developer including an organic solvent is not particularly limited as long as the rinsing liquid does not dissolve the resist pattern, and a solution including a general organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same as those described above with regard to the developer including an organic solvent.

After the step of carrying out development using a developer including an organic solvent, a cleaning step using a rinsing liquid containing at least one organic solvent selected from the group consisting of a ketone-based solvent, an ester-based solvent, an alcohol-based solvent, and an amide-based solvent is more preferably carried out, a cleaning step using a rinsing liquid containing an alcohol-based solvent or an ester-based solvent is still more preferably carried out, a cleaning step using a rinsing liquid containing a monohydric alcohol is particularly preferably carried out, and a cleaning step using a rinsing liquid containing a monohydric alcohol having 5 or more carbon atoms is most preferably carried out.

Here, examples of the monohydric alcohol used in the rinsing step include a linear, branched, or cyclic monohydric alcohol, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like can be used, and as a particularly preferred monohydric alcohol having 5 or more carbon atoms, 1-hexanol, 2-hexanol, 4-methyl-2-pentanol, 1-pentanol, 3-methyl-1-butanol, or the like can be used.

The respective components in plural numbers may be mixed or the components with another organic solvent may be mixed and used.

The water content of the rinsing liquid is preferably 10% by mass or less, more preferably 5% by mass or less, and particularly preferably 3% by mass or less. By setting the water content to 10% by mass or less, good development characteristics can be obtained.

The vapor pressure of the rinsing liquid which is used after the step of carrying out development using a developer including an organic solvent is preferably from 0.05 kPa to 5 kPa, more preferably from 0.1 kPa to 5 kPa, and most preferably from 0.12 kPa to 3 kPa, at 20° C. By setting the vapor pressure of the rinsing liquid to a range from 0.05 kPa to 5 kPa, the temperature uniformity within a wafer plane is improved, and further, the dimensional uniformity within a wafer plane is enhanced by inhibition of swelling due to the penetration of the rinsing liquid.

The rinsing liquid can also be used after adding an appropriate amount of a surfactant thereto.

In the rinsing step, the wafer which has been subjected to development using a developer including an organic solvent is subjected to a cleaning treatment using the rinsing liquid including an organic solvent. A method for the cleaning treatment is not particularly limited, and for example, a method in which a rinsing liquid is continuously discharged on a substrate rotated at a constant rate (a rotation application method), a method in which a substrate is immersed in a bath filled with a rinsing liquid for a certain period of time (a dip method), a method in which a rinsing liquid is sprayed on a substrate surface (a spray method), or the like, can be applied. Among these, a method in which a cleaning treatment is carried out using the rotation application method, and a substrate is rotated at a rotational speed of 2,000 rpm to 4,000 rpm after cleaning, thereby removing the rinsing liquid from the substrate, is preferable. Further, it is preferable that a heating step (Post Bake) is included after the rinsing step. The residual developer and the rinsing liquid between and inside the patterns are removed by the baking. The heating step after the rinsing step is carried out at typically 40° C. to 160° C., and preferably at 70° C. to 95° C., and typically for 10 seconds to 3 minutes, and preferably for 30 seconds to 90 seconds.

Furthermore, the present invention further relates to a method for manufacturing an electronic device, including the pattern formation method of the present invention as described above, and an electronic device manufactured by the manufacturing method.

The electronic device of the present invention is suitably mounted on electric or electronic equipment (home electronics, OA/media-related equipment, optical equipment, telecommunication equipment, and the like).

EXAMPLES

Hereinafter, the present invention will be described with reference to Examples, but the present invention is not limited thereto.

Synthesis Example 1

Synthesis of Resin B-1

72.9 parts by mass of cyclohexanone was heated to 85° C. in a nitrogen gas flow. While stirring this liquid, a mixed solution of 48.9 parts by mass of a monomer represented by the following Structural Formula M-1, 69.4 parts by mass of a monomer represented by the following Structural Formula M-2, 310.68 parts by mass of cyclohexanone, and 4.56 parts by mass of dimethyl 2,2'-azobisisobutyrate [V-601, manufactured by Wako Pure Chemical Industries, Ltd.] was added dropwise thereto for 6 hours. After completion of the dropwise addition, the mixture was further stirred at 85° C. for 2 hours. After leaving the reaction liquid to be cooled, the liquid was reprecipitated with a large amount of methanol/ water (mass ratio of 9:1) and filtered, and the obtained solid was vacuum-dried to obtain 102.9 parts by mass of the following resin B-1. Further, the following resin B-1 corresponds to the resin (P).

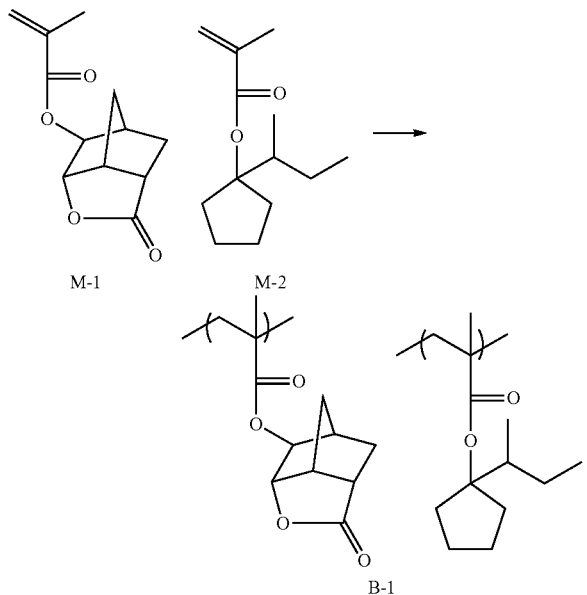

The weight-average molecular weight (Mw: in terms of polystyrene) determined by GPC (carrier: tetrahydrofuran (THF)) of the obtained resin B-1 was Mw=11,000 with a dispersity of Mw/Mn=1.63. The compositional ratio measured by $^{13}$C-NMR was 30/70.

Further, by carrying out the same procedure as in Synthesis Example 1, the resins B-2 to B-16 as described below, which are resins (P), were synthesized.

Preparation of Resist Composition

The components shown in Table 1 below were dissolved in the solvents shown in the same table to prepare solutions having a concentration of solid contents of 4% by mass, and the solutions was filtered through a polyethylene filter having a pore size of 0.05 μm to prepare resist compositions (resist compositions of Examples and Comparative Examples).

Moreover, in Table 1 below, the numeral values in parenthesis with respect to the acid generators represent blending amounts (g). Further, in all of Examples and Comparative Examples, the blending amount of the resin is 10 g. Incidentally, the numeral values in parenthesis with respect to the basic compounds represent blending amounts (g). Further, in all of Examples and Comparative Examples, the blending amount of the hydrophobic resin is 0.05 g. Incidentally, the numeral values with respect to the solvents represent the mass ratio. Further, in all of Examples and Comparative Examples containing surfactants, the blending amount of the surfactant is 10 mg.

Evaluation (Pattern Formation: ArF Liquid Immersion Exposure 1)
ARC29SR (manufactured by Nissan Chemical Industries, Ltd.) for forming an organic antireflection film was coated on a silicon wafer, and baked at 205° C. for 60 seconds to form an antireflection film having a film thickness of 95 nm. The obtained resist composition was coated thereon and baked (PB: Prebake) at 100° C. for 60 seconds to form a resist film having a film thickness of 100 nm.

The obtained wafer was exposed through a 6% halftone mask with a pitch of 136 nm and a light shielding section of 50 nm, using an ArF excimer laser liquid immersion scanner (manufactured by ASML; XT1700i, NA1.20, C-Quad, an outer sigma of 0.880, an inner sigma of 0.790, XY deflection). Ultrapure water was used as a liquid for liquid immersion. Thereafter, the resist film was heated (PEB: Post Exposure Bake) at 85° C. for 60 seconds, then paddled and developed with a negative type developer (butyl acetate) for 30 seconds, and paddled and rinsed with a rinsing liquid [methylisobutyl carbinol (MIBC)] for 30 seconds. Subsequently, the wafer was then spun at a rotation speed of 4,000 rpm for 30 seconds to form a pattern with a line-and-space having a pitch of 136 nm and a space width of 35 nm.

(Pattern Formation: ArF Liquid Immersion Exposure 2)
ARC29SR (manufactured by Nissan Chemical Industries, Ltd.) for forming an organic antireflection film was coated on a silicon wafer, and baked at 205° C. for 60 seconds to form an antireflection film having a film thickness of 95 nm. The obtained resist composition was coated thereon and baked (PB: Prebake) at 100° C. for 60 seconds to form a resist film having a film thickness of 100 nm.

The obtained wafer was exposed through a 6% halftone mask with a line-and-space pattern having a pitch of 90 nm and a space width of 35 nm, using an ArF excimer laser liquid immersion scanner (manufactured by ASML; XT1700i, NA1.20, C-Quad, an outer sigma of 0.900, an inner sigma of 0.812, XY deflection). Ultrapure water was used as a liquid for liquid immersion. Thereafter, the resultant was heated (PEB: Post Exposure Bake) at 105° C. for 60 seconds, then paddled and developed with a negative type developer (butyl acetate) for 30 seconds, and paddled and rinsed with a rinsing liquid [methylisobutyl carbinol (MIBC)] for 30 seconds. Subsequently, the wafer was then spun at a rotation speed of 4,000 rpm for 30 seconds to form a pattern with a line-and-space having a pitch of 90 nm and a space width of 35 nm.

(Evaluation of Depth of Focus (DOF))
Exposure and development were carried out by changing the condition of the exposure focus by a 10 nm unit in the focus direction in the exposure dose for forming a pattern with a line-and-space having a pitch of 136 nm and a space width of 35 nm in the exposure/development conditions of Pattern Formation (ArF Liquid Immersion Exposure 1) above. The space line width (CD) of each of the obtained patterns was measured using a line width critical dimension scanning electron microscope SEM (S-9380, manufactured by Hitachi, Ltd.), and a focus corresponding to the minimum value or the maximum value of a curve obtained by plotting the respective CDs was defined as a best focus. When the focus was changed around the best focus at a center, the variation width of the focus allowing the line width to be 35 nm±10%, that is, a depth of focus (DOF) (nm) was calculated. The results are shown in Table 1 (DOFs). A higher value of the depth of focus is more preferable.

(Evaluation of Collapse Performance)
The exposure dose for reproducing a mask pattern having a pitch of 90 nm and a space width of 35 nm in the exposure/development conditions of Pattern Formation (ArF Liquid Immersion Exposure 2) above was taken as an optimal exposure dose, and when the line width of the line pattern formed by further increasing the exposure dose from the optimal exposure dose was decreased, a maximum space width with which resolution is performed without collapse of the pattern was determined. The results are shown in Table 1 (collapse). A higher value indicates resolution without collapse of finer patterns, less occurrence of pattern collapse, and high resolving power.

TABLE 1

| | Acid generator (g) | Resin (10 g) | Basic compound (g) | Hydrophobic resin (0.05 g) | Solvent (mass ratio) | Surfactant (10 mg) | Evaluation item 1 DOF (nm) | Evaluation item 2 Collapse (nm) |
|---|---|---|---|---|---|---|---|---|
| Example 1 | A-1 (1.1) | B-1 | C-1 (0.38) | 1b | A1/B1 = 90/10 | None | 105 | 49.0 |
| Example 2 | A-2 (1.2) | B-2 | C-2 (0.41) | 4b | A1/A2 = 70/30 | None | 135 | 51.5 |
| Example 3 | A-3 (1.4) | B-3 | C-3 (0.32) | 2b | A1 | None | 120 | 48.0 |
| Example 4 | A-4 (1.1) | B-4 | C-4 (0.25) | 3b | A1 | None | 150 | 50.5 |
| Example 5 | A-5 (1.7) | B-5 | C-5 (0.34) | 3b | A1 | W-2 | 105 | 51.0 |
| Example 6 | A-6 (1.6) | B-6 | C-2 (0.33) | 4b | A1 | None | 150 | 52.0 |
| Example 7 | A-7 (1.1) | B-7 | C-6 (0.28) | 1b | A1/B1 = 90/10 | W-2 | 105 | 49.0 |
| Example 8 | A-8 (1.4) | B-8 | C-7 (0.32) | 2b | A1/B1 = 80/20 | None | 120 | 50.0 |
| Example 9 | A-9 (1.5) | B-9 | C-8 (0.27) | 3b | A1/B2 = 80/20 | W-3 | 150 | 48.5 |
| Example 10 | A-1 (1.1) | B-10 | C-1 (0.38) | 3b | A1 | W-1 | 135 | 50.0 |
| Example 11 | A-3 (1.4) | B-11 | C-3 (0.31) | 2b | A1 | None | 105 | 49.0 |
| Example 12 | A-2 (0.4)/A-5 (1.3) | B-12 | C-2 (0.43) | 4b | A1/A2 = 70/30 | None | 150 | 53.0 |
| Example 13 | A-3 (0.3)/A-6 (1.4) | B-13 | C-3 (0.32) | 4b | A1/A2 = 70/30 | None | 135 | 50.0 |
| Example 14 | A-1 (0.7)/A-8 (1.0) | B-14 | C-8 (0.37) | 1b | A1 | W-4 | 105 | 49.5 |
| Example 15 | A-7 (0.8)/A-9 (0.8) | B-15 | C-5 (0.44) | 4b | A1/A2 = 70/30 | None | 150 | 50.5 |
| Example 16 | A-7 (1.1) | B-16 | C-6 (0.30) | 5b | A1/A3 = 90/10 | None | 150 | 50.5 |
| Comparative Example 1 | A-1 (1.1) | B-17 | C-1 (0.38) | 1b | A1/A2 = 80/20 | W-1 | 90 | 42.5 |
| Comparative Example 2 | A-4 (1.2) | B-18 | C-7 (0.31) | 2b | A1 | None | 75 | 42.0 |
| Comparative Example 3 | A-6 (1.8) | B-19 | C-6 (0.45) | 2b | A1/A3 = 90/10 | None | 60 | 43.5 |
| Comparative Example 4 | A-2 (1.2) | B-20 | C-3 (0.30) | 4b | A1/A2 = 70/30 | W-1 | 45 | 45.0 |
| Comparative Example 5 | A-8 (1.2) | B-21 | C-4 (0.38) | 3b | A1/A2 = 80/20 | W-3 | 75 | 43.0 |

In Table 1, the structures of the acid generator are shown below.

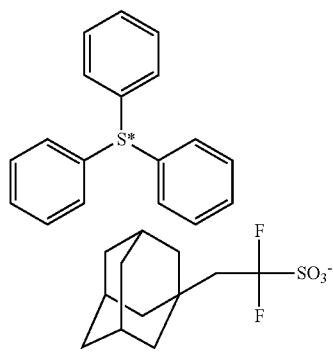

A-1

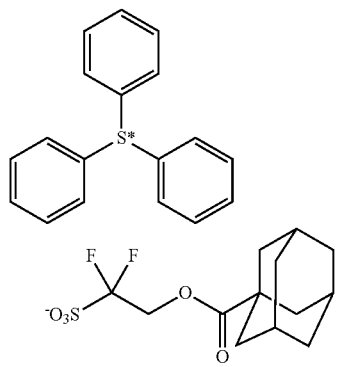

A-2

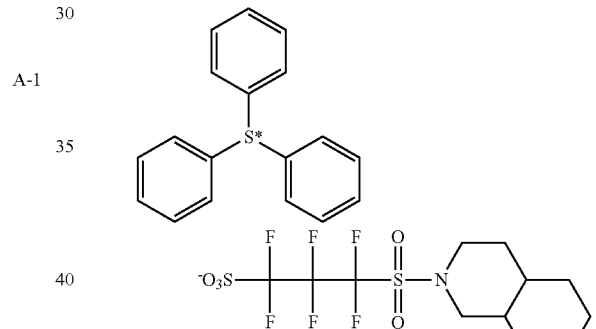

A-3

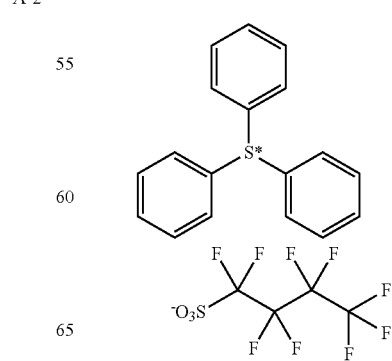

A-4

-continued

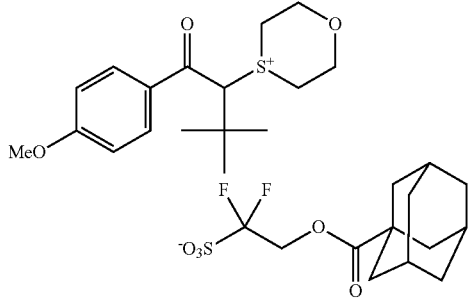

A-5

A-6

A-7

A-8

-continued

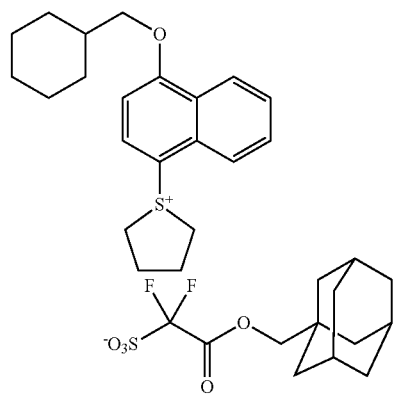

A-9

In Table 1, the structures of the resins used in Examples are as follows. With respect to the respective resins, the compositional ratios of the repeating units (molar ratios; corresponding in order from the left side), the weight-average molecular weights (Mw), and the dispersity (Mw/Mn) of the respective repeating units are shown in Table 2 below.

TABLE 2

|  | Compositional ratio (mol %) | | | | Mw | Mw/Mn |
| --- | --- | --- | --- | --- | --- | --- |
| B-1 | 40 | 60 | — | — | 10000 | 1.65 |
| B-2 | 50 | 50 | — | — | 9500 | 1.70 |
| B-3 | 55 | 45 | — | — | 10500 | 1.63 |
| B-4 | 55 | 45 | — | — | 8500 | 1.64 |
| B-5 | 50 | 50 | — | — | 10500 | 1.71 |
| B-6 | 50 | 50 | — | — | 9500 | 1.62 |
| B-7 | 50 | 50 | — | — | 14500 | 1.64 |
| B-8 | 55 | 45 | — | — | 7000 | 1.65 |
| B-9 | 40 | 60 | — | — | 8000 | 1.67 |
| B-10 | 50 | 50 | — | — | 9500 | 1.62 |
| B-11 | 60 | 40 | — | — | 12000 | 1.63 |
| B-12 | 45 | 45 | 10 | — | 10500 | 1.68 |
| B-13 | 50 | 40 | 10 | — | 10000 | 1.71 |
| B-14 | 50 | 20 | 30 | — | 9500 | 1.64 |
| B-15 | 50 | 30 | 20 | — | 9000 | 1.62 |
| B-16 | 50 | 40 | 10 | — | 7500 | 1.64 |

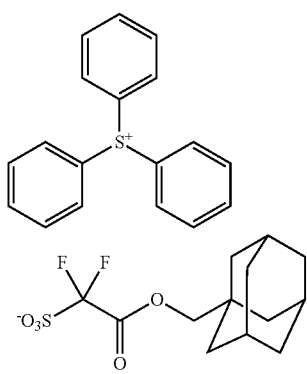

B-1

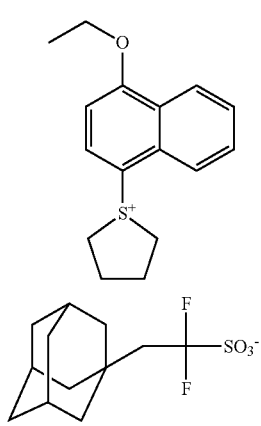

B-2

TABLE 2-continued

| Compositional ratio (mol %) | Mw | Mw/Mn |
|---|---|---|

B-3

B-4

B-5

B-6

B-7

B-8

TABLE 2-continued

| Compositional ratio (mol %) | Mw | Mw/Mn |
|---|---|---|

B-9

B-10

B-11

B-12

B-13

TABLE 2-continued
| | Compositional ratio (mol %) | Mw | Mw/Mn |
|---|---|---|---|
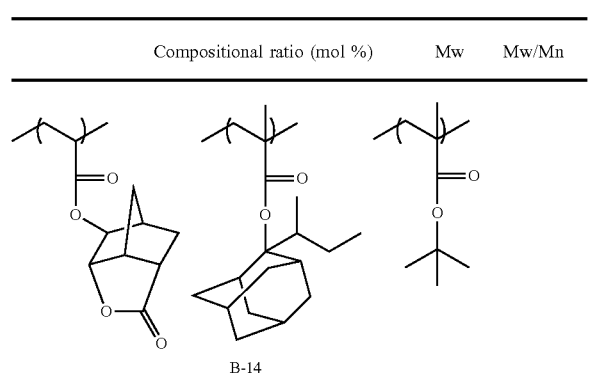
B-14
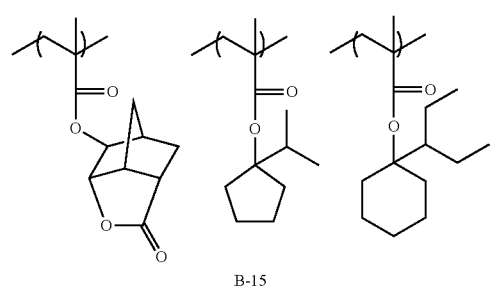
B-15
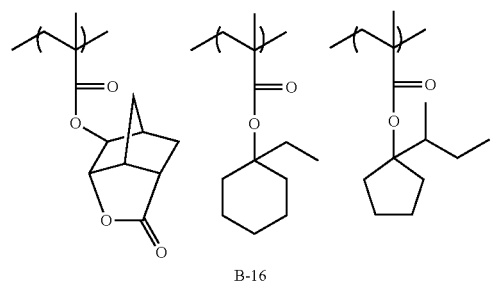
B-16
In Table 1, the structures of the resins used in Comparative Examples are as follows. Here, the compositional ratios of the repeating units are molar ratios.
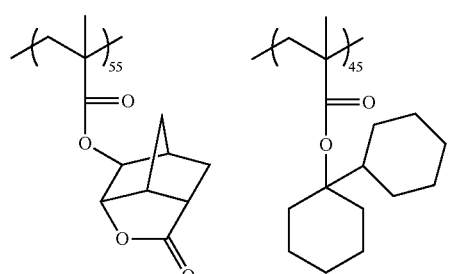
B-17
MW = 10000
MW:Mn = 1.61
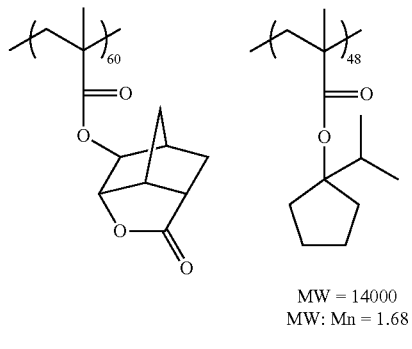
B-18
MW = 14000
MW:Mn = 1.68
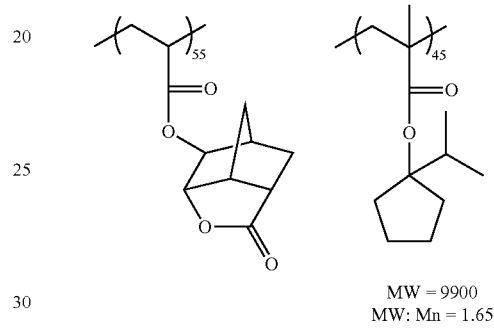
B-19
MW = 9900
MW:Mn = 1.65
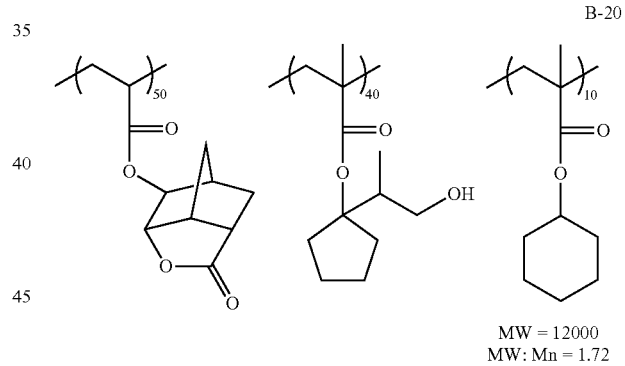
B-20
MW = 12000
MW:Mn = 1.72
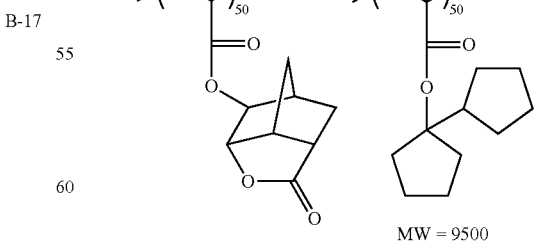
B-21
MW = 9500
MW:Mn = 1.65
In Table 1, the structures of the basic compounds are as follows.

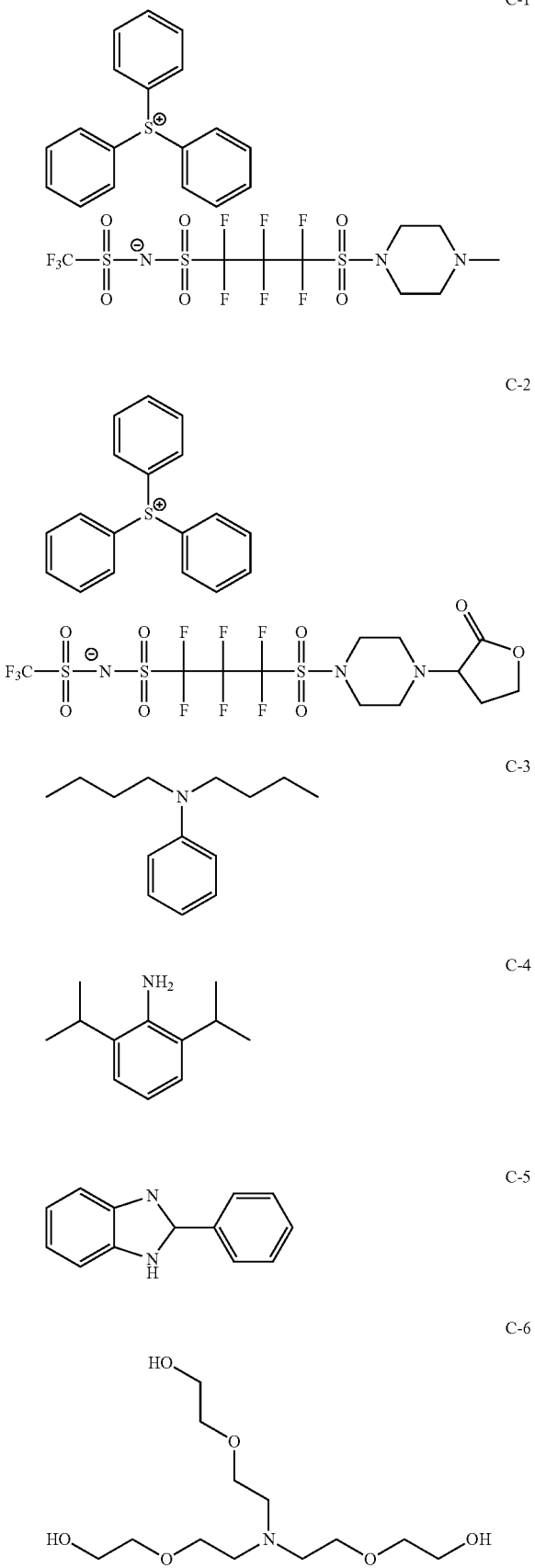

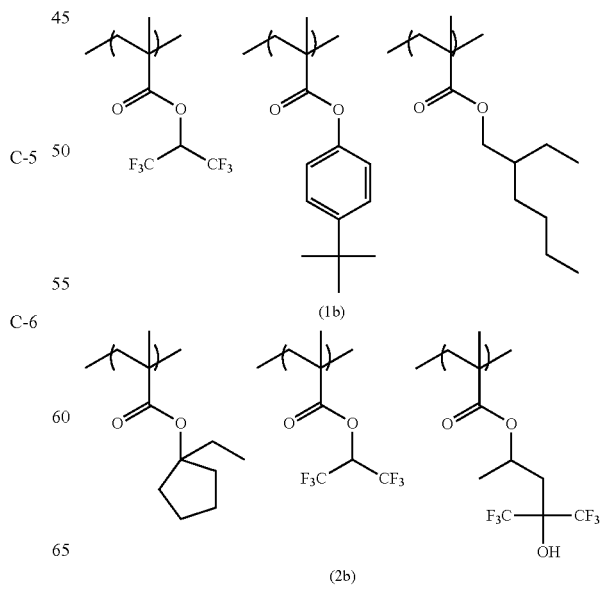

In Table 1, the structures of the hydrophobic resins are as follows. With respect to the respective hydrophobic resins, the compositional ratios of the repeating units (molar ratios; corresponding in order from the left side), the weight-average molecular weights (Mw), and the dispersity (Mw/Mn) of the respective repeating units are shown in Table 3 below.

TABLE 3

| | Compositional ratio (mol %) | | | | Mw | Mw/Mn |
|---|---|---|---|---|---|---|
| (1b) | 50 | 45 | 5 | — | 7000 | 1.30 |
| (2b) | 40 | 40 | 20 | — | 18600 | 1.57 |
| (3b) | 50 | 50 | — | — | 25400 | 1.63 |
| (4b) | 30 | 65 | 5 | — | 28000 | 1.70 |
| (5b) | 100 | — | — | — | 9000 | 1.55 |

TABLE 3-continued

| Compositional ratio (mol %) | Mw | Mw/Mn |
|---|---|---|

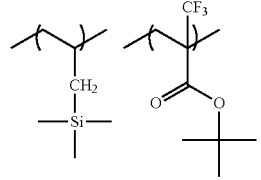

In Table 1, the solvents are as follows.
A1: Propylene glycol monomethyl ether acetate (PG-MEA)
A2: Cyclohexanone
A3: γ-Butyrolactone
B1: Propylene glycol monomethyl ether (PGME)
B2: Ethyl lactate
In Table 1, the surfactants are as follows.
W-1: MEGAFACE F176 (manufactured by DIC Corporation) (fluorine-based),
W-2: MEGAFACE R08 (manufactured by DIC Corporation) (fluorine-based and silicon-based),
W-3: PF6320 (manufactured by OMNOVA Solutions Inc.) (fluorine-based),
W-4: TROYSOL S-366 (manufactured by Troy Corporation)

As shown in Table 1, as compared with Comparative Examples 1 to 5 in which the resin (P) is not contained, in any of Examples of the present invention in which the resin (P) is contained, DOF was high and the collapse of the pattern was suppressed.

From comparisons between Examples 1 and 9, between Examples 5 and 10, and between Examples 6 and 11, in Examples 1, 5, and 6 in which Z in General Formula (1) does not has a substituent, collapse of the pattern was further suppressed.

From comparison among Examples 12 to 16, in Examples 12, 13, 15, and 16 in which the cyclic structure formed with Z in General Formula (1) is a monocyclic alicyclic structure having 5 or 6 carbon atoms, DOF was higher.

From comparison between Examples 1 and 2, between Examples 3 and 4, between Examples 5 and 6, and between Examples 7 and 8, in Examples 2, 4, 6, and 8 in which $R_1$ in General Formula (1) is an alkyl group having 2 to 5 carbon atoms, DOF was higher and collapse of the pattern was further suppressed.

What is claimed is:

1. An actinic ray-sensitive or radiation-sensitive resin composition comprising a resin (P) including a repeating unit (i) having a group which decomposes by the action of an acid represented by the following General Formula (1):

(1)

in General Formula (1), $R_1$ represents an alkyl group having 2 or more carbon atoms, $R_2$ represents an alkyl group having 2 or more carbon atoms, and Z represents a group that forms a monocyclic structure together with a carbon atom.

2. The actinic ray-sensitive or radiation-sensitive resin composition according to claim 1, wherein the repeating unit (i) is a repeating unit represented by the following General Formula (2):

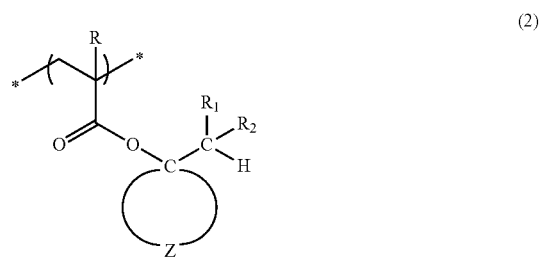

(2)

in General Formula (2), R represents a hydrogen atom, a halogen atom, or an organic group, $R_1$ represents an alkyl group having 2 or more carbon atoms, $R_2$ represents an alkyl group having 2 or more carbon atoms, Z represents a group that forms a monocyclic structure together with a carbon atom, and * represents the bonding position.

3. The actinic ray-sensitive or radiation-sensitive resin composition according to claim 1, wherein the cyclic structure is a monocyclic alicyclic structure having 5 or 6 carbon atoms.

4. The actinic ray-sensitive or radiation-sensitive resin composition according to claim 2, wherein the cyclic structure is a monocyclic alicyclic structure having 5 or 6 carbon atoms.

5. The actinic ray-sensitive or radiation-sensitive resin composition according to claim 1, wherein $R_2$ is an alkyl group having 2 to 5 carbon atoms.

6. The actinic ray-sensitive or radiation-sensitive resin composition according to claim 2, wherein $R_2$ is an alkyl group having 2 to 5 carbon atoms.

7. The actinic ray-sensitive or radiation-sensitive resin composition according to claim 5, wherein $R_2$ is an alkyl group having 2 or 3 carbon atoms.

8. The actinic ray-sensitive or radiation-sensitive resin composition according to claim 6, wherein $R_2$ is an alkyl group having 2 or 3 carbon atoms.

9. The actinic ray-sensitive or radiation-sensitive resin composition according to claim 1, wherein $R_1$ is an alkyl group having 2 to 5 carbon atoms.

10. The actinic ray-sensitive or radiation-sensitive resin composition according to claim 2, wherein $R_1$ is an alkyl group having 2 to 5 carbon atoms.

11. A pattern forming method comprising at least:
   (a) forming an actinic ray-sensitive or radiation-sensitive resin composition film on a substrate, using the actinic ray-sensitive or radiation-sensitive resin composition according to claim 1;
   (b) irradiating the film with actinic ray or radiation; and
   (c) developing the film irradiated with actinic ray or radiation using a developer.

12. The pattern forming method according to claim 11, wherein the developer is a developer including an organic solvent.

* * * * *